(12) United States Patent
Kim et al.

(10) Patent No.: US 12,113,109 B2
(45) Date of Patent: Oct. 8, 2024

(54) SEMICONDUCTOR DEVICE

(71) Applicant: SAMSUNG ELECTRONICS CO., LTD., Suwon-si (KR)

(72) Inventors: Sungmin Kim, Hwaseong-si (KR); Juhun Park, Seoul (KR); Deokhan Bae, Suwon-si (KR); Myungyoon Um, Seoul (KR); Yuri Lee, Yongin-si (KR); Inyeal Lee, Yongin-si (KR); Yoonyoung Jung, Suwon-si (KR); Sooyeon Hong, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 763 days.

(21) Appl. No.: 17/313,638

(22) Filed: May 6, 2021

(65) Prior Publication Data

US 2021/0391433 A1    Dec. 16, 2021

(30) Foreign Application Priority Data

Jun. 16, 2020    (KR) .......................... 10-2020-0073211

(51) Int. Cl.
*H01L 29/417*    (2006.01)
*H01L 27/092*    (2006.01)
(52) U.S. Cl.
CPC .... *H01L 29/41791* (2013.01); *H01L 27/0924* (2013.01)
(58) Field of Classification Search
CPC .............. H01L 27/0886; H01L 27/092; H01L 27/0928; H01L 2027/11829; H01L 2027/11831; H01L 2029/7858; H01L 2029/0642; H01L 2029/0649; H01L 23/5329; H01L 23/53295;
(Continued)

(56) References Cited

U.S. PATENT DOCUMENTS 7,282,442 B2    10/2007  Hwang
8,022,442 B2 *  9/2011   Ookura ................. H01L 23/552
                                                    257/369

(Continued)

FOREIGN PATENT DOCUMENTS

KR    10-19960012425 A    9/1994
KR    10-20110052049 A    5/2011

*Primary Examiner* — Eduardo A Rodela
(74) *Attorney, Agent, or Firm* — Sughrue Mion, PLLC

(57) ABSTRACT

A semiconductor device includes a first active (e.g., PMOS-FET) region and an adjacent second active (e.g., NMOS-FET) region on a substrate, a device isolation layer on the substrate and defining a first active pattern on the first active region and a second active pattern on the second active region, a gate electrode crossing the first and second active patterns, a first source/drain pattern and a second source/drain pattern adjacent to a side of the gate electrode, an interlayer insulating layer on the gate electrode, a first active contact penetrating the interlayer insulating layer to connect the first source/drain pattern and a second active contact penetrating the interlayer insulating layer to connect the second source/drain pattern and a buffer layer provided in an upper region of the interlayer insulating layer and interposed between the first active contact and the second active contact, wherein the buffer layer includes a material having etch selectivity with respect to the interlayer insulating layer.

20 Claims, 63 Drawing Sheets

(58) Field of Classification Search
CPC ..... H01L 21/823481; H01L 21/823878; H01L 29/41791; H01L 27/0924
See application file for complete search history.

(56) References Cited

U.S. PATENT DOCUMENTS

| | | | |
|---|---|---|---|
| 8,987,831 B2 * | 3/2015 | Liaw | H10B 10/12 |
| | | | 257/E27.098 |
| 9,257,429 B2 * | 2/2016 | Moroz | H01L 27/0924 |
| 9,564,486 B2 * | 2/2017 | Akarvardar | H01L 21/76229 |
| 9,613,953 B2 * | 4/2017 | Liaw | H01L 21/28123 |
| 9,831,306 B2 * | 11/2017 | Webb | H01L 23/535 |
| 9,991,339 B2 | 6/2018 | Hook et al. | |
| 10,068,905 B2 * | 9/2018 | Liaw | H01L 27/0924 |
| 10,141,307 B2 | 11/2018 | Fung | |
| 10,157,919 B2 | 12/2018 | Zeng | |
| 10,186,579 B2 * | 1/2019 | Min | H01L 29/7834 |
| 10,229,876 B2 * | 3/2019 | Kim | H01L 21/76834 |
| 10,229,911 B2 | 3/2019 | Yoon et al. | |
| 10,312,367 B2 * | 6/2019 | Phoa | H01L 27/0886 |
| 10,403,551 B2 | 9/2019 | Chu et al. | |
| 10,580,864 B2 * | 3/2020 | Tung | H01L 21/02634 |
| 10,636,886 B2 * | 4/2020 | Jo | H01L 29/785 |
| 10,644,153 B2 * | 5/2020 | Wei | H01L 29/66795 |
| 10,686,069 B2 * | 6/2020 | Kim | H01L 29/1033 |
| 10,818,768 B1 * | 10/2020 | Cheng | H01L 21/76897 |
| 10,896,957 B2 * | 1/2021 | Cho | H01L 21/30604 |
| 10,964,707 B2 * | 3/2021 | Yang | H01L 29/785 |
| 11,652,104 B2 * | 5/2023 | Kim | H01L 21/823821 |
| | | | 257/365 |
| 11,710,739 B2 * | 7/2023 | Yang | H01L 27/0886 |
| | | | 257/288 |
| 11,799,009 B2 * | 10/2023 | Guha | H01L 29/41733 |
| 11,862,679 B2 * | 1/2024 | Choi | H01L 29/0847 |
| 2018/0197861 A1 | 7/2018 | Park et al. | |
| 2019/0378838 A1 | 12/2019 | Jeon et al. | |

* cited by examiner

SEMICONDUCTOR DEVICE

CROSS-REFERENCE TO RELATED APPLICATIONS

This U.S. non-provisional patent application claims priority under 35 U.S.C. § 119 to Korean Patent Application No. 10-2020-0073211 filed on Jun. 16, 2020 in the Korean Intellectual Property Office, the subject matter of which is hereby incorporated by reference.

BACKGROUND

The inventive concept relates generally to semiconductor devices, and more particularly to semiconductor devices including a field effect transistor.

Due to their small-sized, multifunctional, and/or low-cost characteristics, semiconductor devices are being esteemed as important elements in the electronic industry. The semiconductor devices are classified into a semiconductor memory device for storing data, a semiconductor logic device for processing data, and a hybrid semiconductor device including both of memory and logic elements. As the electronic industry advances, there is an increasing demand for semiconductor devices with improved characteristics. For example, there is an increasing demand for semiconductor devices with high reliability, high performance, and/or multiple functions. To meet this demand, complexity and/or integration density of semiconductor devices are being increased.

SUMMARY

Embodiments of the inventive concept provide semiconductor device(s) including field effect transistors exhibiting improved electrical performance characteristics.

According to an embodiment of the inventive concept, a semiconductor device includes; a substrate including a first active region and a second active region adjacent to the first active region in a first direction, the first active region being one of PMOSFET and NMOSFET regions, the second active region being the other one of the PMOSFET and NMOSFET regions, a device isolation layer on the substrate and defining a first active pattern on the first active region and a second active pattern on the second active region, a gate electrode extended in the first direction to cross the first and second active patterns, a first source/drain pattern on the first active pattern and a second source/drain pattern on the second active pattern, wherein each of the first source/drain pattern and the second source/drain pattern is adjacent to a side of the gate electrode, an interlayer insulating layer on the gate electrode, a first active contact penetrating the interlayer insulating layer to connect the first source/drain pattern and a second active contact penetrating the interlayer insulating layer to connect the second source/drain pattern, and a buffer layer provided in an upper region of the interlayer insulating layer and interposed between the first active contact and the second active contact, wherein the buffer layer includes a material having etch selectivity with respect to the interlayer insulating layer.

According to an embodiment of the inventive concept a semiconductor device includes; a first active region, a second active region and a third active region respectively arranged across a substrate in a first direction, the first active region and the second active region having different conductivity types, and the second active region and the third active regions having a same conductivity type, a device isolation layer on the substrate and defining a first active pattern on the first active region, a second active pattern on the second active region, and a third active pattern on the third active region, a gate electrode extending in the first direction to cross the first, second, and third active patterns, a first source/drain pattern, a second source/drain pattern, and a third source/drain pattern respectively provided on the first active pattern, the second active pattern and the third active pattern, wherein each of the first source/drain pattern, the second source/drain pattern, and the third source/drain pattern is adjacent to a side of the gate electrode, an interlayer insulating layer on the gate electrode, a first active contact electrically connected to the first source/drain pattern and the second source/drain pattern, a second active contact electrically connected to the third source/drain pattern, and a buffer layer provided in an upper region of the interlayer insulating layer and interposed between the first active contact and the second active contact, wherein the buffer layer comprises a material having an etch selectivity with respect to the interlayer insulating layer.

According to an embodiment of the inventive concept, a semiconductor device includes; a first logic cell on a substrate including a PMOSFET region and an NMOSFET region spaced apart in a first direction, a first border, a second border, a third border and a fourth border, the first border and the second border opposing each other in a second direction crossing the first direction, and the third border and the fourth border opposing each other in the first direction, a device isolation layer defining a first active pattern on the PMOSFET region and a second active pattern on the NMOSFET region, the first active pattern and the second active pattern extending in the second direction, a first upper portion of the first active pattern protruding above the device isolation layer, and a second upper portion of the second active pattern protruding above the device isolation layer, a gate electrode extending in the first direction to cross the first and second active patterns, a first source/drain pattern provided in the first upper portion of the first active pattern and a second source/drain pattern provided in the second upper portion of the second active pattern, wherein each of the first source/drain pattern and the second source/drain pattern is adjacent to a side of the gate electrode, a division structure provided on at least one of the first border and the second border, a gate spacer provided on the side of the gate electrode, a gate capping pattern provided on a top surface of the gate electrode, an interlayer insulating layer provided on the gate capping pattern, a first active contact penetrating the interlayer insulating layer to connect the first source/drain pattern, and a second active contact penetrating the interlayer insulating layer to connect the second source/drain pattern, a buffer layer extending in the second direction between the PMOSFET region and the NMOSFET region, provided in an upper region of the interlayer insulating layer, and interposed between the first active contact and the second active contact, silicide patterns respectively interposed between the first active contact and the first source/drain pattern, and between the second active contact and the second source/drain pattern, a gate contact penetrating the interlayer insulating layer and the gate capping pattern and connect the gate electrode, a first metal layer on the interlayer insulating layer, the first metal layer including a first power line extending in the second direction and provided on the third border, a second power line extending in the second direction and provided on the fourth border, and first interconnection lines provided between the first power line and the second power line, wherein the first interconnection lines are electrically and respectively connected to the first active contact, the second active contact and the gate contact, and a second metal layer on the first metal layer, the second metal layer including second interconnection lines extending in the first direction and electrically connected to the first metal layer.

BRIEF DESCRIPTION OF THE DRAWINGS

Embodiments of the inventive concept may be more clearly understood upon consideration of the following description taken together with the accompanying drawings.

DETAILED DESCRIPTION

Throughout the written description and drawings, like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
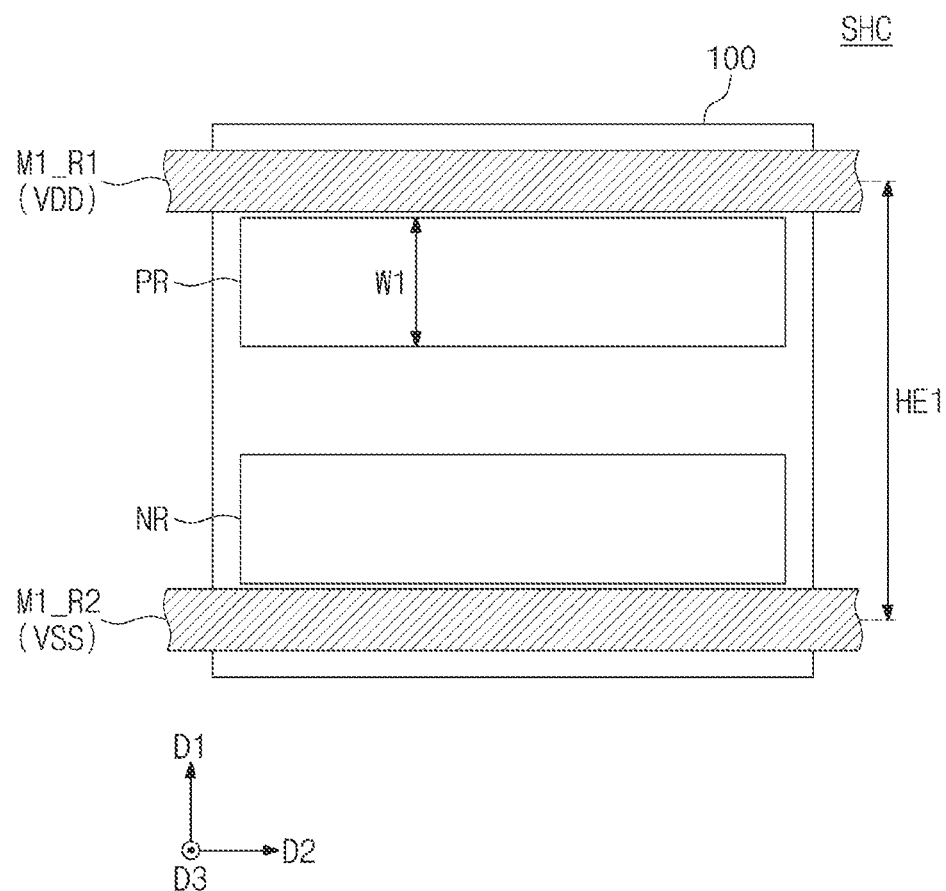
FIGS. 1, 2 and 3 are respective conceptual diagrams illustrating logic cells associated with semiconductor devices according to embodiments of the inventive concept.
Figure 2:
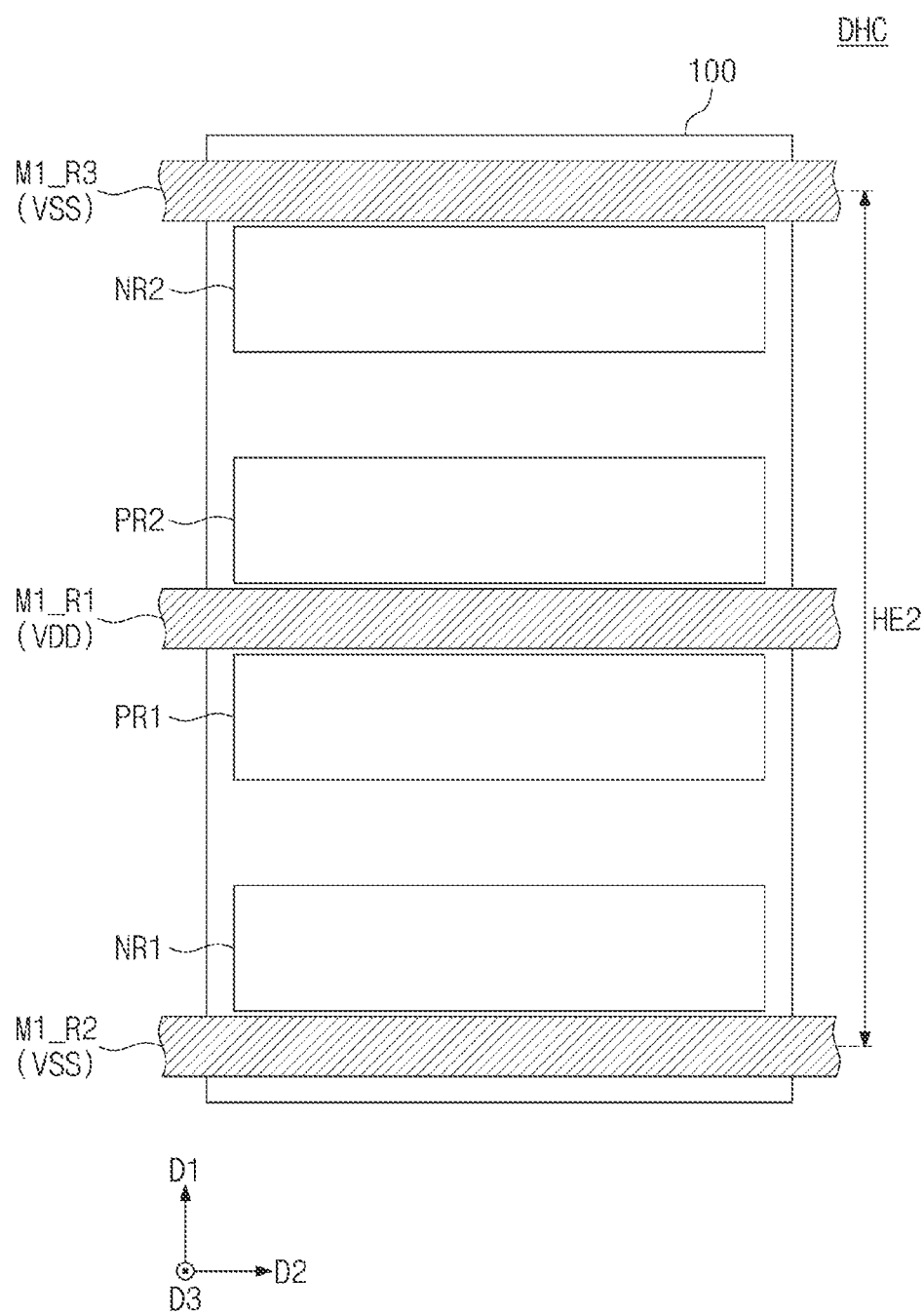
Figure 3:
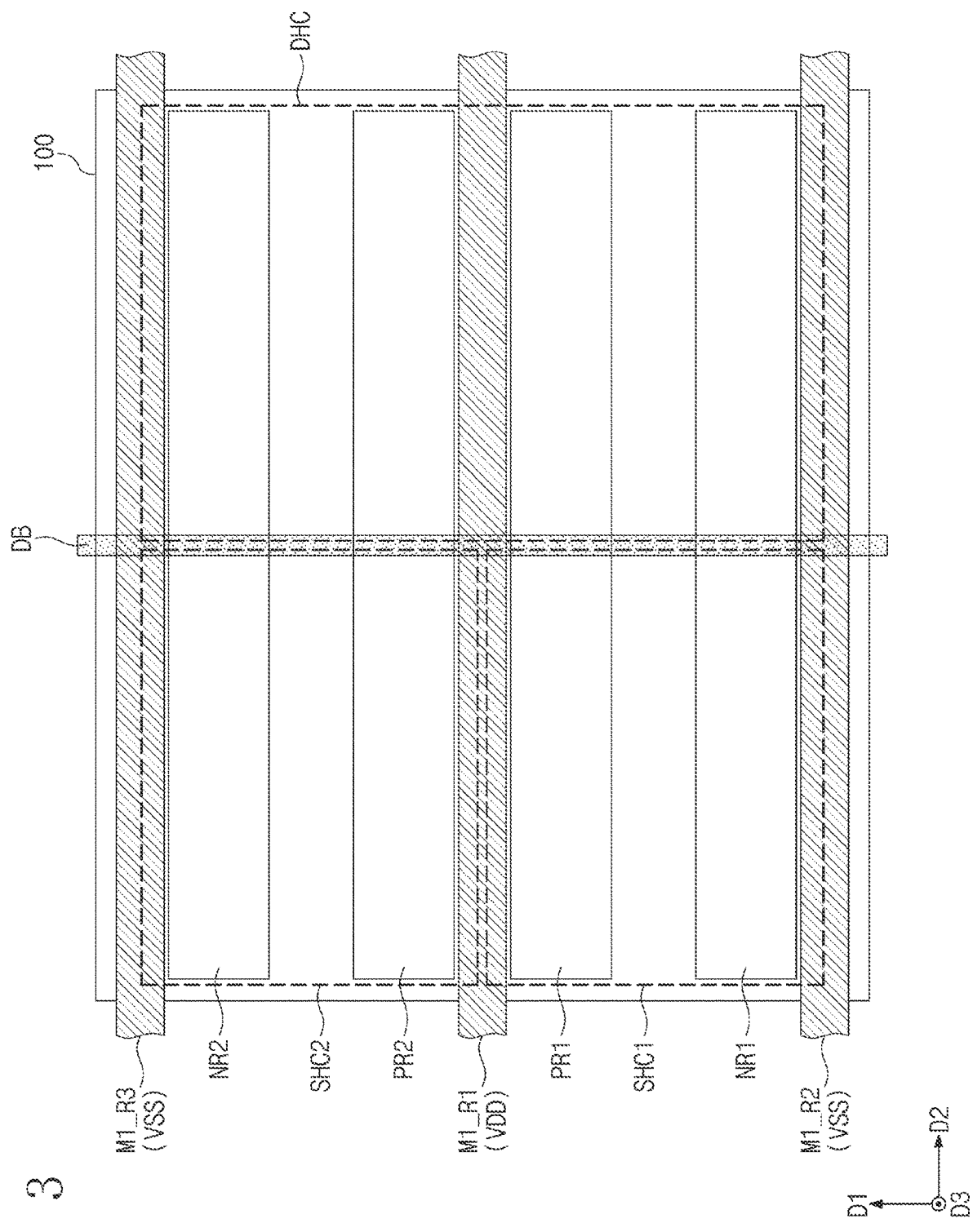

FIGS. 1, 2 and 3 are conceptual diagrams illustrating logic cells of a semiconductor device according to embodiments of the inventive concept.

FIG. 1 illustrates one possible example of a single height cell SHC. Here, a first power line M1_R1 and a second power line M1_R2 may be provided on a substrate 100. The first power line M1_R1 may be an electrical pathway to which a drain voltage VDD (e.g., a power voltage) is connected, and the second power line M1_R2 may be another electrical pathway to which a source voltage VSS (e.g., ground) is connected.

The single height cell SHC may be defined between the first power line M1_R1 and the second power line M1_R2. The single height cell SHC may include a P-type Metal Oxide Semiconductor (PMOS), Field Effect Transistor (FET) (PMOSFET) region PR and an N-type MOSFET (NMOSFET) region NR. That is, the single height cell SHC may have a CMOS structure provided between the first power line M1_R1 and the second power line M1_R2.

Each of the PMOSFET and NMOSFET regions PR and NR may have a first width W1 in a first direction DE A length of the single height cell SHC in the first direction D1 may be defined as a first height HE1. The first height HE1 may be substantially the same as a distance (or "pitch") between the first power line M1_R1 and the second power line M1_R2.

The single height cell SHC may constitute a single logic cell (e.g., a logic cell belonging to a logic device, such as an AND logic gate, an OR logic gate, an XOR logic gate, an XNOR logic gate, an inverter, etc.). In this regard, the single logic cell may be configured to execute a specific function, and the logic cell may include transistor(s) and/or interconnection line(s) variously arranged according to the specific function.

FIG. 2 illustrates one possible example of a double height cell DHC. Here, the first power line M1_R1, the second power line M1_R2 and a third power line M1_R3 may be provided on the substrate 100. The first power line M1_R1 may be disposed between the second power line M1_R2 and the third power line M1_R3, wherein the third power line M1_R3 may be an electrical pathway connected to the drain voltage VDD.

With this configuration, the double height cell DHC may be defined between the second power line M1_R2 and the third power line M1_R3, and include a first PMOSFET region PR1, a second PMOSFET region PR2, a first NMOSFET region NR1 and a second NMOSFET region NR2.

The first NMOSFET region NR1 may be adjacent to the second power line M1_R2. The second NMOSFET region NR2 may be adjacent to the third power line M1_R3. The first and second PMOSFET regions PR1 and PR2 may be adjacent to the first power line M1_R1. When viewed from a top-down perspective (or when viewed "in plan"), the first power line M1_R1 may be disposed between the first and second PMOSFET regions PR1 and PR2.

A length of the double height cell DHC in the first direction D1 may be defined as a second height HE2, wherein the second height HE2 is about two times the first height HE1 of FIG. 1. The first and second PMOSFET regions PR1 and PR2 of the double height cell DHC may be functionally combined as a single PMOSFET region.

Thus, a channel size of the PMOS transistor of the double height cell DHC may be larger than a channel size of the PMOS transistor of the single height cell SHC of FIG. 1. For example, the channel size of the PMOS transistor of the double height cell DHC may be about two times the channel size of the PMOS transistor of the single height cell SHC. As a result, the double height cell DHC may operate at a higher speed that the single height cell SHC. In some embodiments, the double height cell DHC shown in FIG. 2 may be referred to as a multi height cell. Those skilled in the art will further recognize that certain multi height cells may include a triple height cell having a cell height that is about three times that of the single height cell SHC.

Referring to FIG. 3, a first single height cell SHC1, a second single height cell SHC2, and the double height cell DHC may be two-dimensionally disposed on the substrate 100. The first single height cell SHC1 may be disposed between the first and second power lines M1_R1 and M1_R2. The second single height cell SHC2 may be disposed between the first and third power lines M1_R1 and M1_R3. The second single height cell SHC2 may be adjacent to the first single height cell SHC1 in the first direction D1.

The double height cell DHC may be disposed between the second and third power lines M1_R2 and M1_R3. The double height cell DHC may be adjacent to the first and second single height cells SHC1 and SHC2 in a second direction D2.

A division structure DB may be provided between the first single height cell SHC1 and the double height cell DHC and between the second single height cell SHC2 and the double height cell DHC. The active region of the double height cell DHC may be electrically separated from the active region of each of the first and second single height cells SHC1 and SHC2 by the division structure DB.

Figure 4:
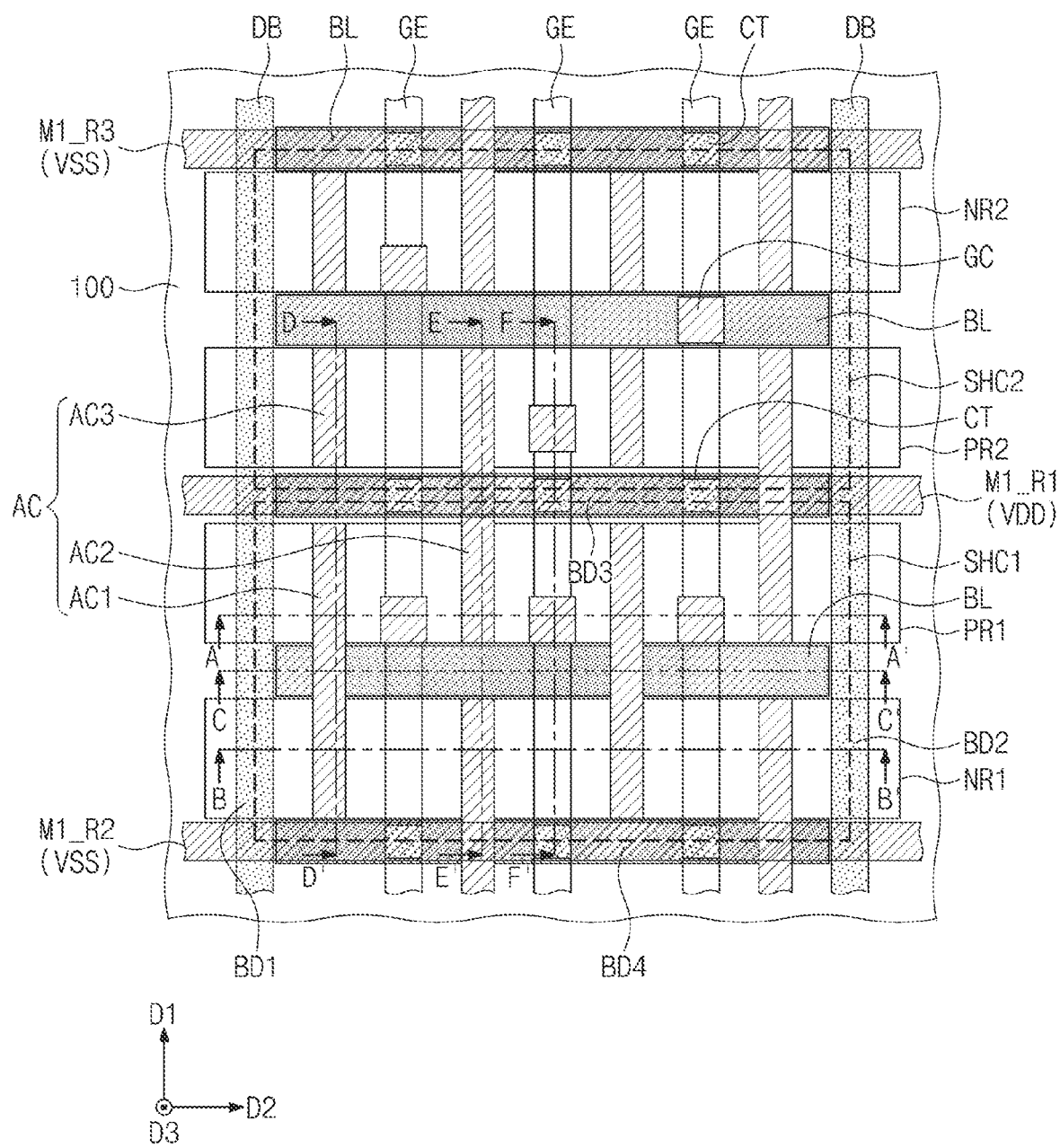
FIG. 4 is a plan view illustrating a semiconductor device according to embodiments of the inventive concept.

FIG. 4 is a plan view illustrating a semiconductor device according to embodiments of the inventive concept. FIGS. 5A, 5B, 5C, 5D, 5E and 5F (collectively, "FIGS. 5A to 5F") are respective cross-sectional views taken along lines A-A', B-B', C-C', D-D', E-E', and F-F' of FIG. 4. Together, FIGS. 4 and 5A to 5F illustrate in one example the first single height cell SC1 and the second single height cell SHC2 of FIG. 3.

Referring to FIGS. 4 and 5A to 5F, the first single height cell SC1 and the second single height cell SHC2 may be provided on the substrate 100. Logic transistors constituting a logic circuit may be disposed on each of the first single height cell SC1 and the second single height cell SHC2. Here, the substrate 100 may be a semiconductor substrate including at least one of silicon, germanium, silicon-germanium, and the like—although a silicon substrate 100 is assumed for purposes of this description.

Thus, the substrate 100 may include the first PMOSFET region PR1, the second PMOSFET region PR2, the first NMOSFET region NR1, and the second NMOSFET region NR2, wherein each of the first PMOSFET region PR1, the second PMOSFET region PR2, the first NMOSFET region NR1, and the second NMOSFET region NR2 may extend in the second direction D2.

The first PMOSFET region PR1, the second PMOSFET region PR2, the first NMOSFET region NR1, and the second NMOSFET region NR2 may be defined by a second trench TR2 formed in an upper portion of the substrate 100. For example, the second trench TR2 may be located between the first NMOSFET region NR1 and the first PMOSFET region PR1. The second trench TR2 may be located between the second PMOSFET region PR2 and the second NMOSFET region NR2. The second trench TR2 may be located between the first PMOSFET region PR1 and the second PMOSFET region PR2.

First active patterns AP1 may be provided on each of the first and second PMOSFET regions PR1 and PR2. Second active patterns AP2 may be provided on each of the first and second NMOSFET regions NR1 and NR2.

The first and second active patterns AP1 and AP2 may extend in the second direction D2 in parallel with each other. The first and second active patterns AP1 and AP2 may be portions (e.g., vertically protruding portions) of the substrate 100. A first trench TR1 may be defined between adjacent ones of the first active patterns AP1 and between adjacent ones of the second active patterns AP2. The first trench TR1 may be shallower (i.e., having a depth into the substrate 100 less deep) than the second trench TR2.

A device isolation layer ST may be provided to fill the first and second trenches TR1 and TR2. The device isolation layer ST may include a silicon oxide layer. An upper portion of each of the first and second active patterns AP1 and AP2 have a protruding pattern that vertically extends in the third direction D3 above the device isolation layer ST. (See, e.g., FIG. 5F). In this regard, the upper portion of each of the first and second active patterns AP1 and AP2 may have a fin shape. The device isolation layer ST may not cover the upper portion of each of the first and second active patterns AP1 and AP2. The device isolation layer ST may cover a lower side surface of each of the first and second active patterns AP1 and AP2.

First source/drain patterns SD1 may be provided on each of the first and second PMOSFET regions PR1 and PR2. The first source/drain patterns SD1 may be provided in the upper portion of each of the first active patterns AP1. The first source/drain patterns SD1 may be impurity regions of first conductivity type (e.g., P-type). A first channel pattern CH1 may be interposed between each pair of the first source/drain patterns SD1 that may extend in parallel adjacent to each other in the second direction D2.

Second source/drain patterns SD2 may be provided on each of the first and second NMOSFET regions NR1 and NR2. The second source/drain patterns SD2 may be provided in the upper portion of each of the second active patterns AP2. The second source/drain patterns SD2 may be impurity regions of second conductivity type (e.g., N-type). A second channel pattern CH2 may be interposed between each pair of the second source/drain patterns SD2, which are adjacent to each other in the second direction D2.

The first and second source/drain patterns SD1 and SD2 may be epitaxial patterns, which are formed by a selective epitaxial growth process. As an example, the first and second source/drain patterns SD1 and SD2 may have top surfaces that are coplanar with top surfaces of the first and second channel patterns CH1 and CH2. As another example, the top surfaces of the first and second source/drain patterns SD1 and SD2 may be higher than the top surfaces of the first and second channel patterns CH1 and CH2.

The first source/drain pattern SD1 may include a semiconductor material (e.g., SiGe) having a lattice constant greater than that of the semiconductor substrate 100. In this case, the pair of the first source/drain patterns SD1 may exert a compressive stress on the first channel pattern CH1 therebetween. In some embodiments, the second source/drain pattern SD2 may be formed of (or include) the same semiconductor material (e.g., Si) as the substrate 100.

Gate electrodes GE may extend in the first direction D1 to cross the first and second active patterns AP1 and AP2. Here, the gate electrodes GE may be arranged at a first pitch in the second direction D2. When viewed in plan, the gate electrodes GE will be seen to overlap the first and second channel patterns CH1 and CH2. With this configuration, each of the gate electrodes GE will face a top surface and at least one opposing side surface of each of the first and second channel patterns CH1 and CH2.

Figure 5A:
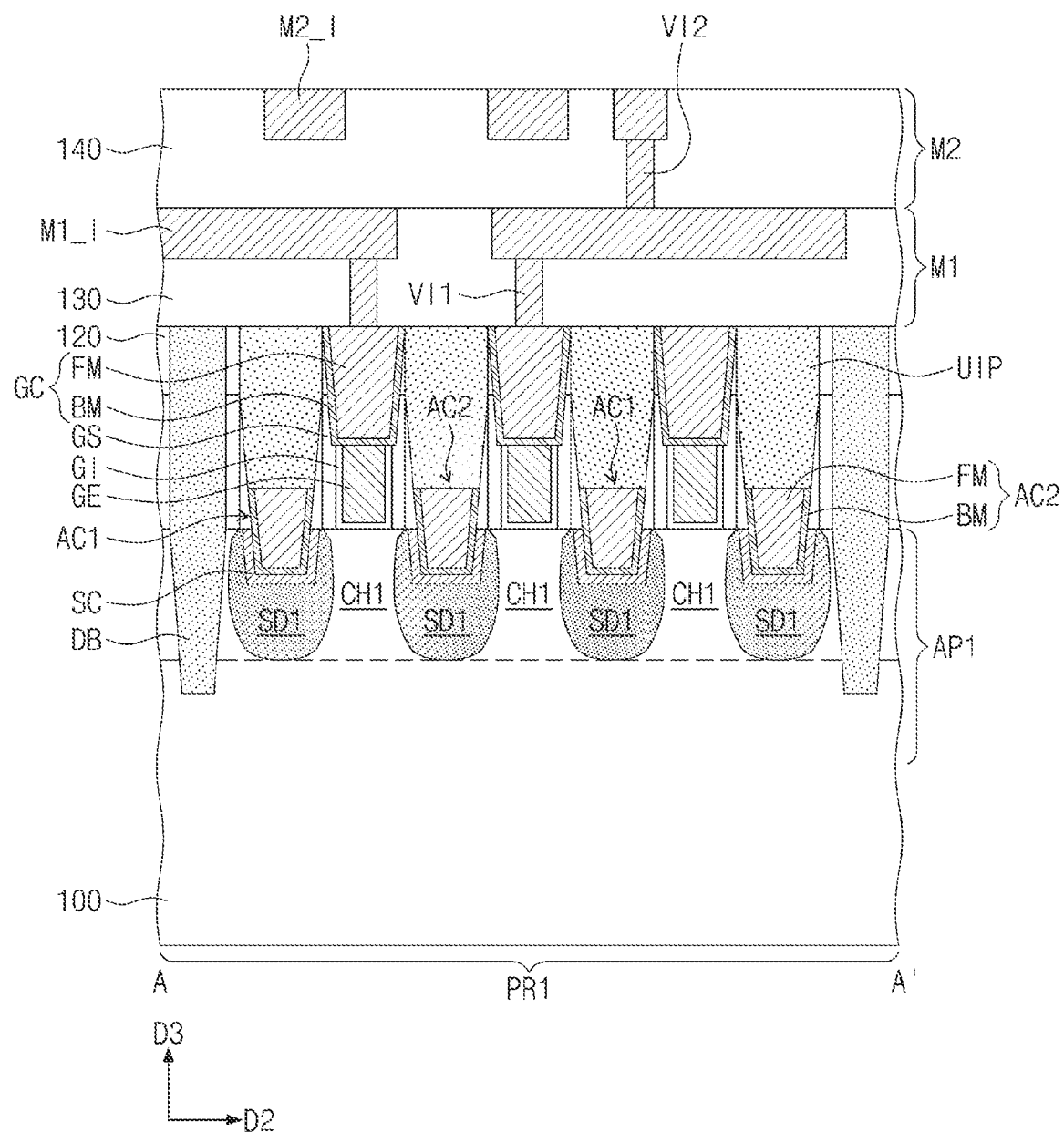
FIGS. 5A, 5B, 5C, 5D, 5E and 5F are respective, cross-sectional views taken along lines A-A', B-B', C-C', D-D', E-E', and F-F' of FIG. 4.
Figure 5B:
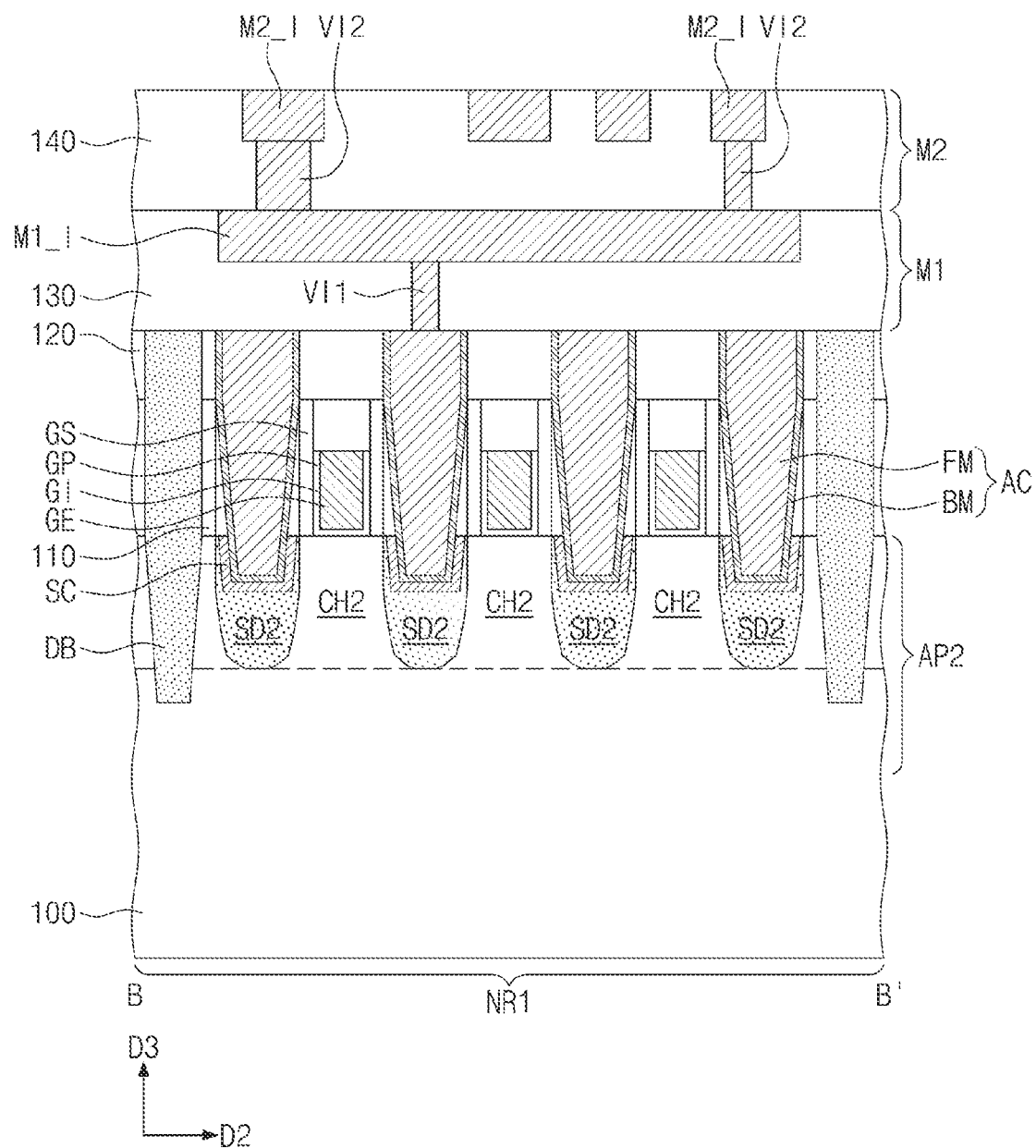
Figure 5C:
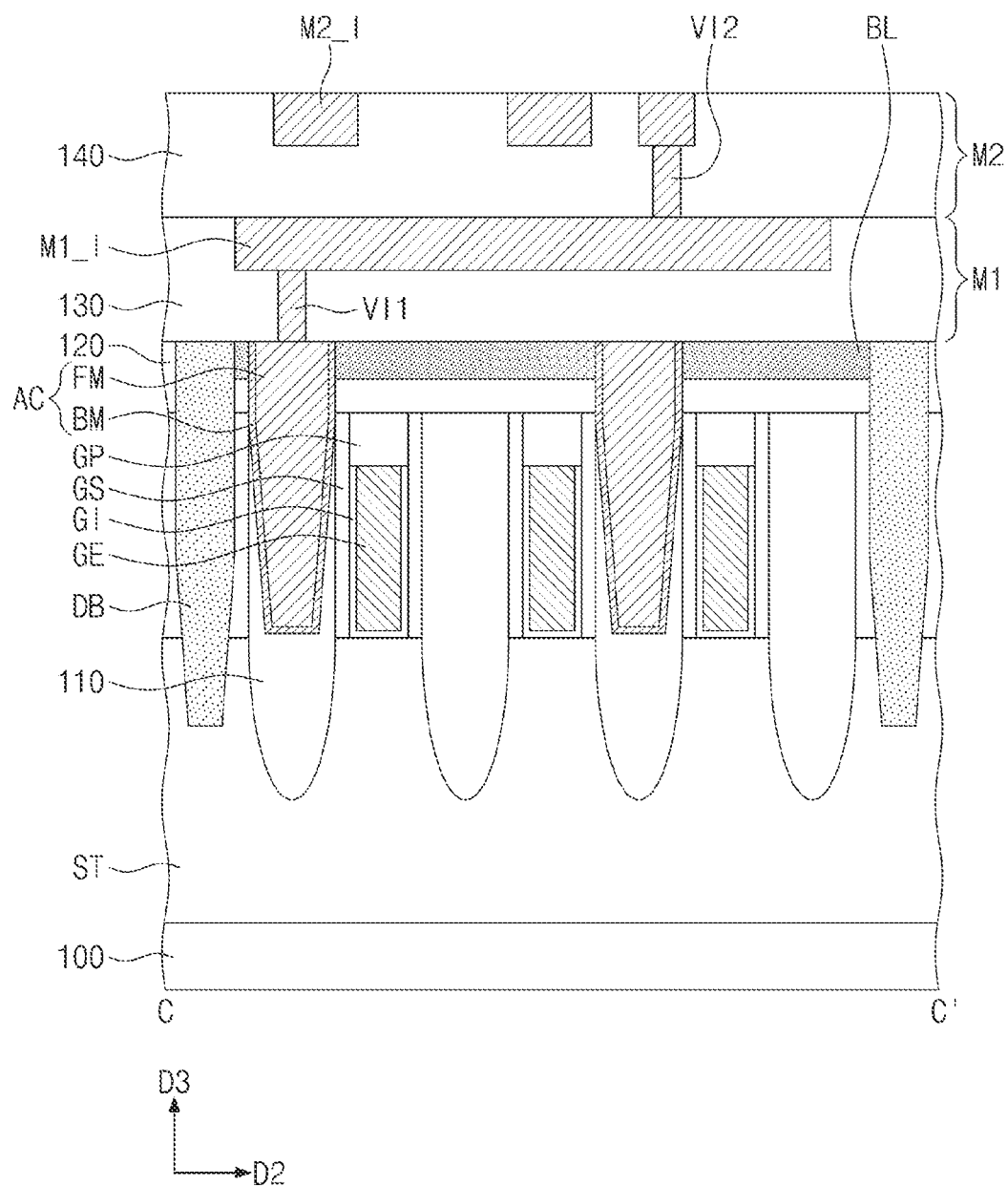
Figure 5D:
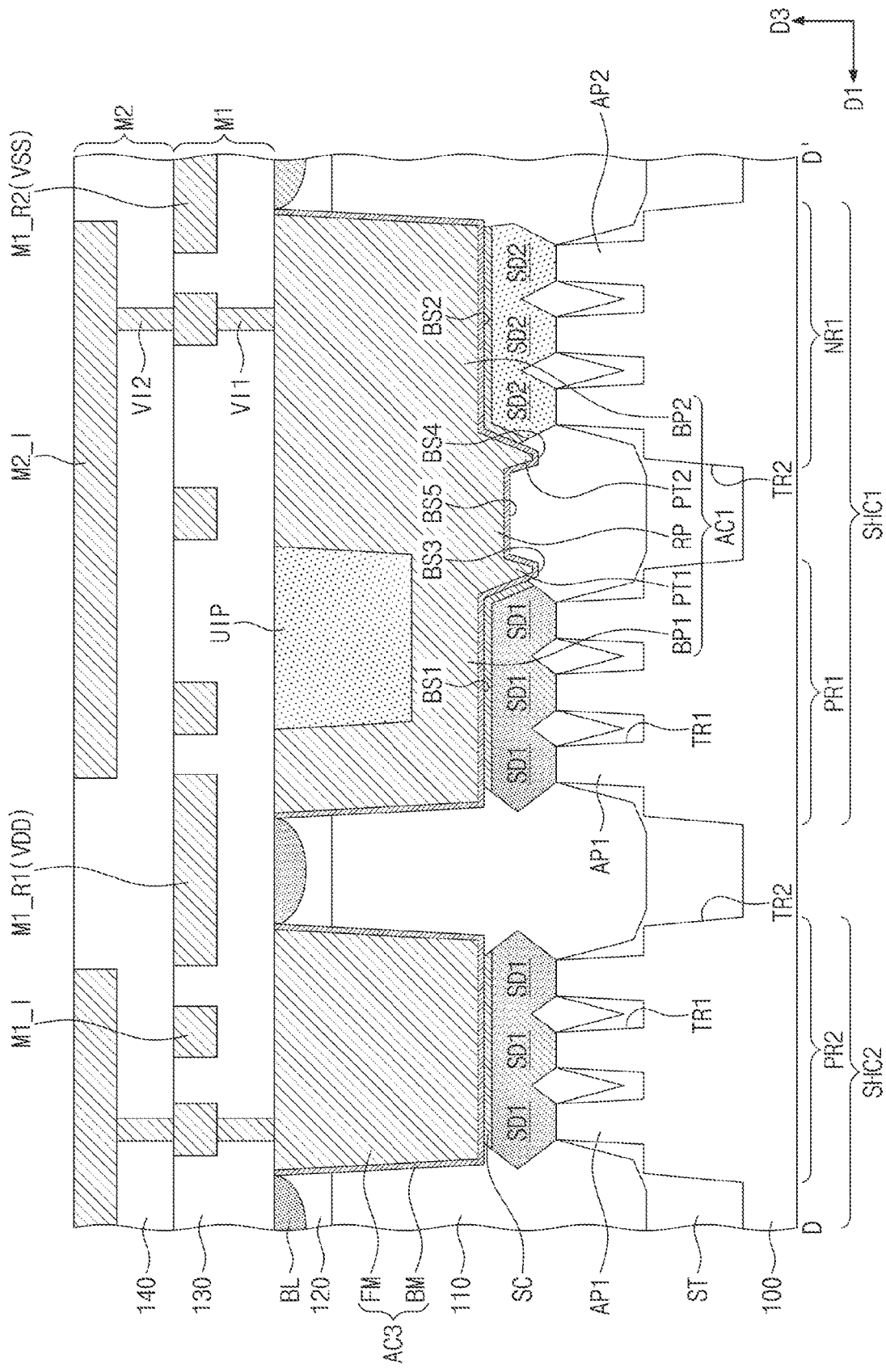
Figure 5E:
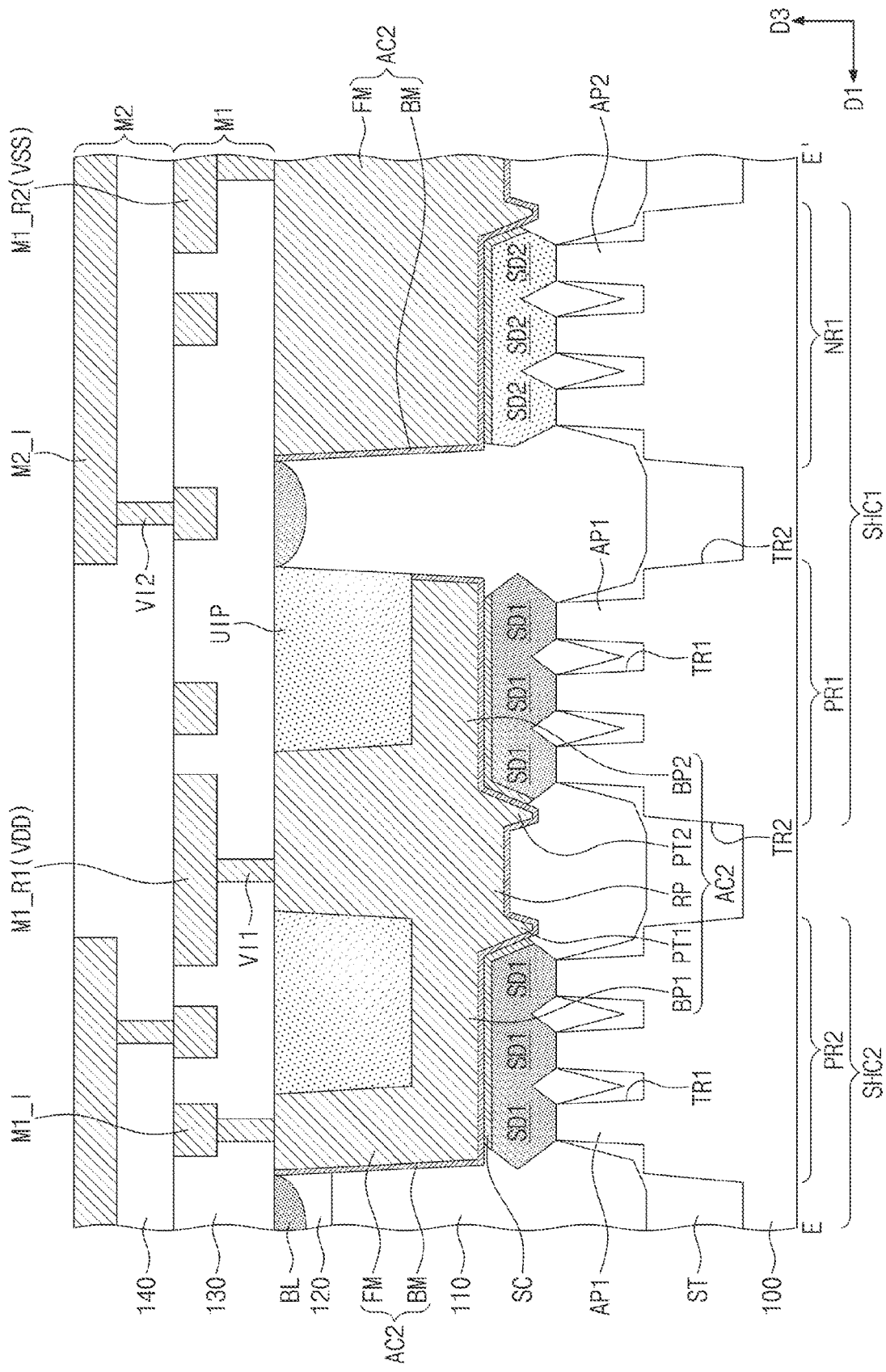
Figure 5F:
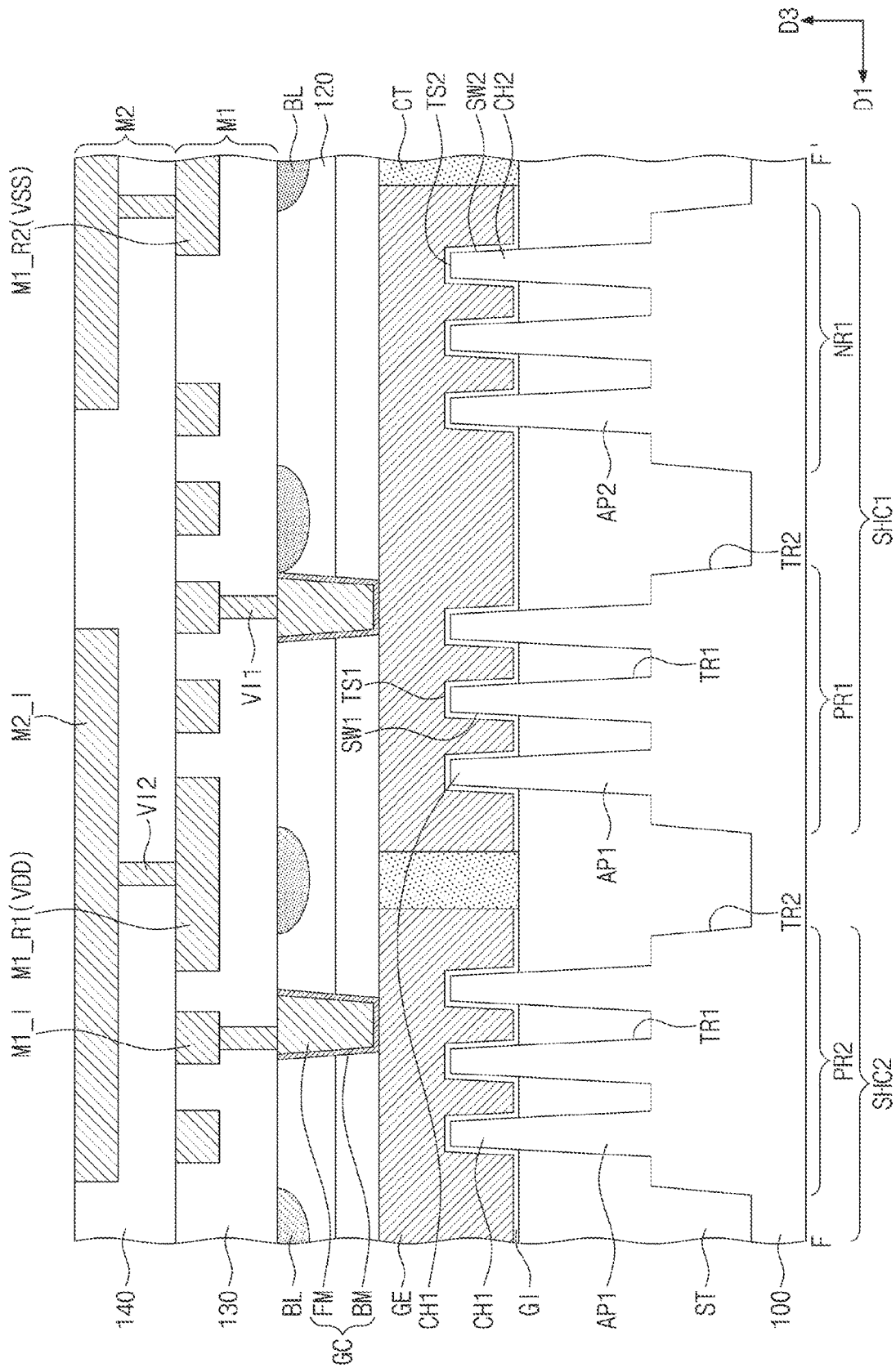

Referring to FIG. 5F, the gate electrode GE may be provided on a first top surface TS1 of the first channel pattern CH1 and at least one first side surface SW1 of the first channel pattern CH1. The gate electrode GE may be provided on a second top surface TS2 of the second channel pattern CH2 and at least one second side surface SW2 of the second channel pattern CH2. That is, the transistor described above may be a three-dimensional (3D) FET (e.g., a FinFET) in which the gate electrode GE is configured to three-dimensionally surround, at least in part, the channel patterns CH1 and CH2.

As an example, the first single height cell SHC1 may have a first border BD1 and an opposing (in the second direction D2) second border BD2, wherein the first and second borders BD1 and BD2 may extend in the first direction D1. The first single height cell SHC1 may also have a third border BD3 and an opposing (in the first direction D1) fourth border BD4, wherein the third and fourth borders BD3 and BD4 may extend in the second direction D2.

Gate cutting patterns CT may be disposed on the third and fourth borders BD3 and BD4 of the first single height cell SHC1. The gate cutting patterns CT may be disposed on the border, in the first direction D1, of each of the first and second single height cells SHC1 and SHC2. The gate cutting patterns CT may be arranged at the first pitch along the third border BD3, and at the first pitch along the fourth border BD4. When viewed in plan, the gate cutting patterns CT on the third and fourth borders BD3 and BD4 may be disposed to be overlapped by the gate electrodes GE, respectively. The gate cutting patterns CT may be formed of (or include) at least one insulating material, such as silicon oxide and silicon nitride.

The gate electrode GE on the first single height cell SHC1 may be spaced apart from the gate electrode GE on the second single height cell SHC2 by the gate cutting pattern CT. The gate cutting pattern CT may be interposed between the gate electrodes GE on the first and second single height cells SHC1 and SHC2 which are aligned with each other in the first direction D1. That is, the gate electrode GE extending in the first direction D1 may be divided into a plurality of the gate electrodes GE by the gate cutting patterns CT.

Referring again to FIGS. 4 and 5A to 5F, a pair of gate spacers GS may be disposed on opposite side surfaces of each of the gate electrodes GE. The gate spacers GS may extend along the gate electrodes GE in the first direction D1. Top surfaces of the gate spacers GS may be higher than top surfaces of the gate electrodes GE. The top surfaces of the gate spacers GS may be coplanar with a top surface of a first interlayer insulating layer 110, as described hereafter. The gate spacers GS may be formed of (or include) at least one of SiCN, SiCON and/or SiN. In some embodiments, the gate spacers GS may be a multi-layered structure including at least two different materials selected from SiCN, SiCON, and SiN.

A gate dielectric pattern GI may be interposed between the gate electrode GE and the first active pattern AP1 and between the gate electrode GE and the second active pattern AP2. The gate dielectric pattern GI may extend along a bottom surface of the gate electrode GE thereon. As an example, the gate dielectric pattern GI may cover the first top surface TS1 and the first side surface SW1 of the first channel pattern CH1. The gate dielectric pattern GI may cover the second top surface TS2 and the second side surfaces SW2 of the second channel pattern CH2. The gate dielectric pattern GI may cover the top surface of the device isolation layer ST below the gate electrode GE. (See, e.g., FIG. 5F).

In some embodiments, the gate dielectric pattern GI may be formed of (or include) a high-k dielectric material having a dielectric constant higher than that of silicon oxide. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide and lead zinc niobate.

The gate electrode GE may include a first metal pattern and a second metal pattern on the first metal pattern. The first metal pattern may be provided on the gate dielectric pattern GI and may be adjacent to the first and second channel patterns CH1 and CH2. The first metal pattern may include a work function metal that may be used to adjust a threshold voltage of the transistor. That is, by adjusting the thickness and/or composition of the first metal pattern it is possible to realize a transistor having a desired threshold voltage.

The first metal pattern may be formed (or include) a metal nitride. For example, the first metal pattern may include at least one metal, such as titanium (Ti), tantalum (Ta), aluminum (Al), tungsten (W) and/or molybdenum (Mo)—as well as nitrogen (N) and/or carbon (C). In some embodiments, the first metal pattern may include a plurality of stacked work-function metal layers.

The second metal pattern may include at least one metal having a resistance lower than that of the first metal pattern. For example, the second metal pattern may include at least one metal, such as tungsten (W), aluminum (Al), titanium (Ti) and/or tantalum (Ta).

A first interlayer insulating layer 110 may be provided on the substrate 100. The first interlayer insulating layer 110 may cover the gate spacers GS and the first and second source/drain patterns SD1 and SD2. A top surface of the first interlayer insulating layer 110 may be substantially coplanar with top surfaces of the gate capping patterns GP and top surfaces of the gate spacers GS. A second interlayer insulating layer 120 may be provided on the first interlayer insulating layer 110 to cover the gate capping patterns GP. A third interlayer insulating layer 130 may be provided on the second interlayer insulating layer 120. A fourth interlayer insulating layer 140 may be provided on the third interlayer insulating layer 130. In some embodiments, at least one of the first, second, third and fourth interlayer insulating layers 110, 120, 130 and 140 may include silicon oxide.

A pair of division structures DB may be opposingly provided (in the second direction D2) on both sides of each of the first and second single height cells SHC1 and SHC2. For example, the pair of the division structures DB may be, respectively, provided on the first and second borders BD1 and BD2 of the first single height cell SHC1. The division structure DB may extend in the first direction D1 in parallel with the gate electrodes GE. A pitch between the division structure DB and the gate electrode GE adjacent may be substantially the same as the first pitch.

The division structure DB may be provided to penetrate the first and second interlayer insulating layers 110 and 120, and may extend to the first and second active patterns AP1 and AP2. That is, the division structure DB may penetrate the upper portion of each of the first and second active patterns AP1 and AP2. The division structure DB may electrically separate an active region of each of the first and second single height cells SHC1 and SHC2 from an active region of a neighboring cell.

Active contacts AC may be provided to penetrate the first and second interlayer insulating layers 110 and 120 and may be electrically connected to the first and second source/drain patterns SD1 and SD2, respectively. Each of the active contacts AC may be provided between a pair of the gate electrodes GE. When viewed in plan, each of the active contacts AC may be a bar or line shaped pattern extending in the first direction D1.

The active contact AC may be a self-aligned contact. For example, the active contact AC may be formed by a self-alignment process using the gate capping pattern GP and the gate spacer GS, and in this regard, the active contact AC may cover at least a portion of the side surface of the gate spacer GS. Although not shown, the active contact AC may cover a portion of the top surface of the gate capping pattern GP.

Silicide patterns SC may be respectively interposed between the active contacts AC and the first and second source/drain patterns SD1 and SD2. The active contacts AC may be electrically connected to the first and second source/drain patterns SD1 and SD2, respectively, through the silicide patterns SC. The silicide pattern SC may be formed of (or include) at least one metal-silicide material, such as titanium silicide, tantalum silicide, tungsten silicide, nickel silicide and/or cobalt silicide.

In some embodiments, the active contacts AC may include a first active contact AC1, a second active contact AC2 and a third active contact AC3. The first active contact AC1 on the first single height cell SHC1 may electrically connect the first source/drain pattern SD1 of the first PMOSFET region PR1 to the second source/drain pattern SD2 of the first NMOSFET region NR1. The first active contact AC1 may extend from the second source/drain pattern SD2 of the first NMOSFET region NR1 to the first source/drain pattern SD1 of the first PMOSFET region PR1 in the first direction D1.

The second active contact AC2 may cross a boundary between adjacent cells. For example, the second active contact AC2 may electrically connect the first source/drain pattern SD1 of the first PMOSFET region PR1 to the first source/drain pattern SD1 of the second PMOSFET region PR2. The second active contact AC2 may extend from the first source/drain pattern SD1 of the first PMOSFET region PR1 to the first source/drain pattern SD1 of the second PMOSFET region PR2 in the first direction D1. The second active contact AC2 may cross the border (e.g., the third border BD3) between the first and second single height cells SHC1 and SHC2 and may be coupled in common to the first PMOSFET region PR1 of the first single height cell SHC1 and the second PMOSFET region PR2 of the second single height cell SHC2.

The third active contact AC3 on the second single height cell SHC2 may be locally provided on only the first source/drain pattern SD1 of the second PMOSFET region PR2 or the second source/drain pattern SD2 of the second NMOSFET region NR2. Unlike the first and second active contacts AC1 and AC2 described above, the third active contact AC3 may be localized on a single active region and may not connect adjacent the active regions.

When viewed in plan, a length (in the first direction D1) of the third active contact AC3 may be less than a length of each of the first and second active contacts AC1 and AC2. In some embodiments, the length of the third active contact AC3 may be less than about half the length of each of the first and second active contacts AC1 and AC2.

Referring to FIGS. 4 and 5A to 5F, buffer layers BL may be provided in an upper region of the second interlayer insulating layer 120. The buffer layers BL may be provided on the device isolation layer ST and between adjacent ones of the active regions. When viewed in plan, the buffer layers BL may be arranged in the first direction D1 and extend in the second direction D2, between adjacent ones of the active regions. For example, the buffer layers BL may be provided between the first PMOSFET region PR1 and the first NMOSFET region NR1, between the first PMOSFET region PR1 and the second PMOSFET region PR2, and between the second PMOSFET region PR2 and the second NMOSFET region NR2 and may extend in the second direction D2. The buffer layer BL may be interposed between the first active contact AC1 and the third active contact AC3. The buffer layer BL may be interposed between adjacent ones of the second active contacts AC2. The buffer layers BL may be adjacent to the active contacts AC in the first direction D1.

The buffer layer BL may be formed of (or include) a material having an etch selectivity with respect to the first and second interlayer insulating layers 110 and 120. That is, during a process of etching the first and second interlayer insulating layers 110 and 120, an etch rate of the buffer layer BL may be less than (or lower than) etch rates of the first and second interlayer insulating layers 110 and 120. For example, the buffer layer BL may be formed of (or include) at least one of SiN, SiON, SiCN and/or SiOC. Each of the first and second active contacts AC1 and AC2 may penetrate the buffer layer BL. The first active contact AC1 may be provided to penetrate the buffer layer BL between the first PMOSFET region PR1 and the first NMOSFET region NR1. The second active contact AC2 may be provided to penetrate the buffer layer BL between the first PMOSFET region PR1 and the second PMOSFET region PR2. By adjusting the thickness and/or composition of the buffer layer BL, the first and second active contacts AC1 and AC2 may be formed to a desired depth.

A width (in the first direction D1) of the buffer layer BL may gradually decrease with decreasing distance from the substrate 100. In some embodiments, the buffer layer BL may be formed with a rounded bottom surface. The buffer layers BL may be disposed on the third and fourth borders BD3 and BD4 of the first single height cell SHC1. The bottom surfaces of the buffer layers BL may be located at a higher level than bottom surfaces of the active contacts AC1, AC2, AC3.

Gate contacts GC, which are electrically and respectively connected to the gate electrodes GE, may be provided to penetrate the second interlayer insulating layer 120 and the gate capping pattern GP. When viewed in plan, the gate contacts GC on the first single height cell SHC1 may be disposed to be overlapped with the first PMOSFET region PR1. That is, the gate contacts GC on the first single height cell SHC1 may be provided on the first active pattern APE (See, e.g., FIG. 5A). The gate contacts GC on the first single height cell SHC1 may be adjacent to the buffer layer BL provided between the first PMOSFET region PR1 and the first NMOSFET region NR1.

Here, the gate contact GC may be freely disposed on the gate electrode GE without limitation to its position. For example, the gate contacts GC on the second single height cell SHC2 may be respectively disposed on the second PMOSFET region PR2, the second NMOSFET region NR2, and the device isolation layer ST filling the second trench TR2. At least one of the gate contacts GC on the second single height cell SHC2 may penetrate the buffer layer BL between the second PMOSFET region PR2 and the second NMOSFET region NR2.

Referring to FIGS. 5A, 5D and 5E, and consistent with certain embodiments of the inventive concept, an upper portion of each of the active contacts AC adjacent to the gate contact GC may be filled with an upper insulating pattern UIP. A bottom surface of the upper insulating pattern UIP may be lower than a bottom surface of the gate contact GC. That is, a top surface of the active contact AC adjacent to the gate contact GC may be formed at a level, lower than the bottom surface of the gate contact GC, by the upper insulating pattern UIP (e.g., see FIG. 5A). Accordingly, it is possible to prevent the gate contact GC and the adjacent active contact AC from coming into contact with each other, thereby preventing a short circuit from occurring. As in the second active contact AC2 shown in FIG. 5E, two upper insulating patterns UIP may be disposed in the active contact AC elongated in the first direction D1.

Each of the active and gate contacts AC and GC may include a conductive pattern FM and a barrier pattern BM enclosing the conductive pattern FM. The conductive pattern FM may be formed of (or include) at least one metal, such as aluminum, copper, tungsten, molybdenum and/or cobalt. The barrier pattern BM may cover side and bottom surfaces of the conductive pattern FM. The barrier pattern BM may include a metal layer and a metal nitride layer. Here, the metal layer may be formed of (or include) at least one of titanium, tantalum, tungsten, nickel, cobalt and/or platinum, and the metal nitride layer may be formed of (or include) at least one of titanium nitride (TiN), tantalum nitride (TaN), tungsten nitride (WN), nickel nitride (NiN), cobalt nitride (CoN) and/or platinum nitride (PtN).

The first metal layer M1 may be provided in the third interlayer insulating layer 130. For example, the first metal layer M1 may include the first power line M1_R1, the second power line M1_R2, the third power line M1_R3, and first interconnection lines M1_I. The interconnection lines M1_R1, M1_R2, M1_R3, and M1_I of the first metal layer M1 may extend in the second direction D2 to be parallel to each other.

Here, the first and second power lines M1_R1 and M1_R2 may be provided on the third and fourth borders BD3 and BD4 of the first single height cell SHC1, respectively. The first power line M1_R1 may extend along the third border BD3 and in the second direction D2. The second power line M1_R2 may extend along the fourth border BD4 and in the second direction D2.

The first interconnection lines M1_I of the first metal layer M1 may be arranged at a second pitch in the first direction D1. The second pitch may be less than (or smaller than) the first pitch. A line width of each of the first interconnection lines M1_I may be less than a line width of each of the first to third power lines M1_R1, M1_R2, and M1_R3.

The first metal layer M1 may further include the first vias VI1. The first vias VI1 may be respectively provided below the interconnection lines M1_R1, M1_R2, M1_R3, and M1_I of the first metal layer M1. The active contact AC and the interconnection line of the first metal layer M1 may be electrically connected to each other through the first via VI1.

The gate contact GC and the interconnection line of the first metal layer M1 may be electrically connected to each other through the first via VI1.

The interconnection line of the first metal layer M1 and the first via VI1 thereunder may be formed by separate processes. For example, each of the interconnection line of the first metal layer M1 and the first via VI1 may be formed by a single damascene process. The semiconductor device according to the present embodiment may be fabricated by a sub-20 nm process.

A second metal layer M2 may be provided in the fourth interlayer insulating layer 140. The second metal layer M2 may include a plurality of second interconnection lines M2_I. Each of the second interconnection lines M2_I of the second metal layer M2 may be a line or bar shaped pattern extending in the first direction D1. That is, the second interconnection lines M2_I may extend in the first direction D1 in parallel with each other.

The second metal layer M2 may further include second vias VI2, which are respectively provided below the second interconnection lines M2_I. The interconnection line of the first metal layer M1 and the interconnection line of the second metal layer M2 may be electrically connected to each other through the second via VI2. The interconnection line of the second metal layer M2 and the second via VI2 thereunder may be formed together by a dual damascene process.

The interconnection line of the first metal layer M1 and the interconnection line of the second metal layer M2 may be formed of (or include) the same conductive material or different conductive materials. For example, the interconnection line of the first metal layer M1 and the interconnection line of the second metal layer M2 may be formed of (or include) at least one metal material, such as aluminum, copper, tungsten, molybdenum and/or cobalt. Although not specifically illustrated in FIGS. 4 and 5A to 5F, a plurality of metal layers (e.g., M3, M4, M5, . . . , Mn) may be additionally stacked on the fourth interlayer insulating layer 140, wherein each of the stacked metal layers may include interconnection lines for distributing electrical signal(s) between cells.

One example of the first active contact AC1 will be described hereafter in some additional detail with reference to FIG. 5D. The first active contact AC1 may include a first body portion BP1 on the first source/drain pattern SD1 and a second body portion BP2 on the second source/drain pattern SD2. The first body portion BP1 may be connected to a top surface of the first source/drain pattern SD1 through the silicide pattern SC, and the second body portion BP2 may be connected to a top surface of the second source/drain pattern SD2 through the silicide pattern SC.

The first active contact AC1 may further include at least one protruding portion PT1 or PT2 and at least one recessed portion RP, which are interposed between the first and second body portions BP1 and BP2. For example, the first active contact AC1 may include a first protruding portion PT1, a second protruding portion PT2, and a recessed portion RP therebetween. The first protruding portion PT1, the second protruding portion PT2, and the recessed portion RP may be provided on the device isolation layer ST and between the first PMOSFET region PR1 and the first NMOSFET region NR1.

The first protruding portion PT1 may extend from the first body portion BP1 toward the device isolation layer ST along an inclined side surface of the first source/drain pattern SD1. The second protruding portion PT2 may extend from the second body portion BP2 toward the device isolation layer ST along an inclined side surface of the second source/drain pattern SD2. The recessed portion RP may be a portion of the first active contact AC1 whose bottom is recessed in a direction away from the device isolation layer ST.

A bottom surface BS3 of the first protruding portion PT1 may be lower than a bottom surface BS1 of the first body portion BP1. The bottom surface BS3 of the first protruding portion PT1 may be located at a level higher than the device isolation layer ST. For example, the first protruding portion PT1 may be vertically spaced apart from the device isolation layer ST with the first interlayer insulating layer 110 interposed therebetween.

A bottom surface BS4 of the second protruding portion PT2 may be lower than a bottom surface BS2 of the second body portion BP2. The bottom surface BS4 of the second protruding portion PT2 may be located at a level higher than the device isolation layer ST. For example, the second protruding portion PT2 may be vertically spaced apart from the device isolation layer ST with the first interlayer insulating layer 110 interposed therebetween.

A bottom surface BS5 of the recessed portion RP may be higher than the bottom surface BS3 of the first protruding portion PT1 and may be higher than the bottom surface BS4 of the second protruding portion PT2. The bottom surface BS5 of the recessed portion RP may be lower than the bottom surface BS1 of the first body portion BP1 and may be lower than the bottom surface BS2 of the second body portion BP2.

The first active contact AC1 may be connected to the top surface of the first source/drain pattern SD1 through the first body portion BP1 and may be also be connected to the inclined side surface of the first source/drain pattern SD1 through the first protruding portion PT1. As a result, due to the first protruding portion PT1, it may be possible to increase a contact area between the first active contact AC1 and the first source/drain pattern SD1. Thus, the electrical resistance between the first active contact AC1 and the first source/drain pattern SD1 may be reduced. Similarly, due to the second protruding portion PT2, it may be possible to increase a contact area between the first active contact AC1 and the second source/drain pattern SD2. Thus, the electrical resistance between the first active contact AC1 and the second source/drain pattern SD2 may be reduced. And as a further result, it may be possible to improve certain operating properties (e.g., operating speed) for semiconductor devices according to embodiments of the inventive concept.

Figure 6:
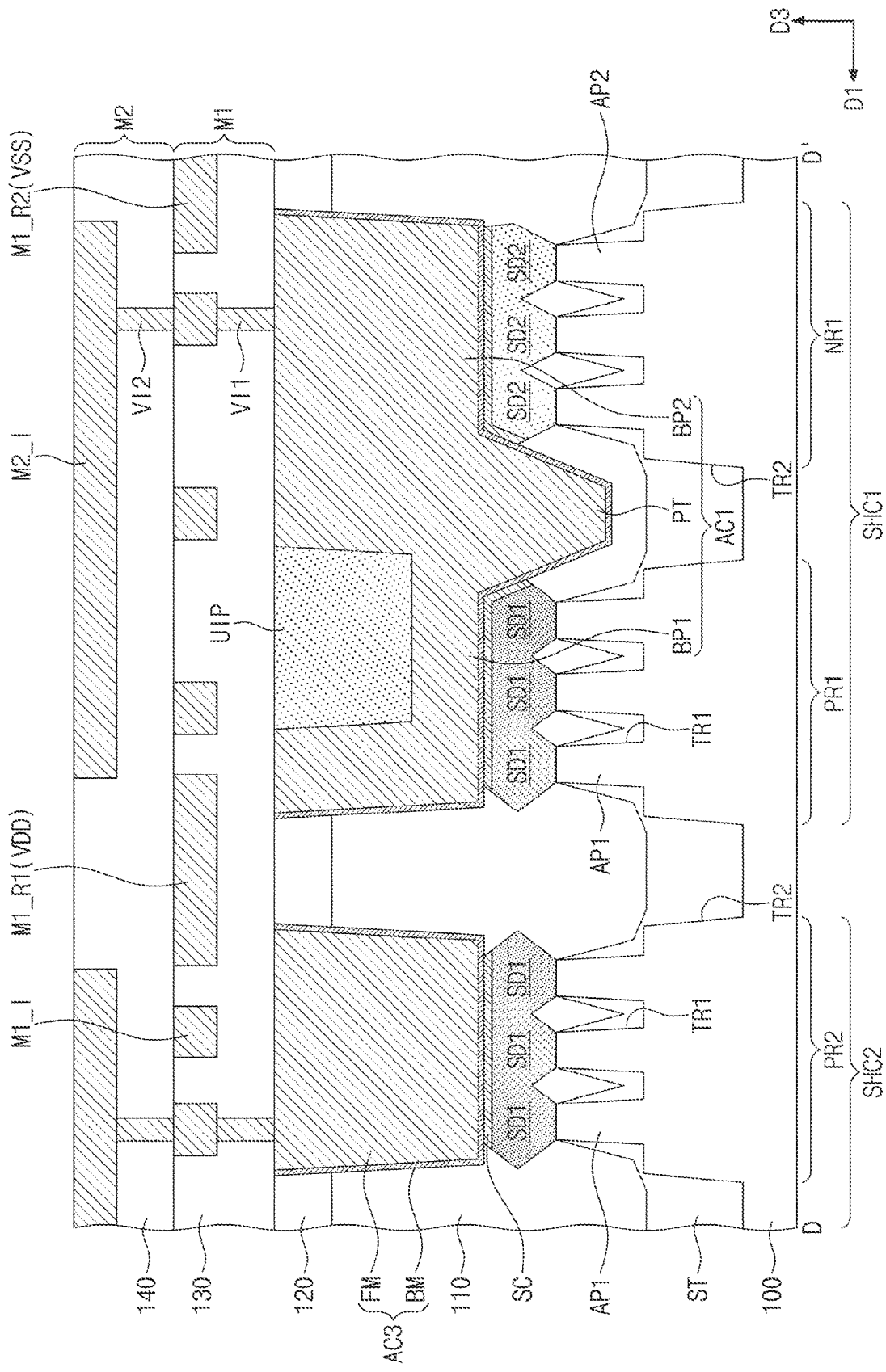
FIG. 6 is a cross-sectional view taken along the line D-D' of FIG. 4 and serves as a comparative example.
Figure 7:
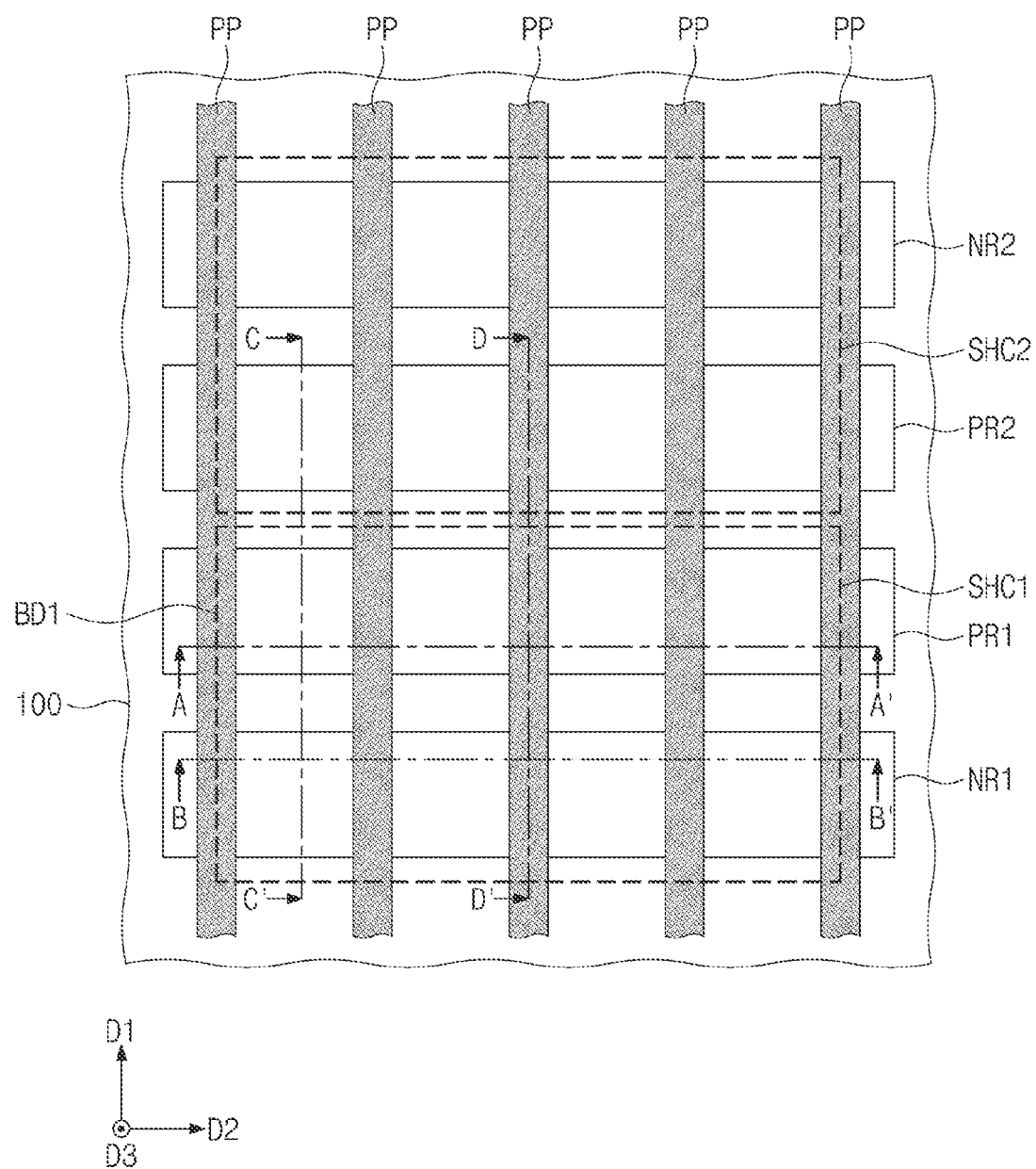
FIGS. 7, 9, 11, 13, and 15 are respective plan views illustrating in one example a method of fabricating a semiconductor device according to embodiments of the inventive concept.

FIG. 6 is a cross-sectional view taken along the line C-C' of FIG. 4 and shows a semiconductor device that may be considered as a comparative example to the foregoing. Referring to FIGS. 5D and 6, the buffer layers BL of FIG. 5D may be omitted from the comparative example of FIG. 6. Additionally, the first active contact AC1 of FIG. 6 may include only one protruding portion PT between the first and second body portions BP1 and BP2, as compared with the first active contact AC1 shown in FIG. 5D. As a result, the first active contact AC1 of FIG. 6 does not include the recessed portion RP.

The protruding portion PT of the first active contact AC1 may extend to a level that is very close to the device isolation layer ST. In the case where the protruding portion PT deeply extends downward, a parasitic capacitance between the first source/drain pattern SD1 and the protruding portion PT may increase. Similarly, a parasitic capacitance between the second source/drain pattern SD2 and the protruding portion PT may also increase. Thus, if the protruding portion PT of the first active contact AC1 deeply extends downward, it is possible to reduce resistance, as described above, but certain operating properties of the semiconductor device may deteriorate due to the resulting increase in parasitic capacitance.

However, in the semiconductor device of FIG. 5D according to embodiments of the inventive concept, the buffer layer BL is provided between the first PMOSFET region PR1 and the first NMOSFET region NR1. Further, an etch rate for the buffer layer BL may be adjusted to prevent the first interlayer insulating layer 110 disposed between the first and second source/drain patterns SD1 and SD2 from becoming deeply recessed. Thus, the first active contact AC1 may include the recessed portion RP, and since the first active contact AC1 includes the recessed portion RP, the parasitic capacitance between the first source/drain pattern SD1 and the first active contact AC1 may be reduced. Similarly, the parasitic capacitance between the second source/drain pattern SD2 and the first active contact AC1 may be reduced. That is, according to embodiments of the inventive concept, it is possible to reduce both of the electrical resistance and parasitic capacitance between an active contact and the source/drain pattern. And as a further result, it is possible to improve certain operating properties, such as operating speed, of the semiconductor device.

As shown in FIG. 5E, the second active contact AC2 may have substantially the same bottom profile as the first active contact AC1 previously described with reference to FIG. 5D. The second active contact AC2 may include the first body portion BP1 on the first source/drain pattern SD1 of the second PMOSFET region PR2 and the second body portion BP2 on the first source/drain pattern SD1 of the first PMOSFET region PR1. The second active contact AC2 may further include the first and second protruding portions PT1 and PT2, which are interposed between the first and second body portions BP1 and BP2, and the recessed portion RP provided therebetween. As a result, due to the buffer layer BL formed between the first PMOSFET region PR1 and the second PMOSFET region PR2, the second active contact AC2 may include the recessed portion RP.

Figure 8A:
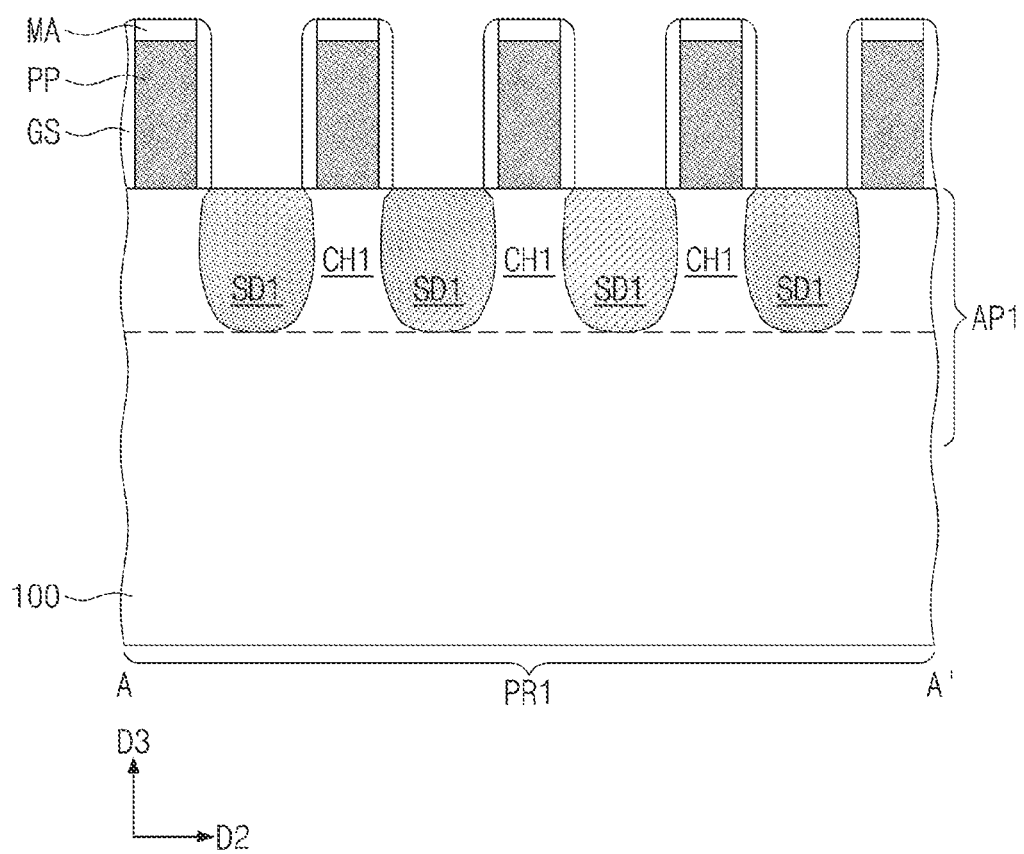
FIGS. 8A, 10A, 12A, 14A, and 16A are respective cross-sectional views taken along lines A-A' of FIGS. 7, 9, 11, 13, and 15.
Figure 8B:
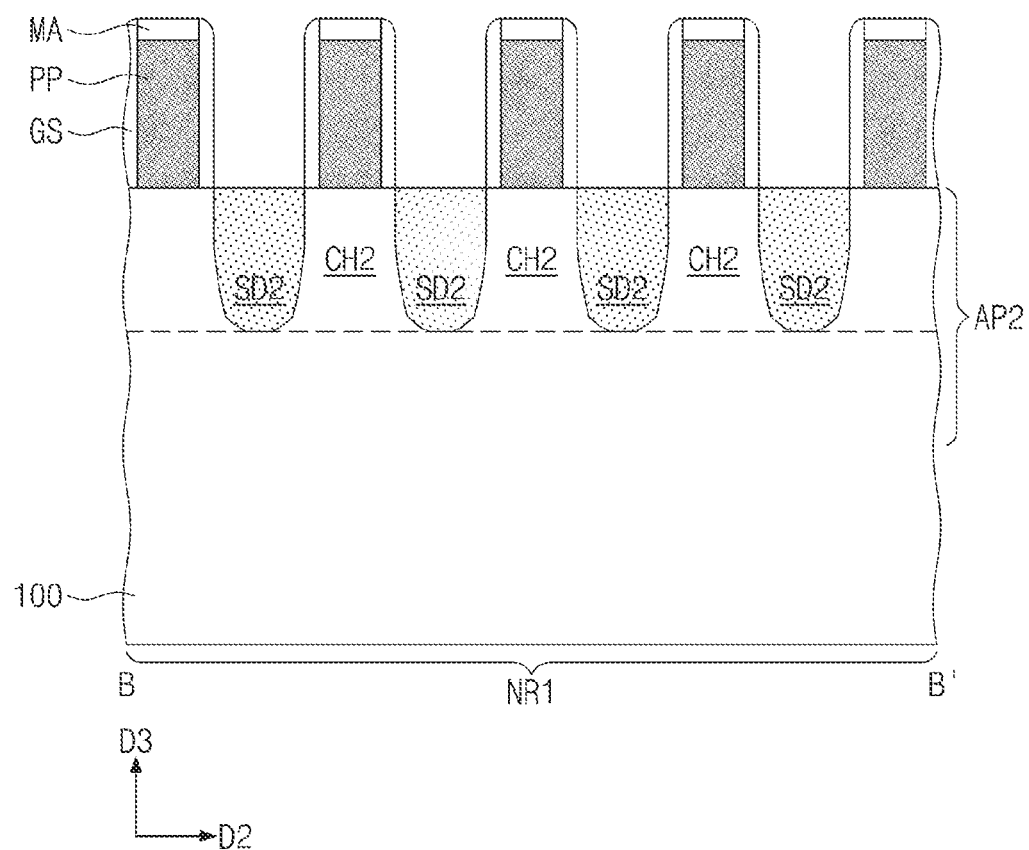
FIGS. 8B, 10B, 12B, 14B, and 16B are respective cross-sectional views taken along lines B-B' of FIGS. 7, 9, 11, 13, and 15.
Figure 8C:
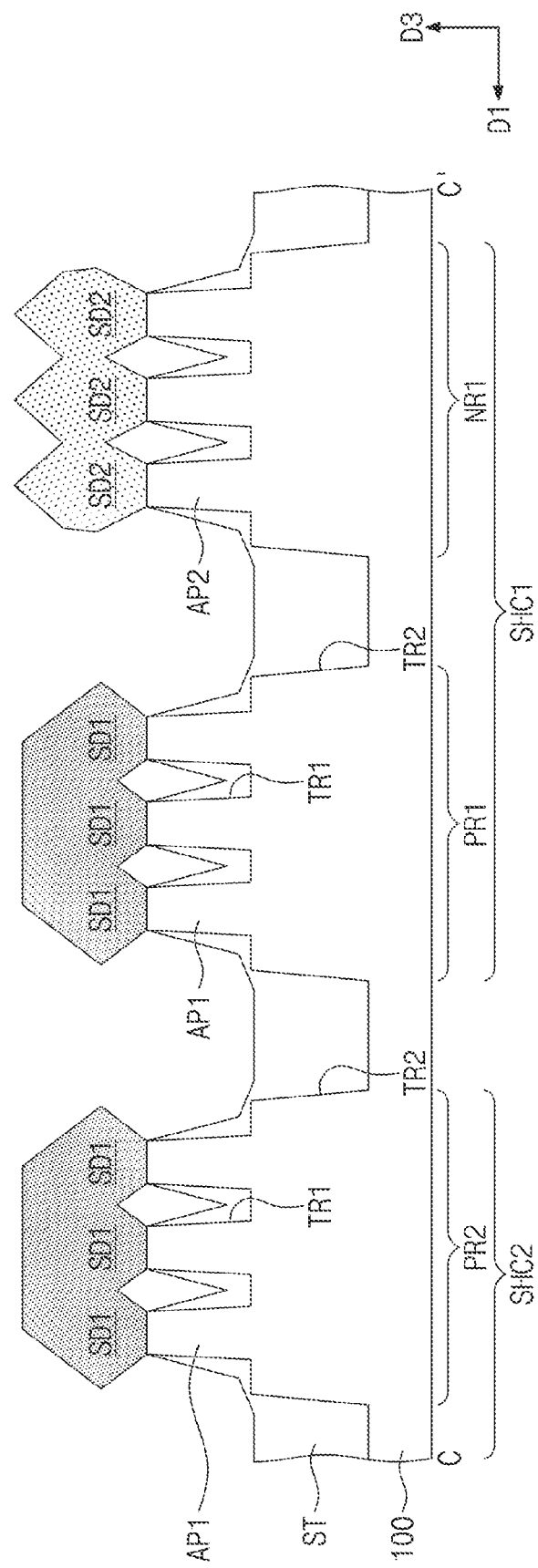
FIGS. 8C, 10C, 12C, 14C, and 16C are respective cross-sectional views taken along lines C-C' of FIGS. 7, 9, 11, 13, and 15.
Figure 8D:
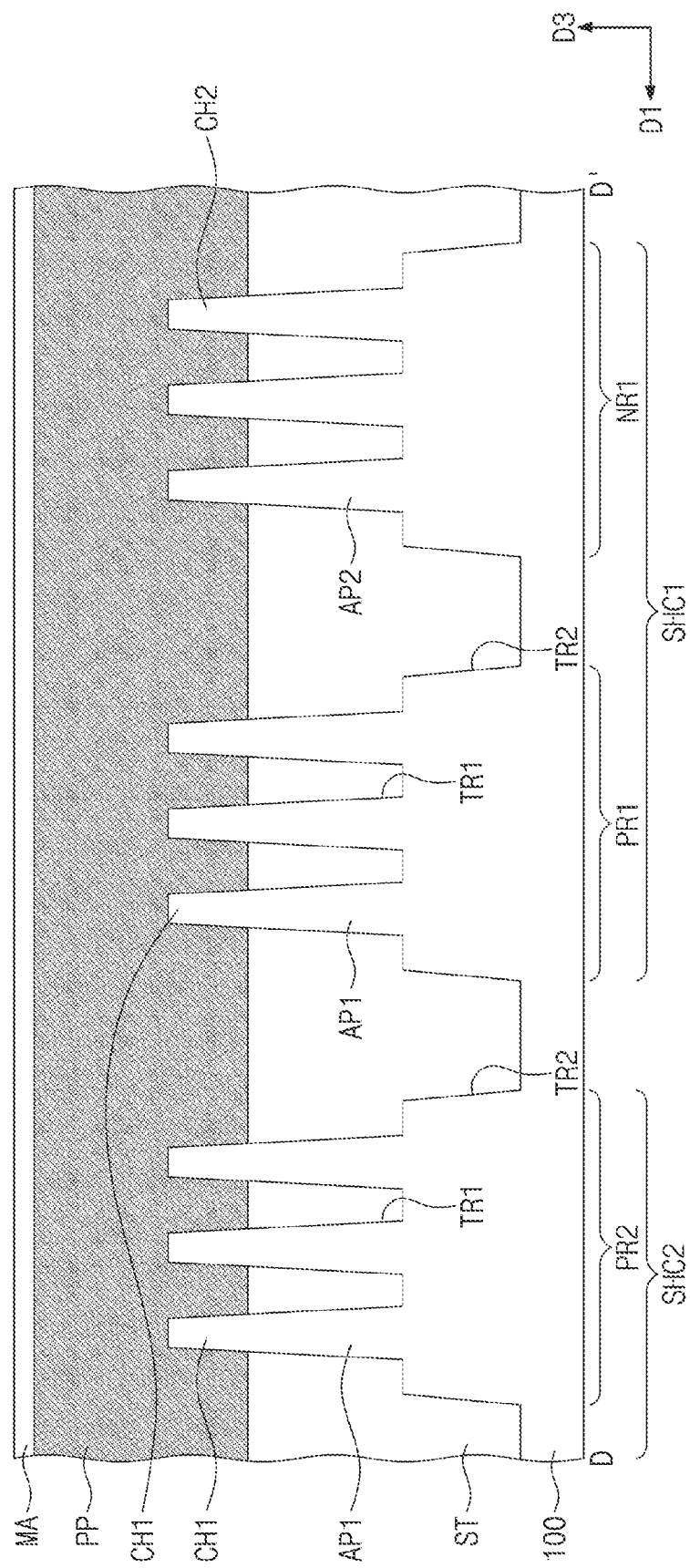
FIGS. 8D and 10D are respective cross-sectional views taken along lines D-D' of FIGS. 7 and 9.
Figure 9:
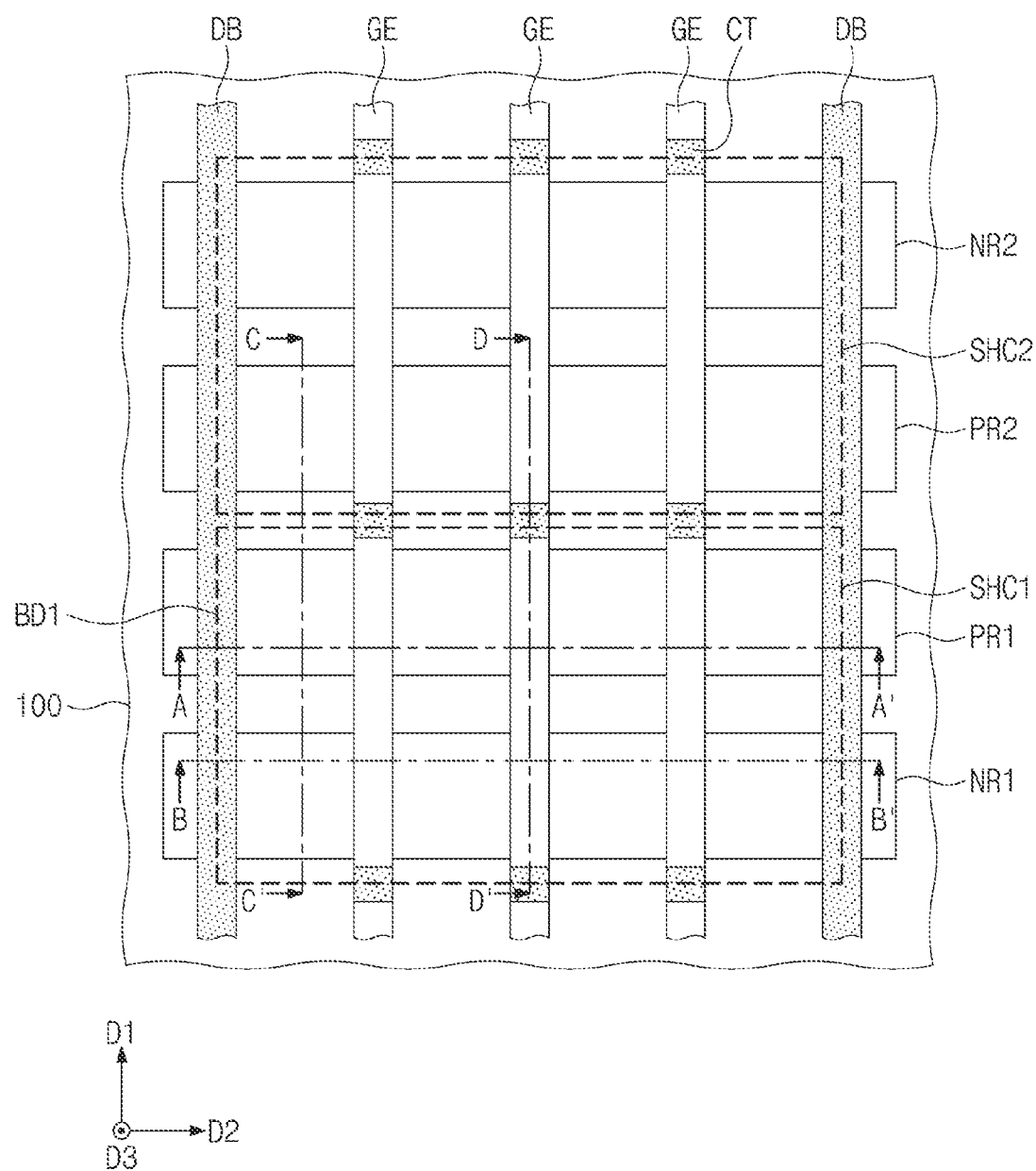
Figure 10A:
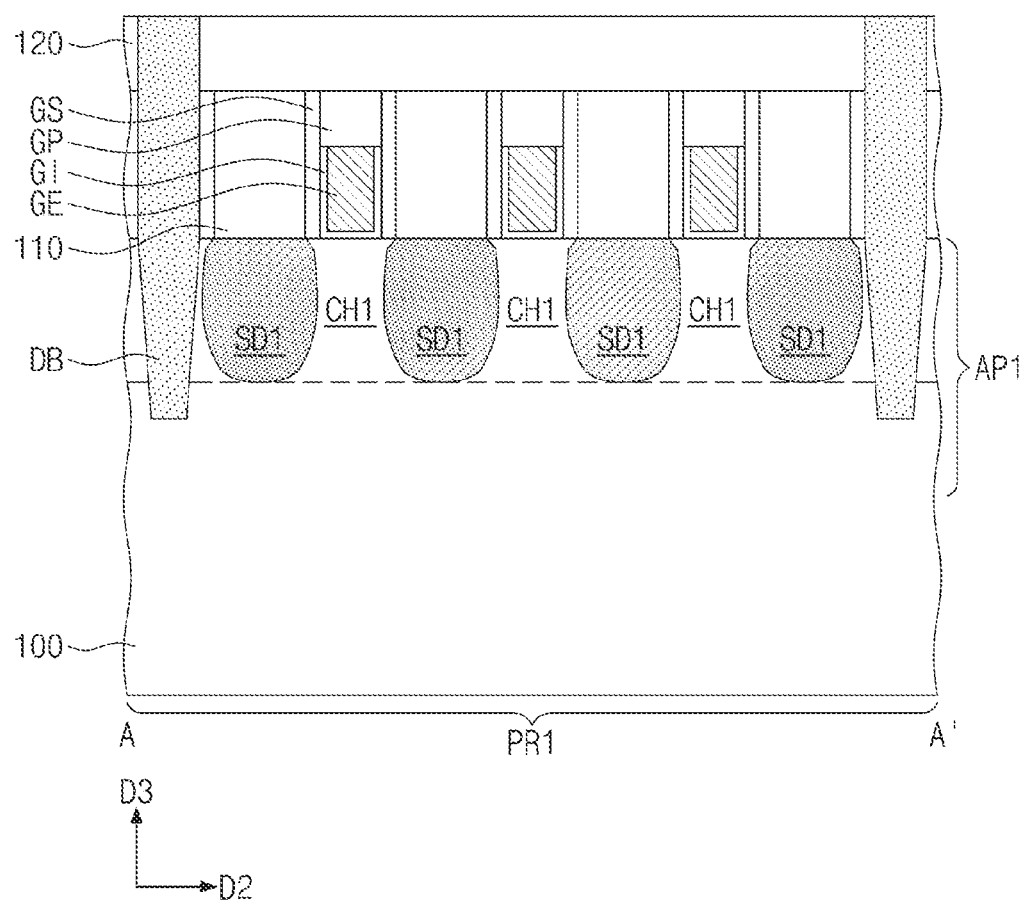
Figure 10B:
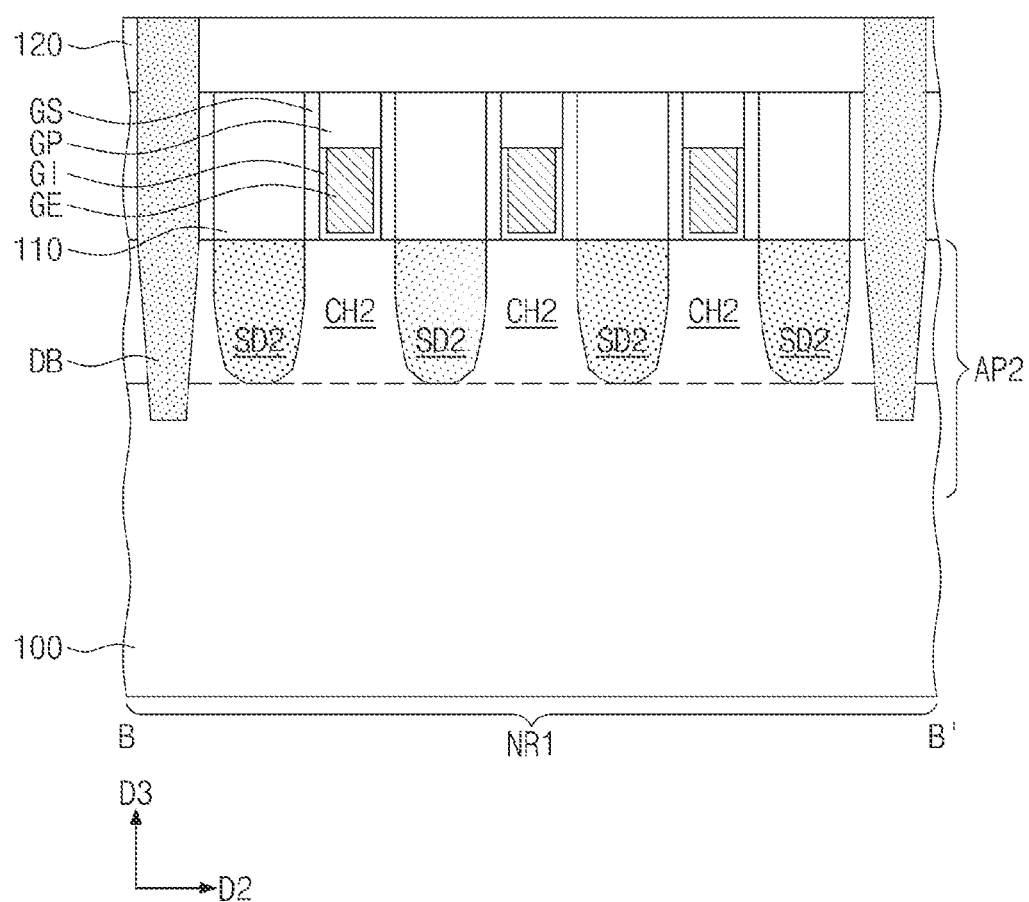
Figure 10C:
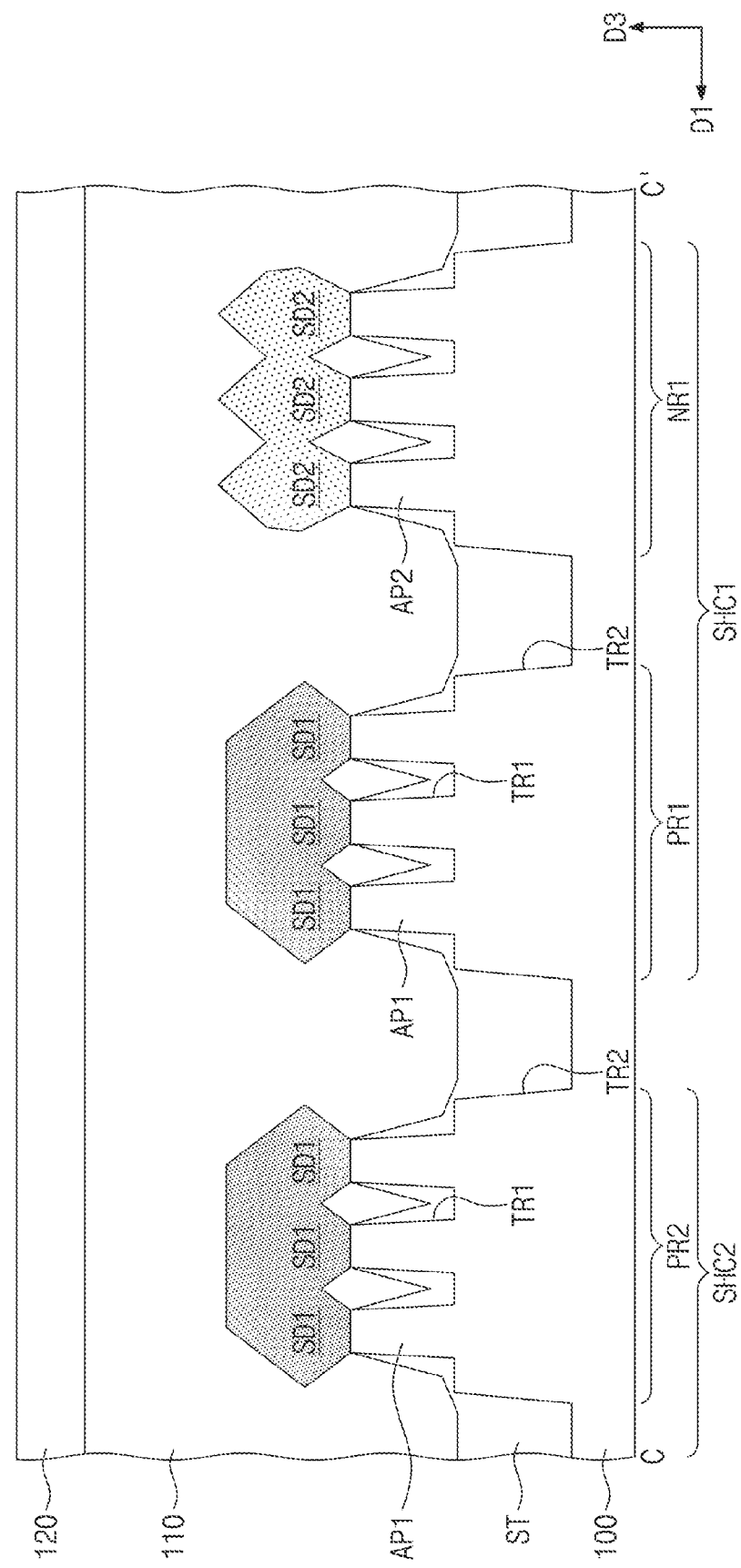
Figure 10D:
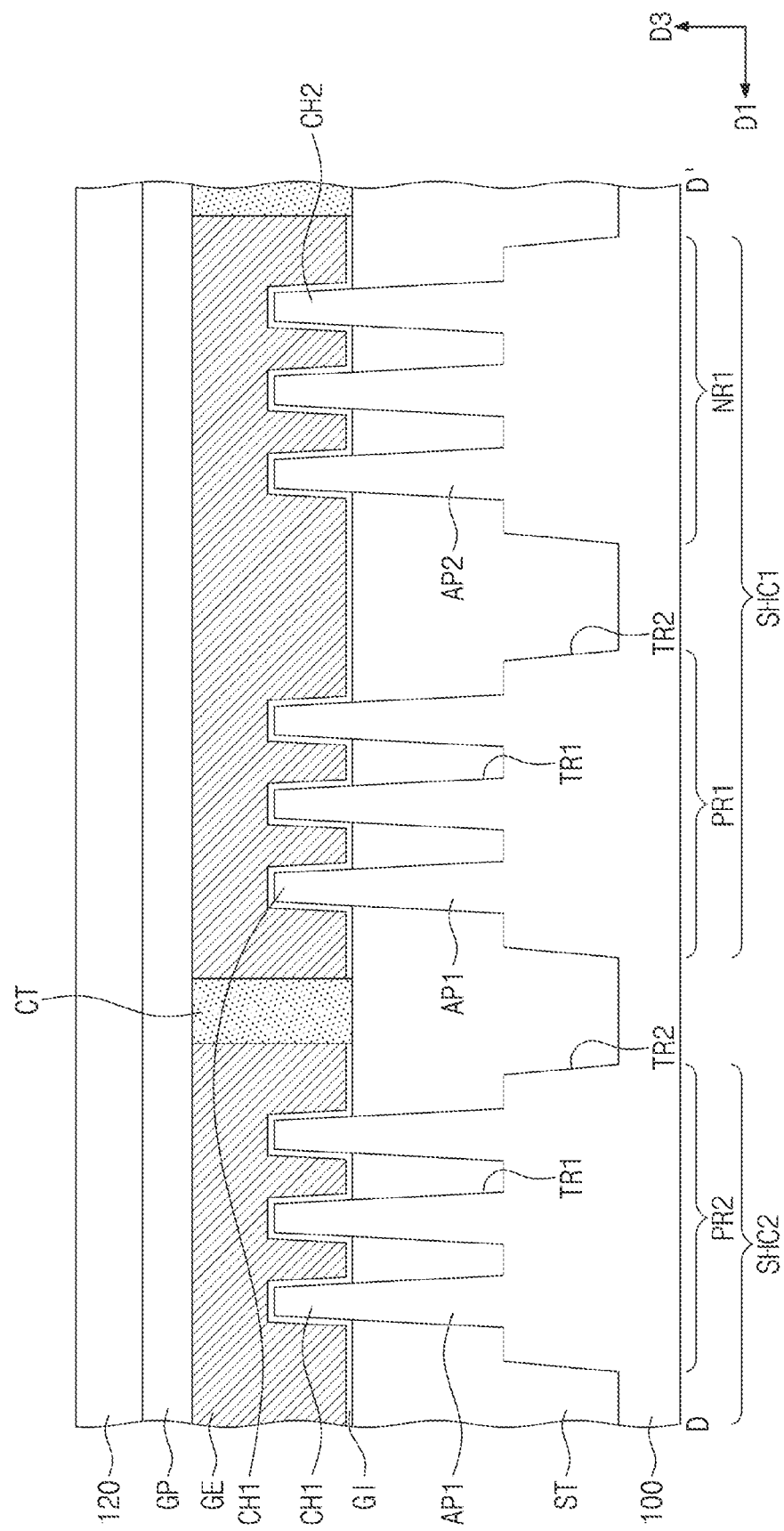
Figure 11:
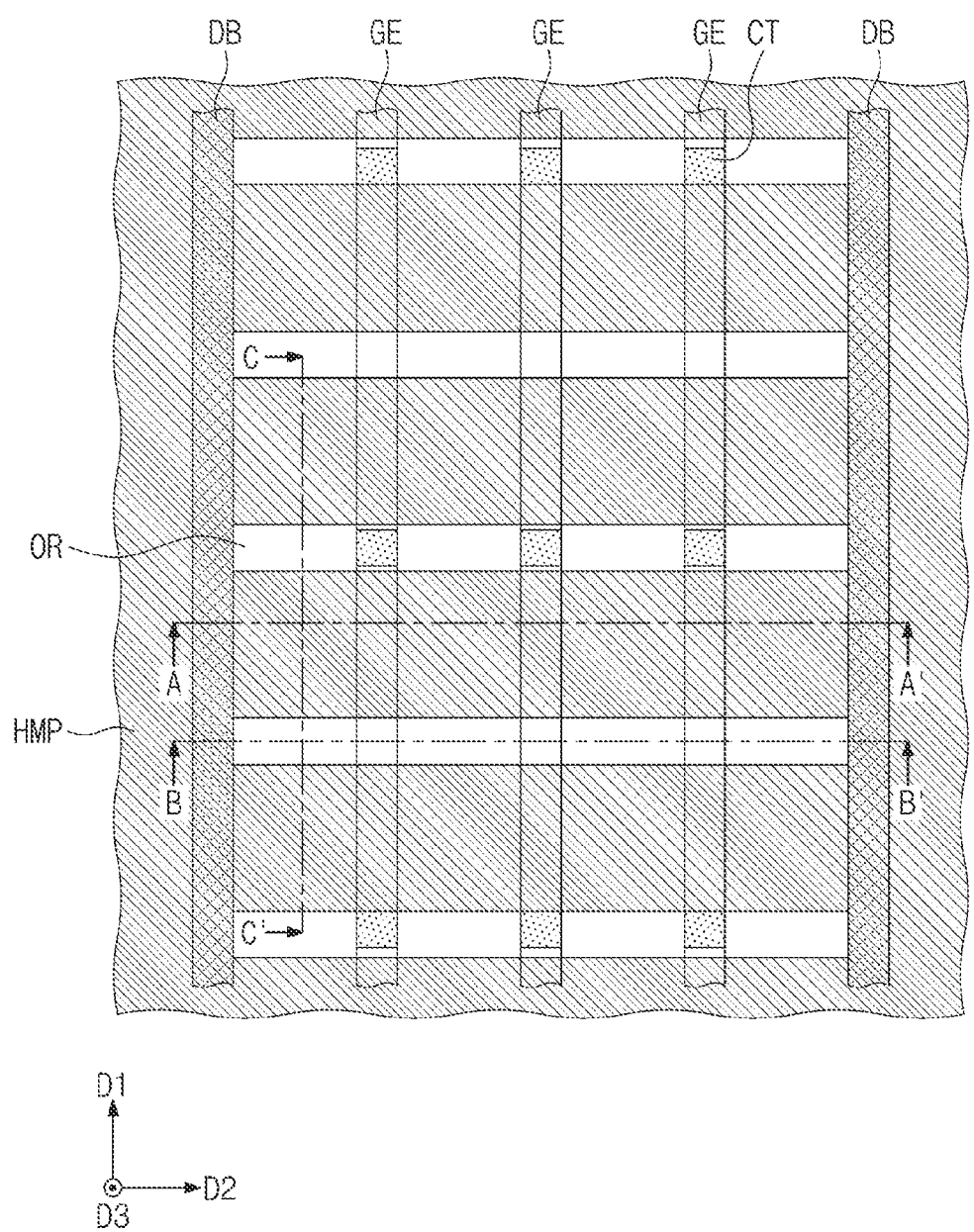
Figure 12A:
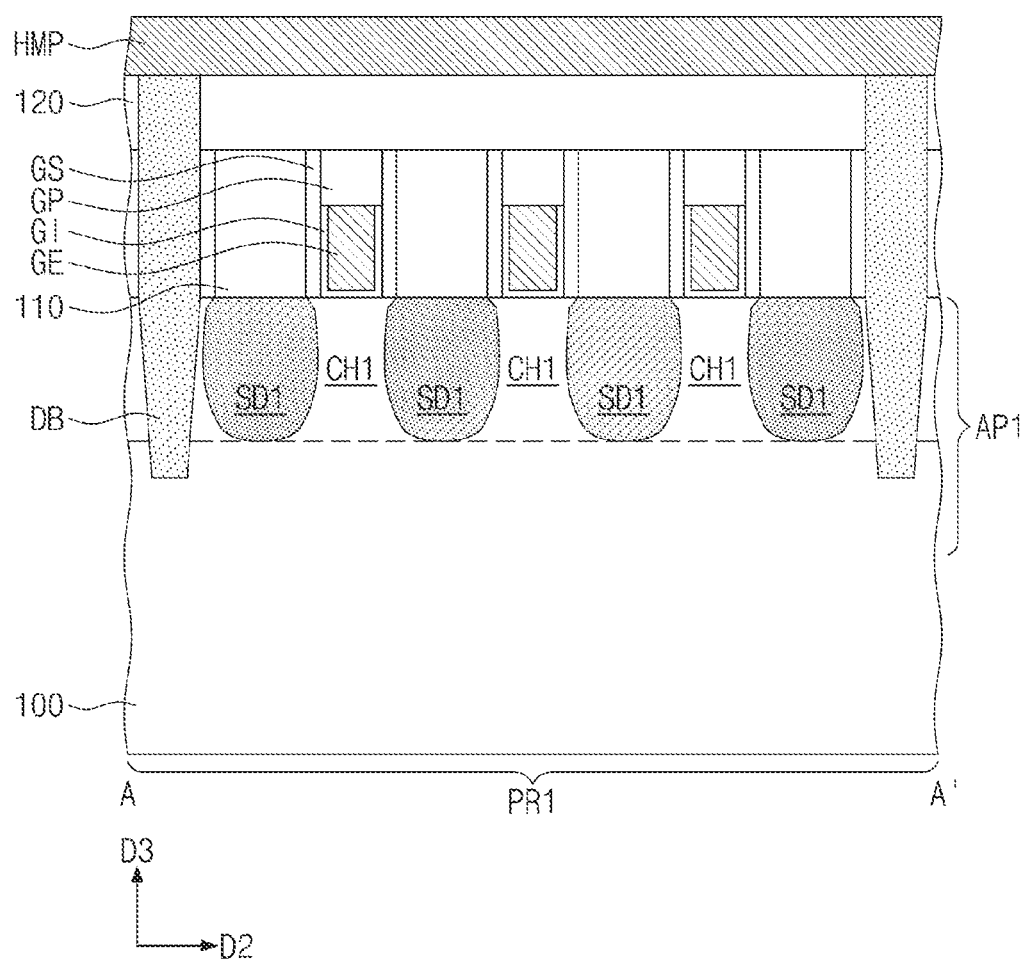
Figure 12B:
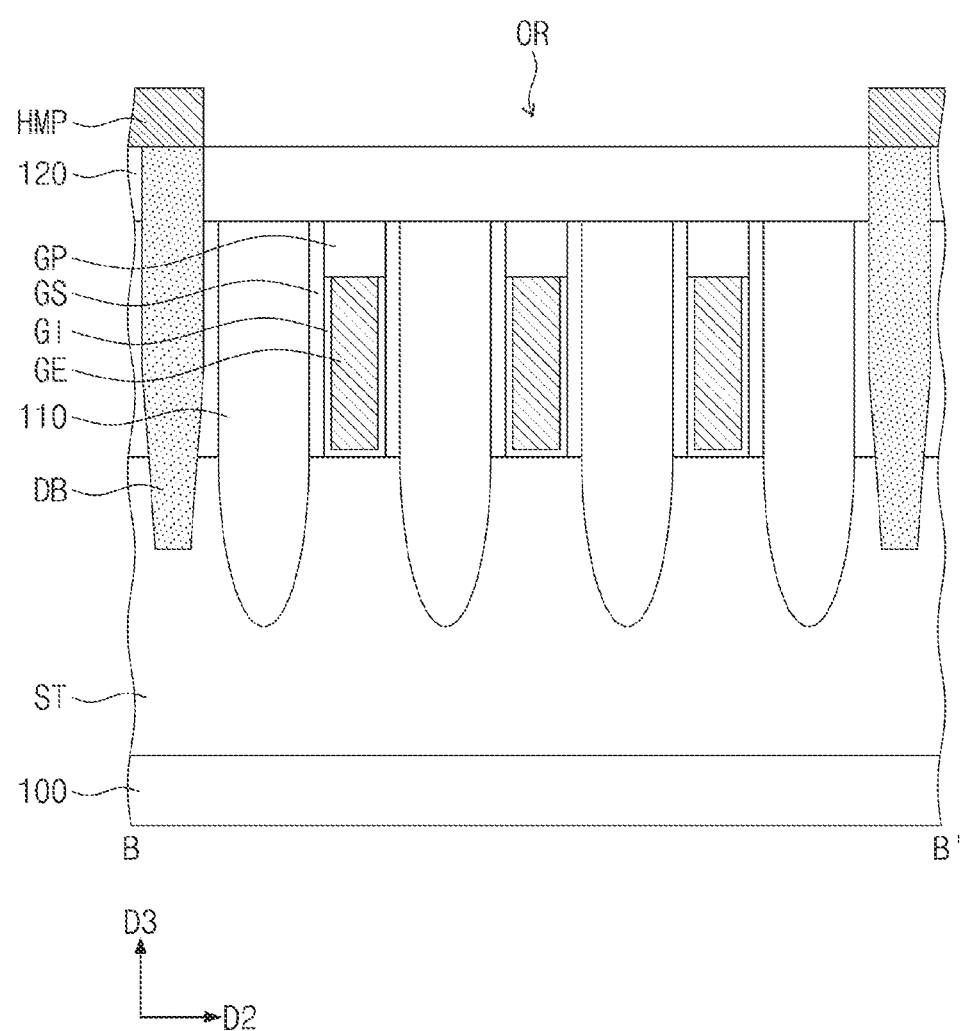
Figure 12C:
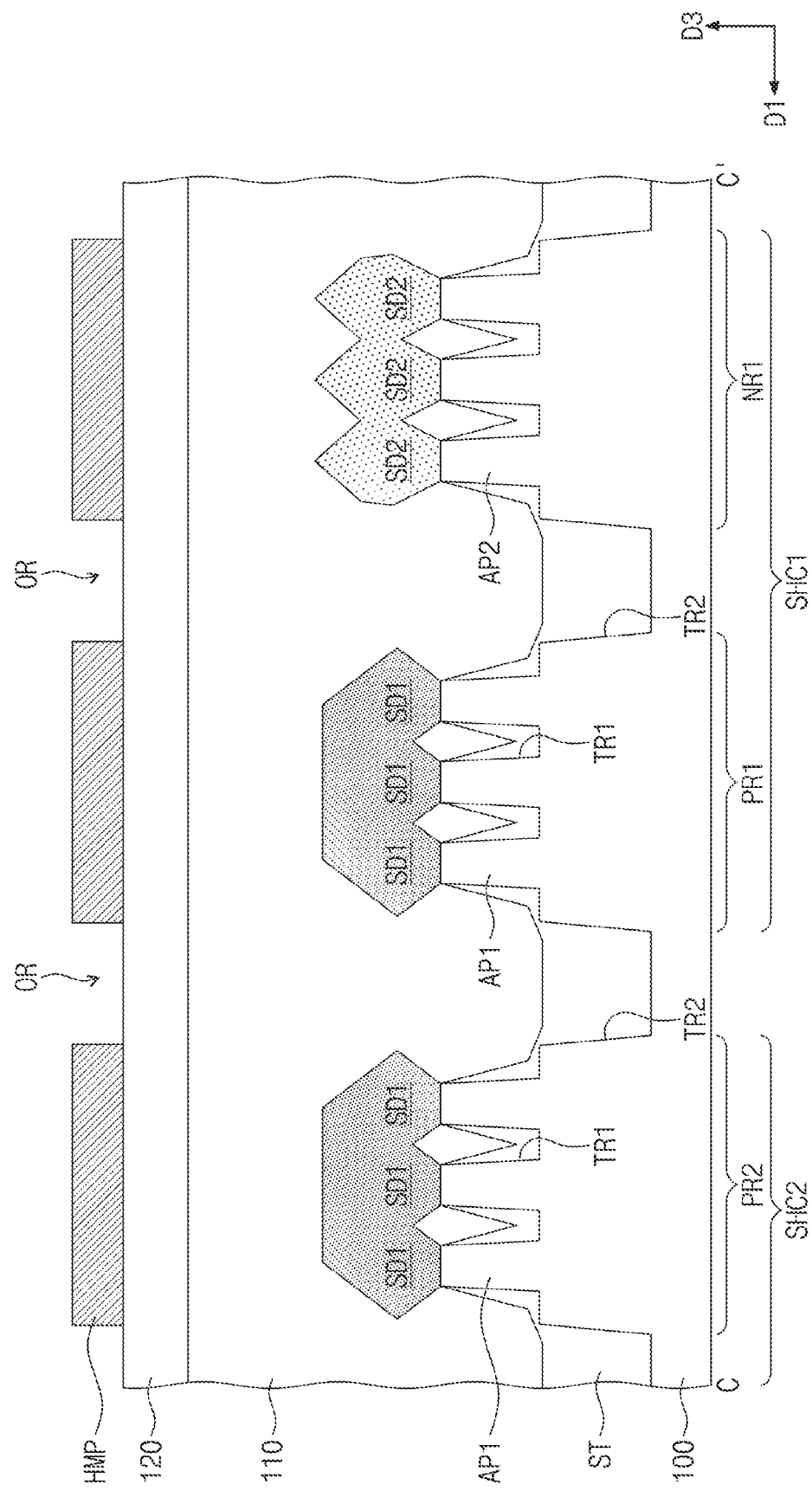
Figure 13:
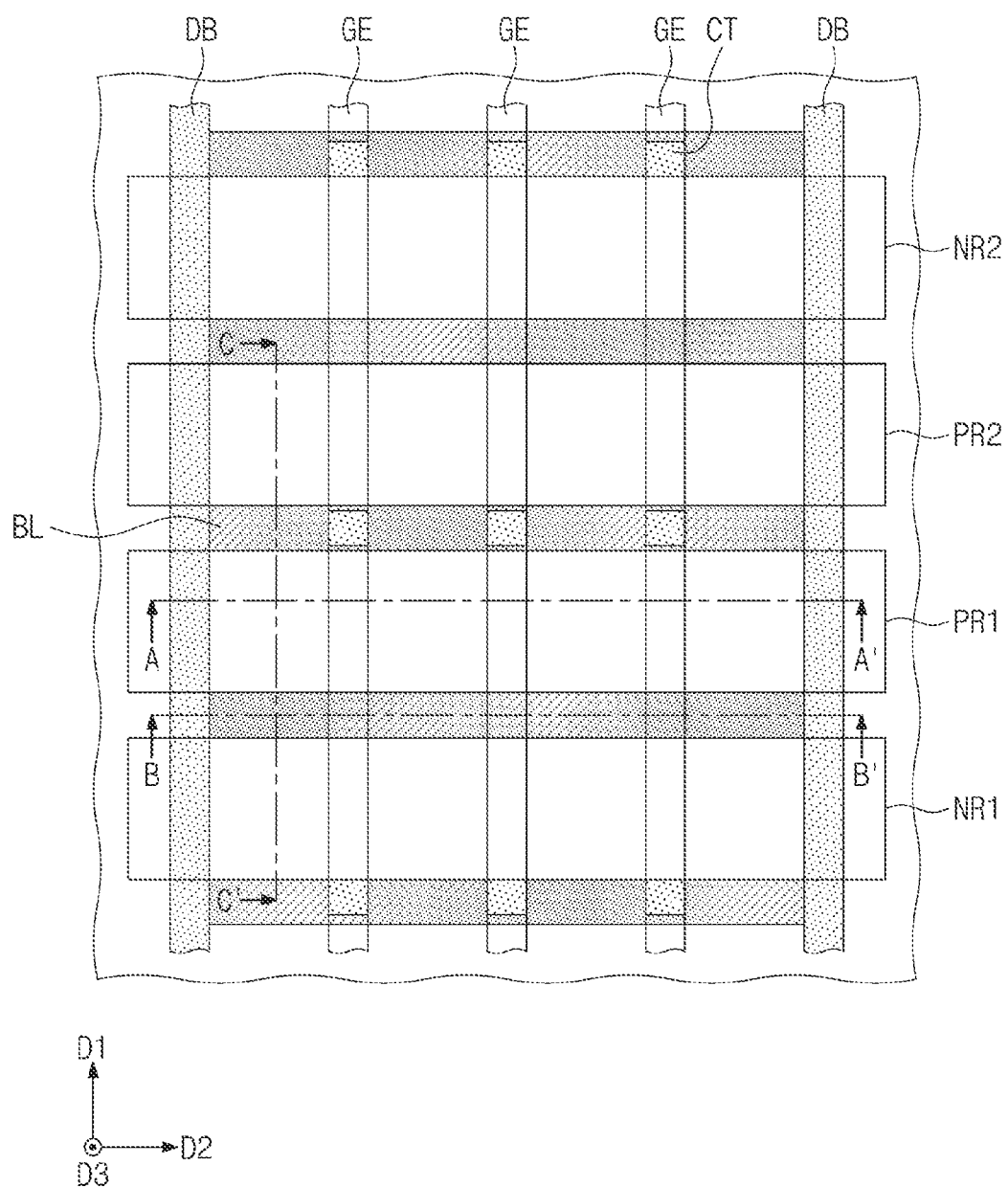

FIGS. 7, 9, 11, 13, and 15 are respective plan views illustrating a method of fabricating a semiconductor device according to embodiments of the inventive concept. FIGS. 8A, 10A, 12A, 14A, and 16A are respective cross-sectional views taken along lines A-A' of FIGS. 7, 9, 11, 13, and 15; FIGS. 8B, 10B, 12B, 14B, and 16B are respective cross-sectional views taken along lines B-B' of FIGS. 7, 9, 11, 13, and 15; and FIGS. 8C, 10C, 12C, 14C, and 16C are respective cross-sectional views taken along lines C-C' of FIGS. 7, 9, 11, 13, and 15. FIGS. 8D and 10D are cross-sectional views taken along lines D-D' of FIGS. 7 and 9, respectively.

Referring to FIGS. 7, 8A, 8B, 8C and 8D, the substrate 100 includes the first PMOSFET region PR1, the second PMOSFET region PR2, the first NMOSFET region NR1, and the second NMOSFET region NR2. The first NMOSFET region NR1 and the first PMOSFET region PR1 may define the first single height cell SHC1, and the second NMOSFET region NR2 and the second PMOSFET region PR2 may define the second single height cell SHC2.

The substrate 100 may be patterned to form the first and second active patterns AP1 and AP2. The first active patterns AP1 may be formed on each of the first and second PMOSFET regions PR1 and PR2. The second active patterns AP2 may be formed on each of the first and second NMOSFET regions NR1 and NR2.

The device isolation layer ST may be formed on the substrate 100. The device isolation layer ST may be formed of (or include) an insulating material, such as silicon oxide. The device isolation layer ST may be recessed to expose an upper portion of each of the first and second active patterns AP1 and AP2. Thus, the upper portion of each of the first and second active patterns AP1 and AP2 may protrude vertically above the device isolation layer ST.

Sacrificial patterns PP may be formed to cross the first and second active patterns AP1 and AP2. The sacrificial patterns PP may be line or bar shaped patterns extending in the first direction D1.

Here, the formation of the sacrificial patterns PP may include forming a sacrificial layer on the substrate 100, forming mask patterns MA on the sacrificial layer, and patterning the sacrificial layer using the mask patterns MA as an etch mask. The sacrificial layer may be formed of (or include) polysilicon.

A pair of the gate spacers GS may be respectively formed on opposite side surfaces of each of the sacrificial patterns PP. The formation of the gate spacers GS may include conformally forming a gate spacer layer to cover the entire top surface of the substrate 100 and anisotropically etching the gate spacer layer. The gate spacer layer may be formed of (or include) at least one of SiCN, SiCON and SiN. Alternatively, the gate spacer layer may be a multi-layered structure including at least two of SiCN, SiCON and SiN.

The first source/drain patterns SD1 may be formed in the upper portion of each of the first active patterns AP1. A pair of the first source/drain patterns SD1 may be formed on opposing sides of each of the sacrificial patterns PP.

Here, first recesses may be formed by etching the upper portion of the first active pattern AP1 using the mask patterns MA and the gate spacers GS as an etch mask. During the etching of the upper portion of the first active pattern AP1, the device isolation layer ST between the first active patterns AP1 may be recessed, as shown in FIG. 8C.

The first source/drain pattern SD1 may be formed by performing a selective epitaxial growth process using an inner surface of the first recess of the first active pattern AP1 as a seed layer. As a result of the formation of the first source/drain patterns SD1, the first channel pattern CH1 may be defined between each pair of the first source/drain patterns SD1. The selective epitaxial growth process may include a chemical vapor deposition (CVD) process or a molecular beam epitaxy (MBE) process. The first source/drain patterns SD1 may be formed of (or include) a semiconductor material such as SiGe, whose lattice constant is greater than a lattice constant of a material forming the substrate 100. Each of the first source/drain patterns SD1 may be a multi-layered structure including a plurality of semiconductor layers.

In some embodiments, the first source/drain patterns SD1 may be doped with impurities in situ during the selective epitaxial growth process for forming the first source/drain patterns SD1. In other embodiments, impurities may be doped (or injected) into the first source/drain patterns SD1 after the formation of the first source/drain patterns SD1. The first source/drain patterns SD1 may be doped with impurities of first conductivity type (e.g., P-type).

The second source/drain patterns SD2 may be formed in an upper portion of the second active pattern AP2. A pair of the second source/drain patterns SD2 may be formed at both sides of each of the sacrificial patterns PP.

Here, second recesses may be formed by etching an upper portion of the second active pattern AP2 using the mask patterns MA and the gate spacers GS as an etch mask. The second source/drain pattern SD2 may be formed by performing a selective epitaxial growth process using an inner surface of the second recess of the second active pattern AP2 as a seed layer. As a result of the formation of the second source/drain patterns SD2, the second channel pattern CH2 may be defined between each pair of the second source/drain patterns SD2. In some embodiments, the second source/drain patterns SD2 may be formed of (or include) the same semiconductor material (e.g., Si) as the substrate 100. The second source/drain patterns SD2 may be doped with impurities of second conductivity type (e.g., N-type).

The first source/drain patterns SD1 and the second source/drain patterns SD2 may be sequentially formed through different processes. That is, the first source/drain patterns SD1 and the second source/drain patterns SD2 may not be formed at the same time.

Referring to FIGS. 9, 10A, 10B, 10C and 10D, the first interlayer insulating layer 110 may be formed to cover the first and second source/drain patterns SD1 and SD2, the mask patterns MA, and the gate spacers GS. As an example, the first interlayer insulating layer 110 may include silicon oxide (e.g., a silicon oxide layer).

The first interlayer insulating layer 110 may be planarized to expose top surfaces of the sacrificial patterns PP. The planarization of the first interlayer insulating layer 110 may be performed using an etch-back or chemical-mechanical polishing (CMP) process. All of the mask patterns MA may be removed during the planarization process. As a result, a top surface of the first interlayer insulating layer 110 may be coplanar with the top surfaces of the sacrificial patterns PP and the top surfaces of the gate spacers GS.

The sacrificial patterns PP may be replaced with the gate electrodes GE, respectively. Here, the sacrificial patterns PP exposed may be selectively removed. Empty spaces may be formed as a result of the removal of the sacrificial patterns PP. The gate dielectric pattern GI, the gate electrode GE, and the gate capping pattern GP may be formed in each of the empty spaces.

During the replacement of the sacrificial pattern PP with the gate electrode GE, the gate cutting patterns CT may be formed on the gate electrode GE. The gate cutting patterns CT may be formed to divide each gate electrode GE into a plurality of gate electrodes GE.

The second interlayer insulating layer 120 may be formed on the first interlayer insulating layer 110. A pair of the division structures DB may be respectively formed at both sides of the first single height cell SHC1. The division structures DB may be respectively overlapped with the gate electrodes GE, which are formed at both sides of the first single height cell SHC1. For example, the formation of the division structures DB may include forming a hole, which is extended into the first and second active patterns AP1 and AP2 through the first and second interlayer insulating layers 110 and 120 and the gate electrode GE, and then filling the hole with an insulating layer.

Referring to FIGS. 11, 12A, 12b and 12C, a hard mask pattern HMP may be formed on the second interlayer insulating layer 120. A photolithography process may be performed to form a plurality of opening regions OR in the hard mask pattern HMP. The hard mask pattern HMP may include a carbon-containing layer (e.g., a SOH layer). The opening regions OR may define the buffer layers BL previously described with reference to FIG. 4. The opening regions OR may be formed on the device isolation layer ST between adjacent ones of the active regions.

Referring to FIGS. 13, 14A, 14B and 14C, a first etching process may be performed on the second interlayer insulating layer 120. An upper portion of the second interlayer insulating layer 120 exposed through the opening region OR may be etched using the hard mask pattern HMP as an etch mask. The first etching process may be performed to leave a portion of the second interlayer insulating layer 120. However, the inventive concept is not limited to this example, and the first etching process may be performed to expose the top surface of the first interlayer insulating layer 110 or to etch an upper portion of the first interlayer insulating layer 110.

The buffer layers BL may be formed by filling regions, from which the second interlayer insulating layer 120 is etched, with a material such as SiN, SiON, SiCN and/or SiOC having an etch selectivity with respect to the second interlayer insulating layer 120. Here, the formation of the buffer layers BL may include forming the buffer layers BL by filling regions, from which the second interlayer insulating layer 120 is etched, with a material having an etch selectivity with respect to the second interlayer insulating layer 120 and planarizing the buffer layers BL using a CMP process. As a result, the buffer layers BL may have top surfaces that are substantially coplanar with the top surface of the second interlayer insulating layer 120.

Referring to FIGS. 15, 16A, 16B and 16C, a new hard mask pattern HMP may be formed on the second interlayer insulating layer 120 provided with the buffer layers BL. A plurality of openings OP may be formed in the hard mask pattern HMP through a photolithography process.

The openings OP of the hard mask pattern HMP may include a first opening OP1, a second opening OP2, and a third opening OP3. The first to third openings OP1, OP2, and OP3 may define the first to third active contacts AC1, AC2, and AC3, respectively, which were previously described with reference to FIG. 4.

A second etching process may be performed on the substrate 100. The second etching process may be an anisotropic etching process. The second etching process may be performed to etch the first interlayer insulating layer 110 exposed through the openings OP. The second etching process may be performed until the first and second source/drain patterns SD1 and SD2 are exposed through the openings OP. An upper portion of each of the first and second source/drain patterns SD1 and SD2 may be removed during the second etching process.

Figure 16A:
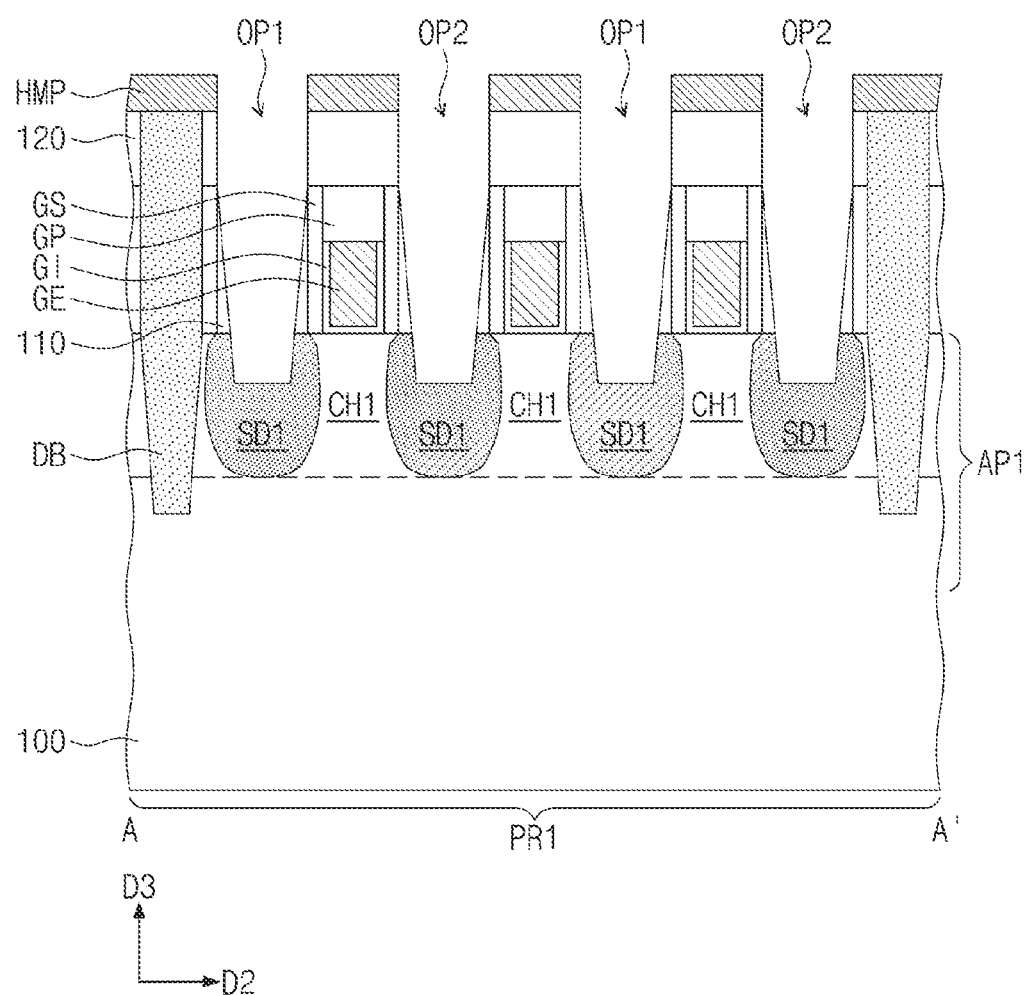
Figure 16B:
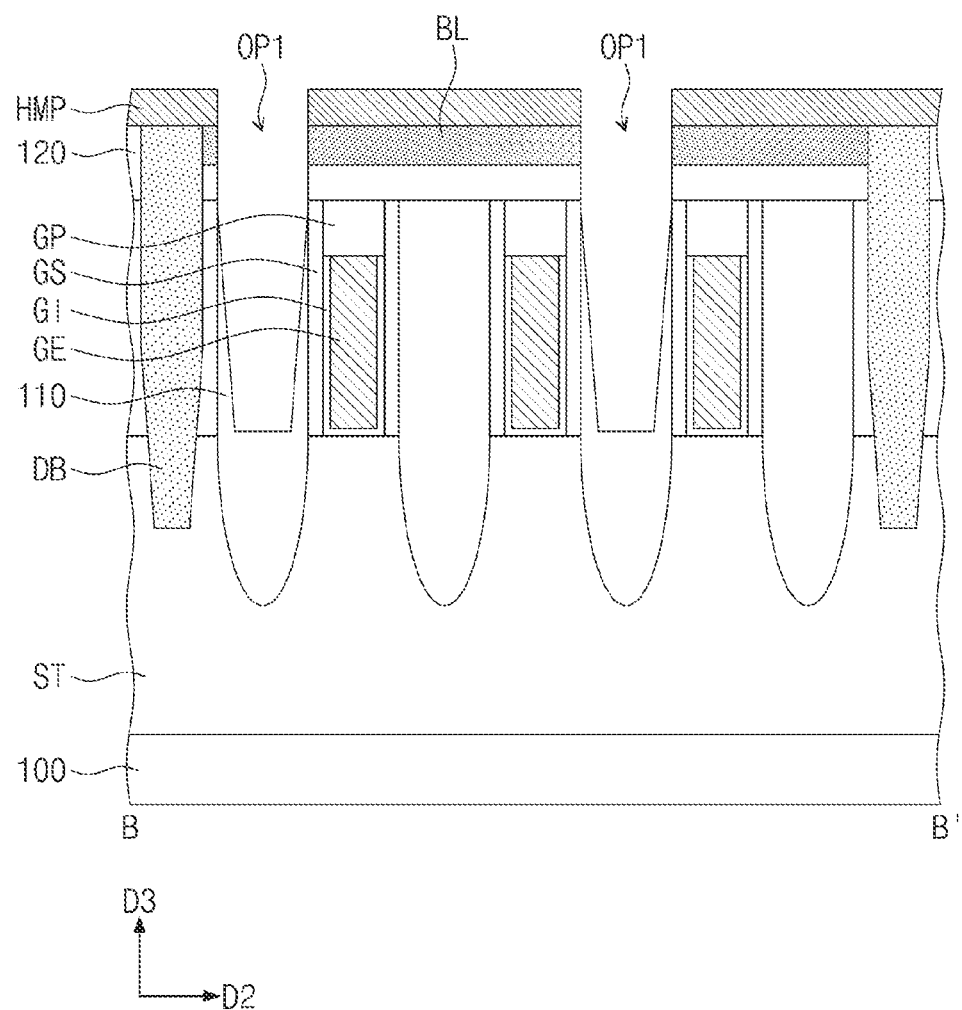
Figure 16C:
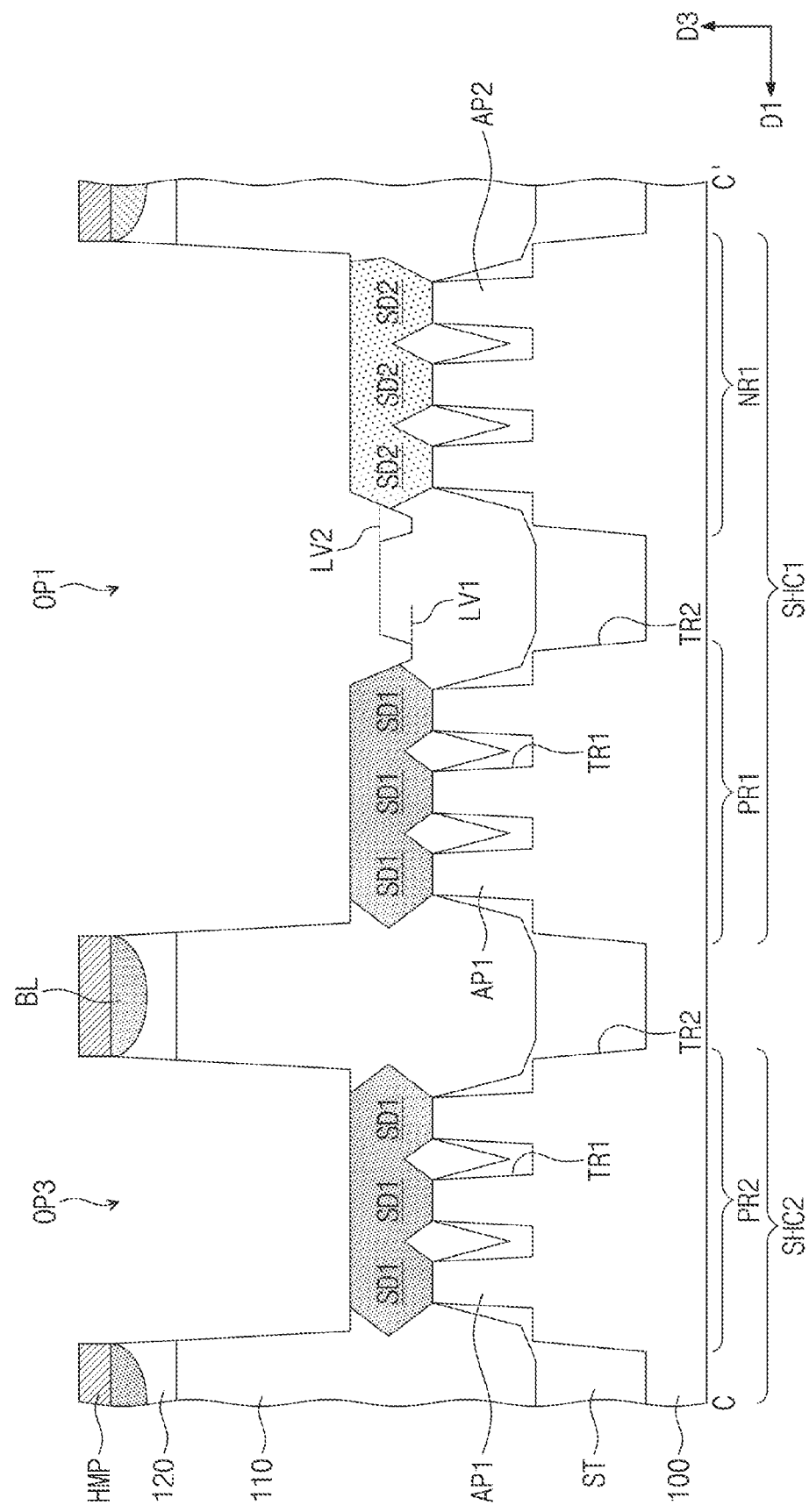

Referring to FIG. 16C, as a result of the second etching process, the first opening OP1 may be formed to expose the first source/drain pattern SD1 and the second source/drain pattern SD2. The first opening OP1 may expose the first interlayer insulating layer 110 between the first and second source/drain patterns SD1 and SD2.

In some embodiments, the second etching process may be performed in an over-etching manner to remove the upper portion of each of the first and second source/drain patterns SD1 and SD2, and in this case, the first interlayer insulating layer 110 between the first and second source/drain patterns SD1 and SD2 may be recessed to a deeper level, compared with the first and second source/drain patterns SD1 and SD2. For example, the lowermost level of the first opening OP1 may be a first level LV1, which is lower than the top surface of each of the first and second source/drain patterns SD1 and SD2.

Thus, the highest level of the first interlayer insulating layer 110 on the device isolation layer ST filling the second trench TR2 may be a second level LV2. The second level LV2 may be higher than the first level LV1. The second level LV2 may be lower than the top surface of each of the first and second source/drain patterns SD1 and SD2.

Figure 14A:
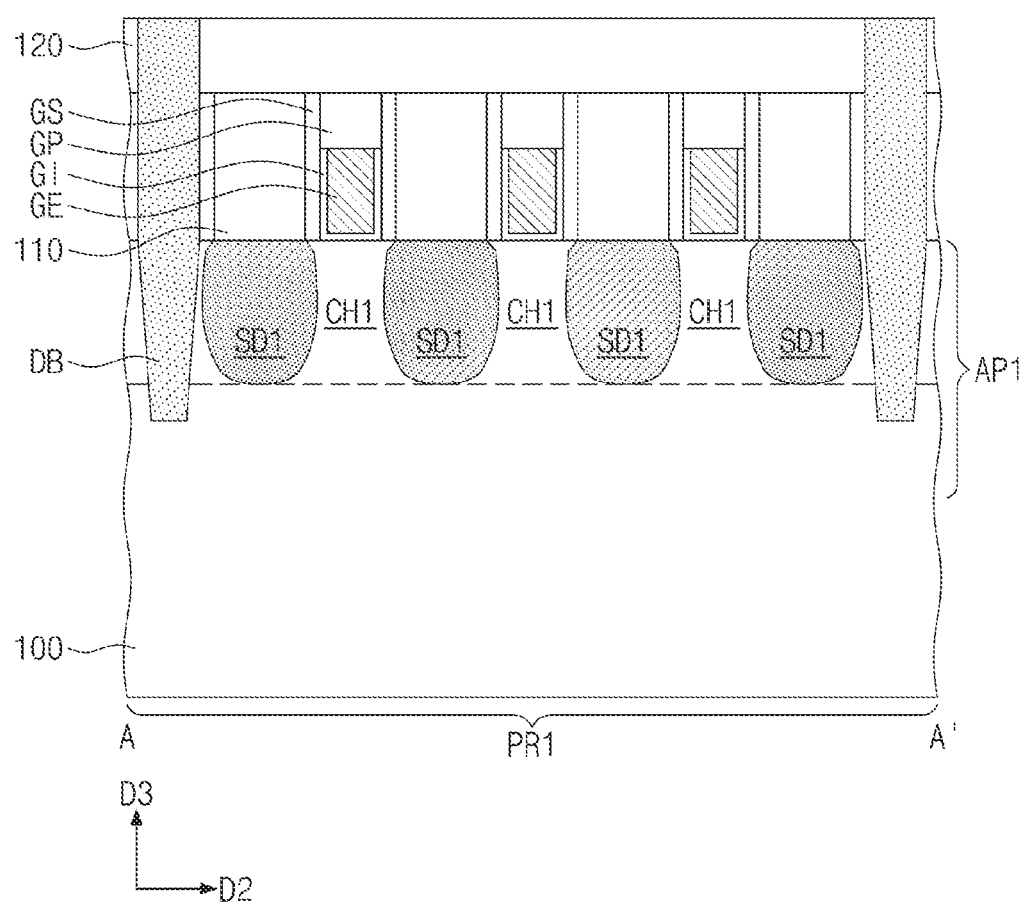
Figure 14B:
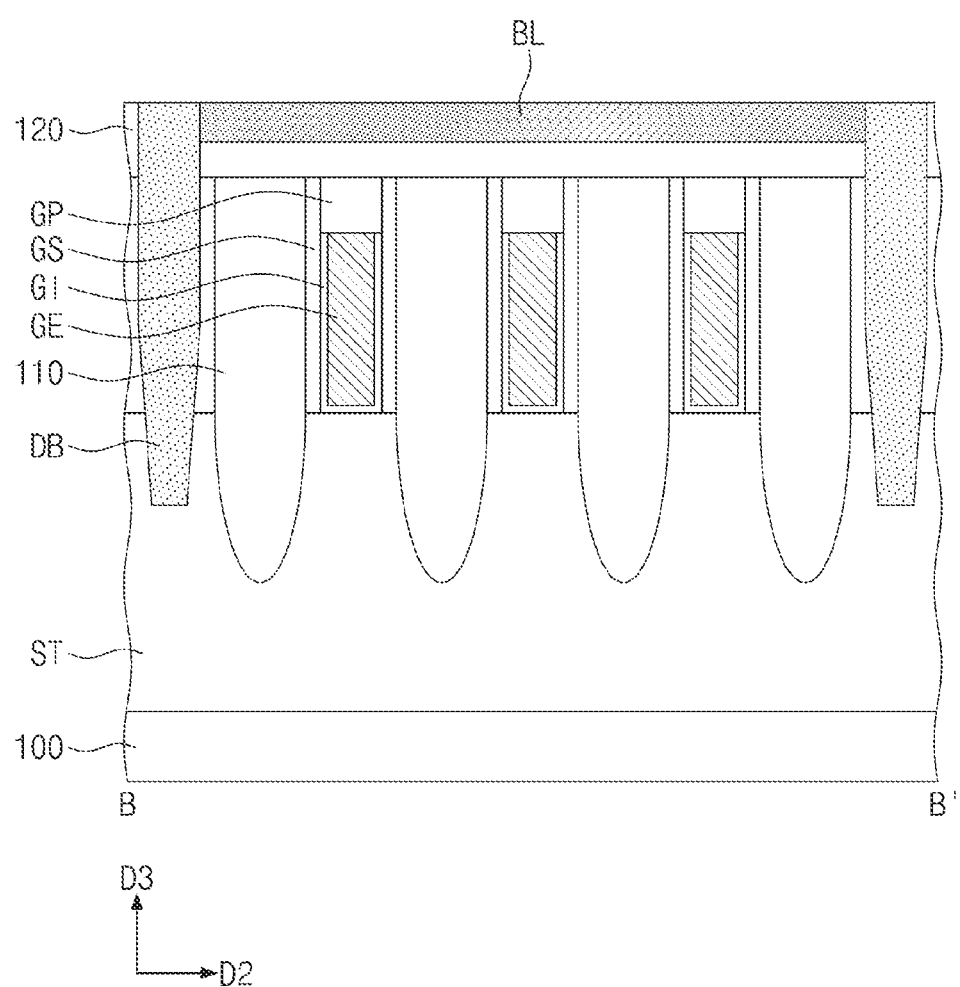
Figure 14C:
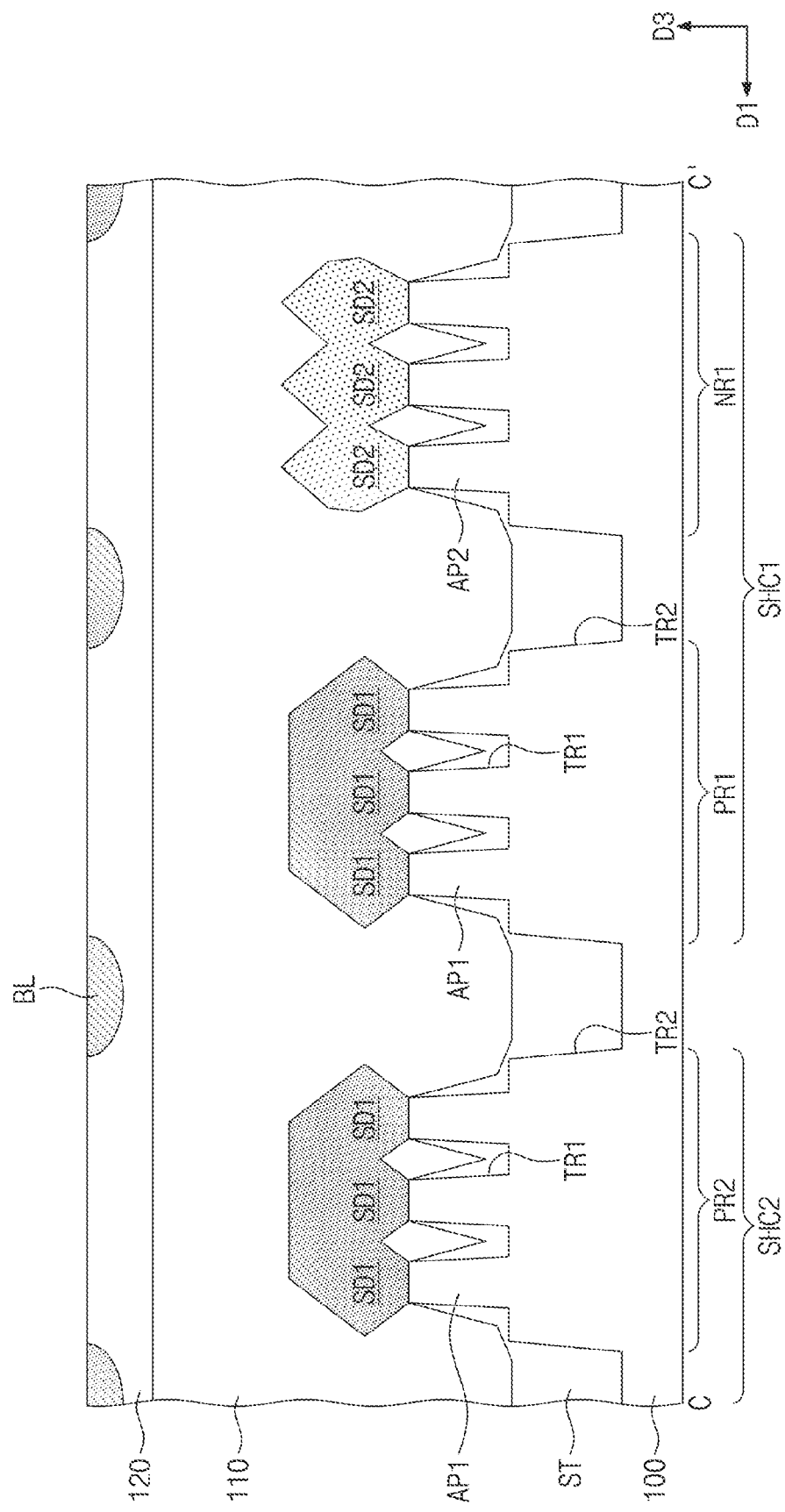
Figure 15:
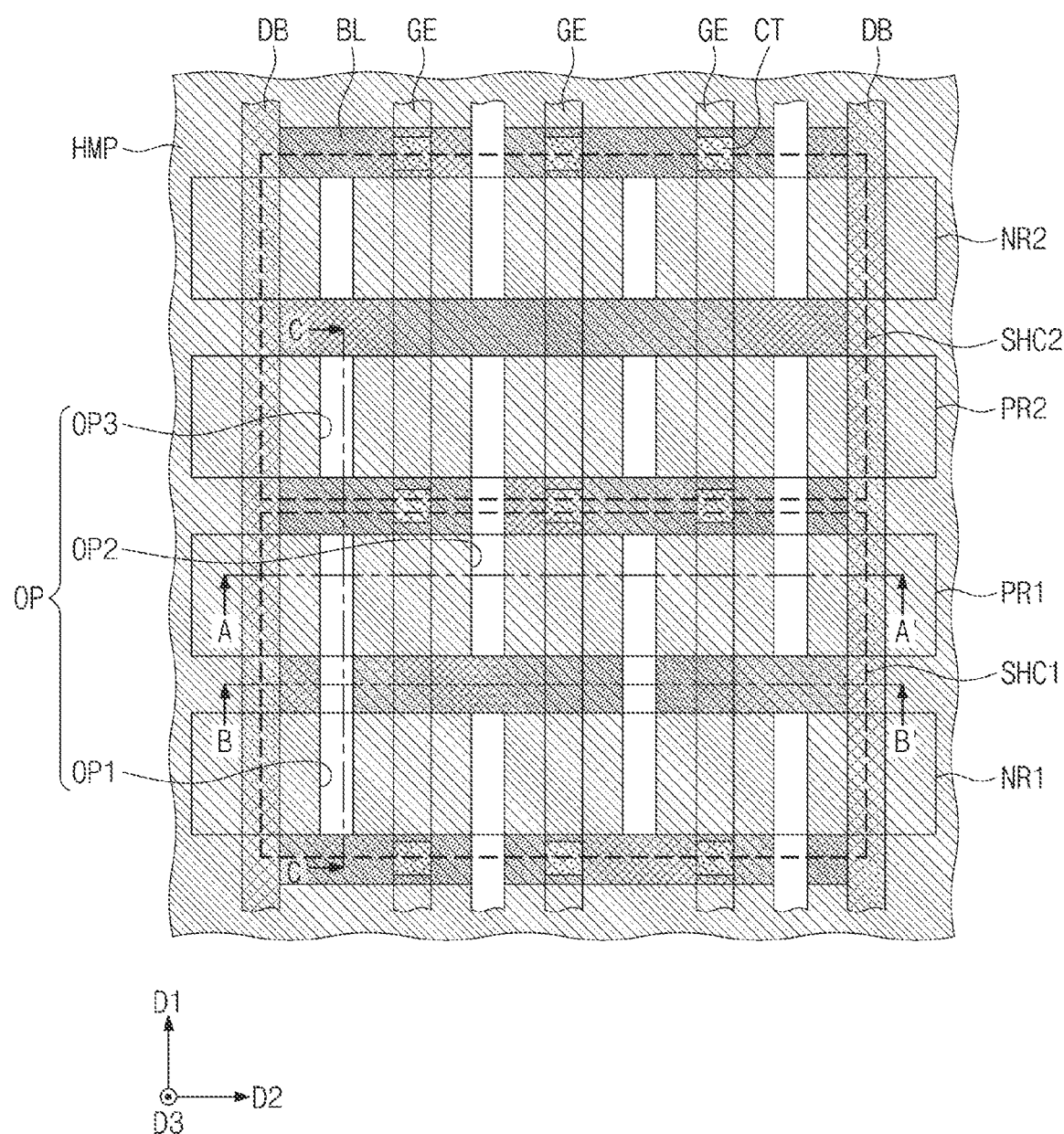

Since, as previously described with reference to FIG. 14C, the buffer layer BL is formed on the device isolation layer ST filling the second trench TR2, the top surface of the first interlayer insulating layer 110 between the first and second source/drain patterns SD1 and SD2 may be located at the second level LV2 higher than the first level LV1. Here, during the second etching process, an etch rate of the first and second interlayer insulating layers 110 and 120 may be greater (or higher) than an etch rate of the buffer layer BL. This difference in the etch rate may allow the top surface of the first interlayer insulating layer 110 between the first and second source/drain patterns SD1 and SD2 to be located at the second level LV2 higher than the first level LV1. As a result, the first active contact AC1 may be formed with a structure preventing or inhibiting parasitic capacitance, as previously described with reference to FIG. 6.

Referring again to FIGS. 4 and 5A to 5F, the active contacts AC may be formed by filling the openings OP with a conductive material. The upper insulating pattern UIP may be formed by replacement of an upper portion of each of the active contacts AC with an insulating material. The gate contacts GC may be formed to penetrate the second interlayer insulating layer 120 and the gate capping pattern GP and to be respectively connected to the gate electrodes GE.

The third interlayer insulating layer 130 may be formed on the second interlayer insulating layer 120. The first metal layer M1 may be formed in the third interlayer insulating layer 130. The formation of the first metal layer M1 may include forming the first power line M1_R1, the second power line M1_R2, the third power line M1_R3, and the first interconnection lines MU.

The fourth interlayer insulating layer 140 may be formed on the first metal layer M1. The second metal layer M2 may be formed in the fourth interlayer insulating layer 140. The formation of the second metal layer M2 may include forming the second interconnection lines M2_I. In some embodiments, the second interconnection lines M2_I may be formed using a dual damascene process.

Figure 17:
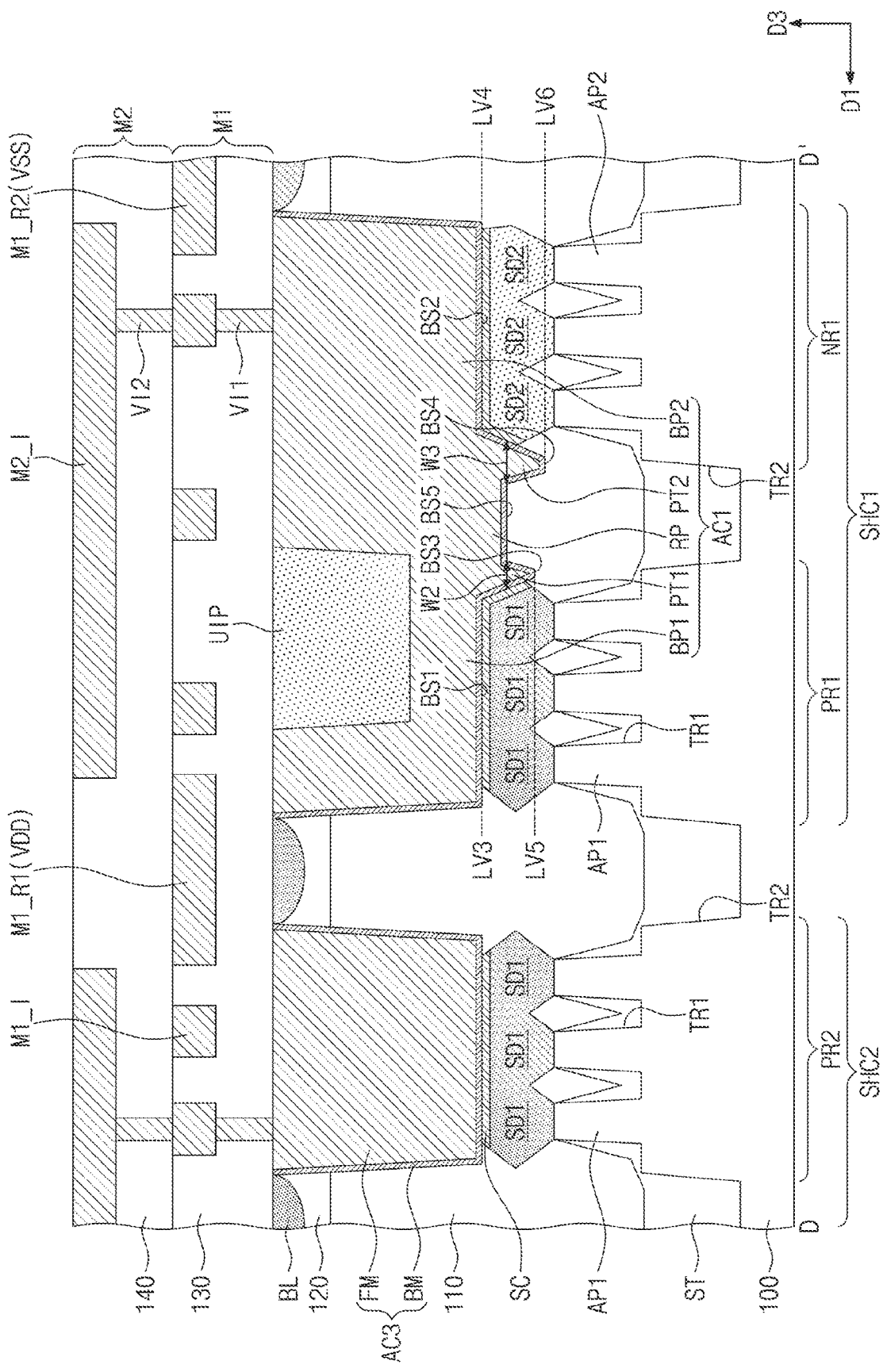
FIG. 17 is a cross-sectional view taken along a line D-D' of FIG. 4 and illustrates a semiconductor device according to embodiments of the inventive concept.

FIG. 17 is a cross-sectional view taken along the line D-D' of FIG. 4 and illustrates a semiconductor device according to embodiments of the inventive concept.

Thus, referring to FIGS. 4 and 17, the bottom surface BS1 of the first body portion BP1 of the first active contact AC1 may be located at a third level LV3. The bottom surface BS2 of the second body portion BP2 of the first active contact AC1 may be located at a fourth level LV4. The third level LV3 may be lower than the fourth level LV4. In other words, during the second etching process previously described with reference to FIGS. 15 and 16A to 16C, the first source/drain pattern SD1 may be more etched than the second source/drain pattern SD2. Thus, the bottom surface BS1 of the first body portion BP1 may be lower than the bottom surface BS2 of the second body portion BP2.

The greatest (or largest) width of the first protruding portion PT1 of the first active contact AC1 in the first direction D1 may be a second width W2, and the greatest (of largest) width of the second protruding portion PT2 of the first active contact AC1 in the first direction D1 may be a third width W3. Here, the third width W3 may be greater than the second width W2. The bottom surface BS3 of the first protruding portion PT1 may be located at a fifth level LV5. The bottom surface BS4 of the second protruding portion PT2 may be located at a sixth level LV6. The sixth level LV6 may be lower than the fifth level LV5.

Figure 18:
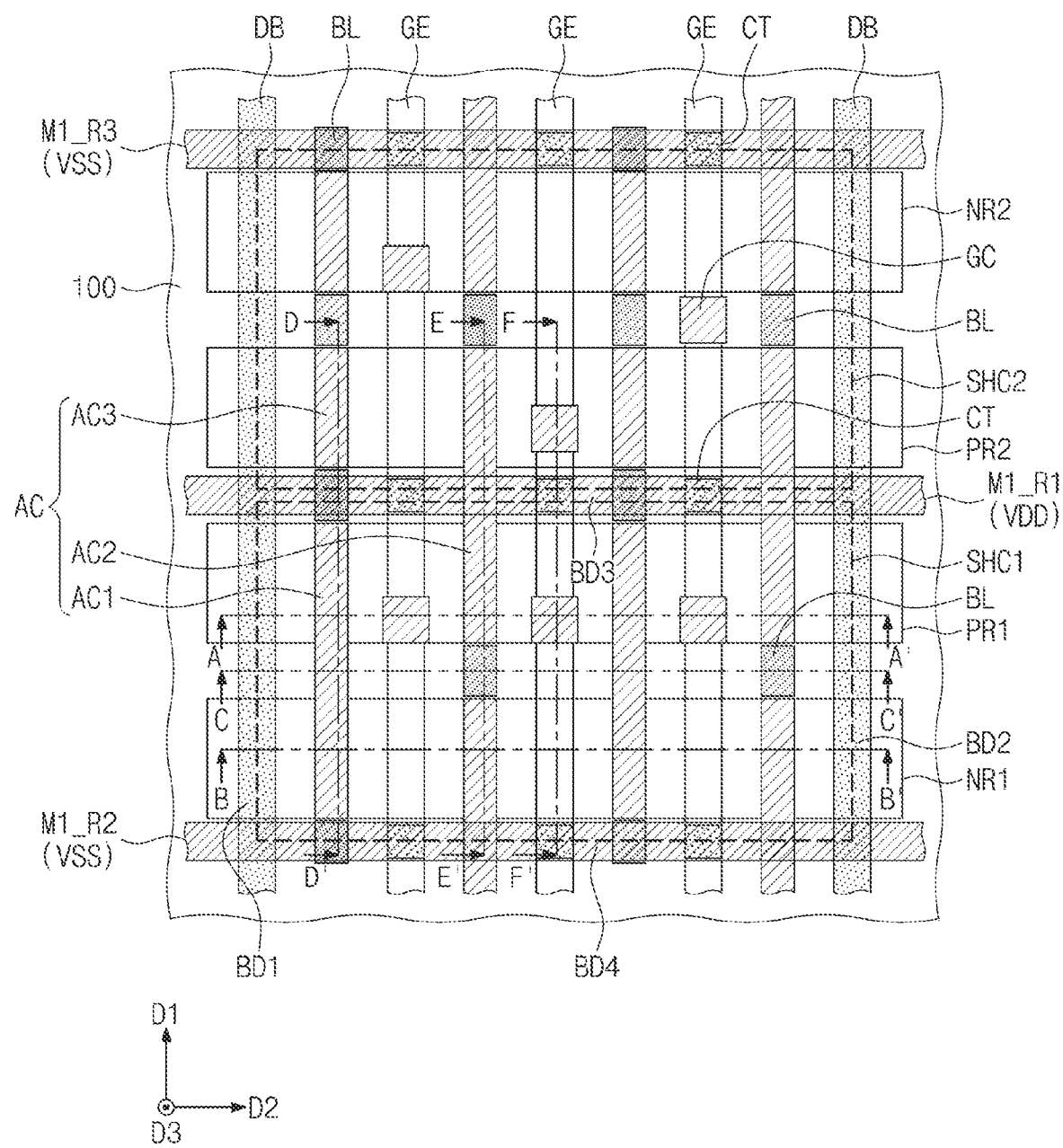
FIG. 18 is a plan view illustrating a semiconductor device according to embodiments of the inventive concept.
Figure 19A:
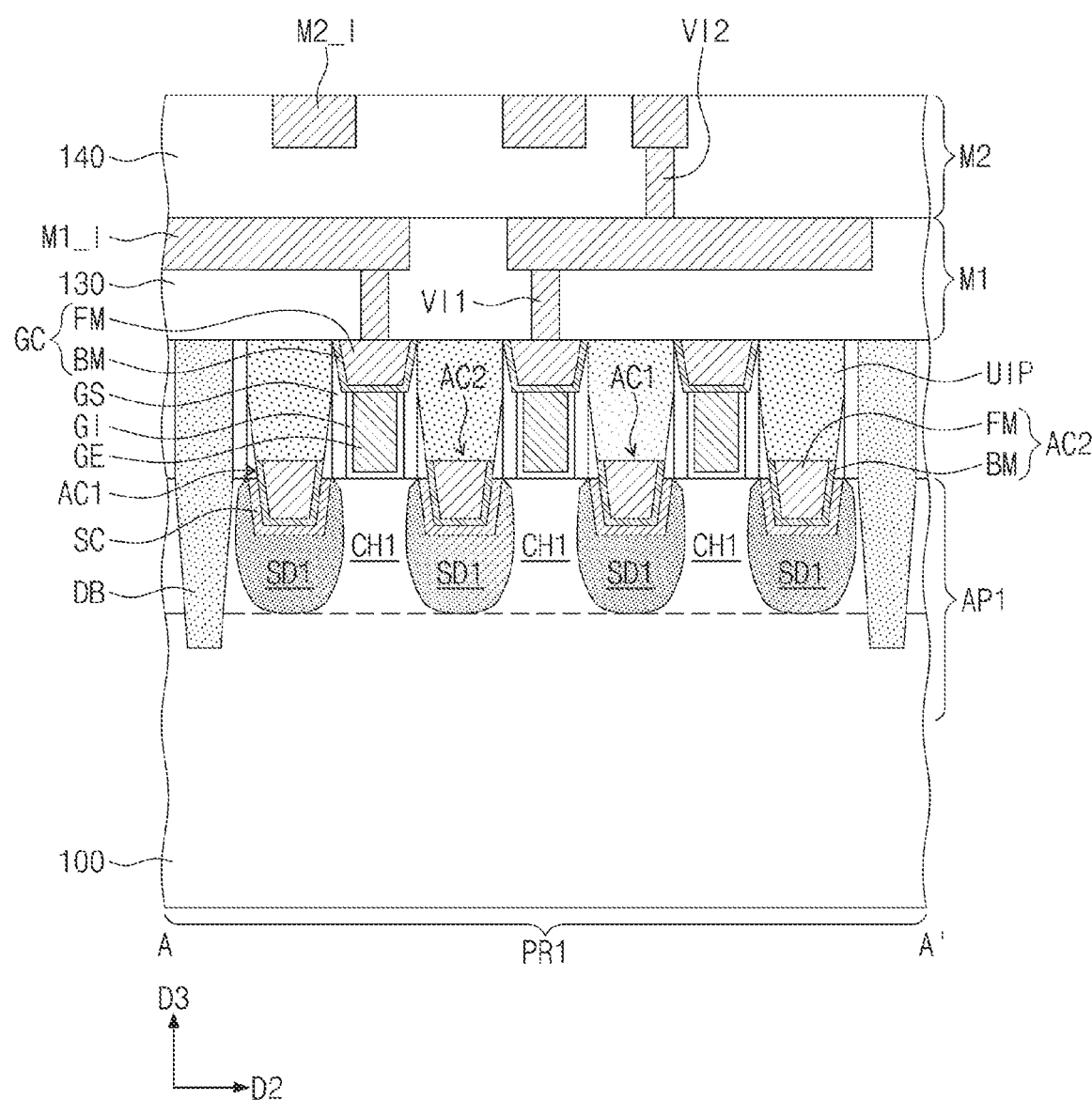
FIGS. 19A, 19B, 19C, 19D, 19E and 19F are respective cross-sectional views taken along lines A-A, B-B', C-C', D-D', E-E', and F-F' of FIG. 18.
Figure 19B:
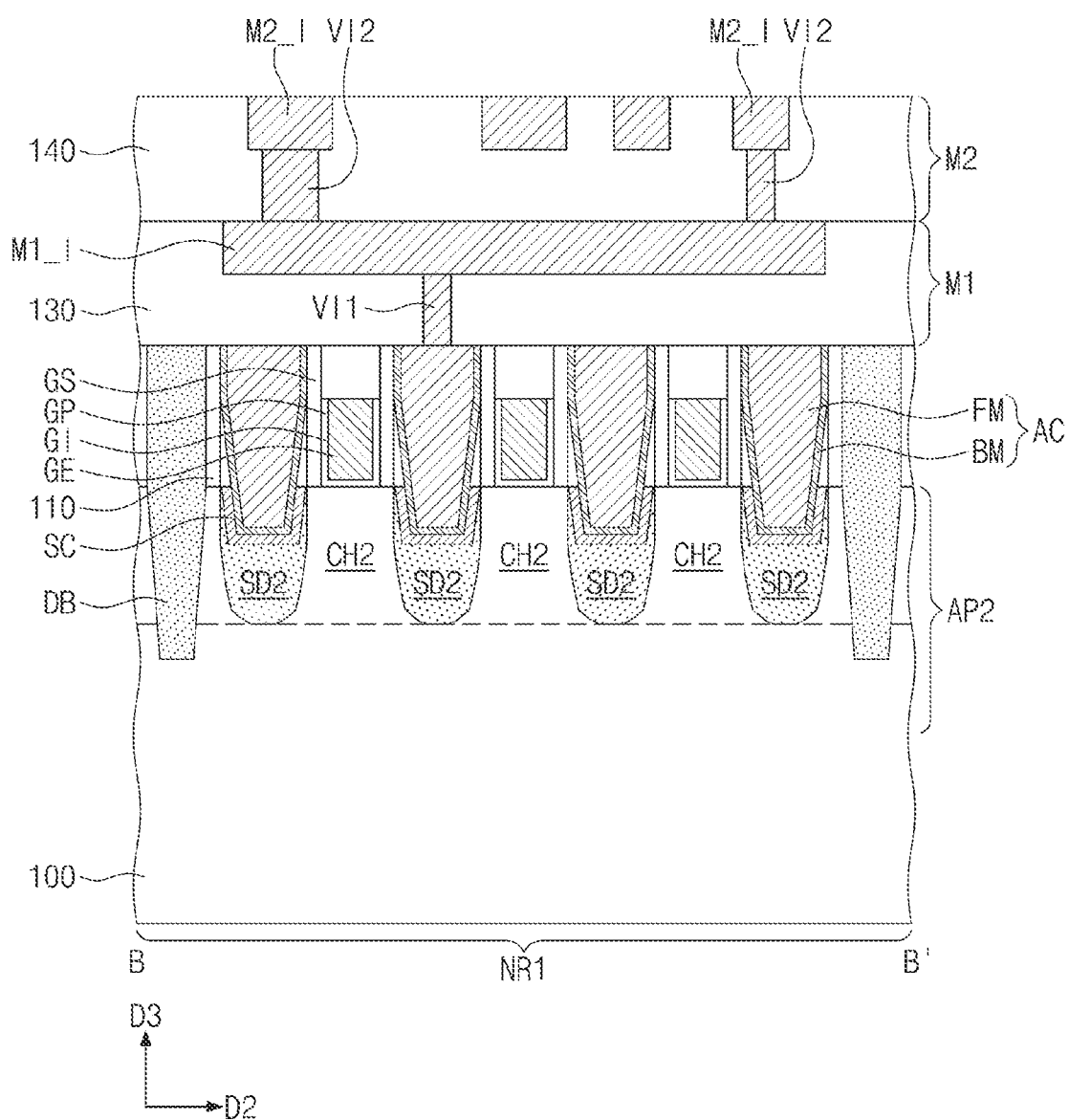
Figure 19C:
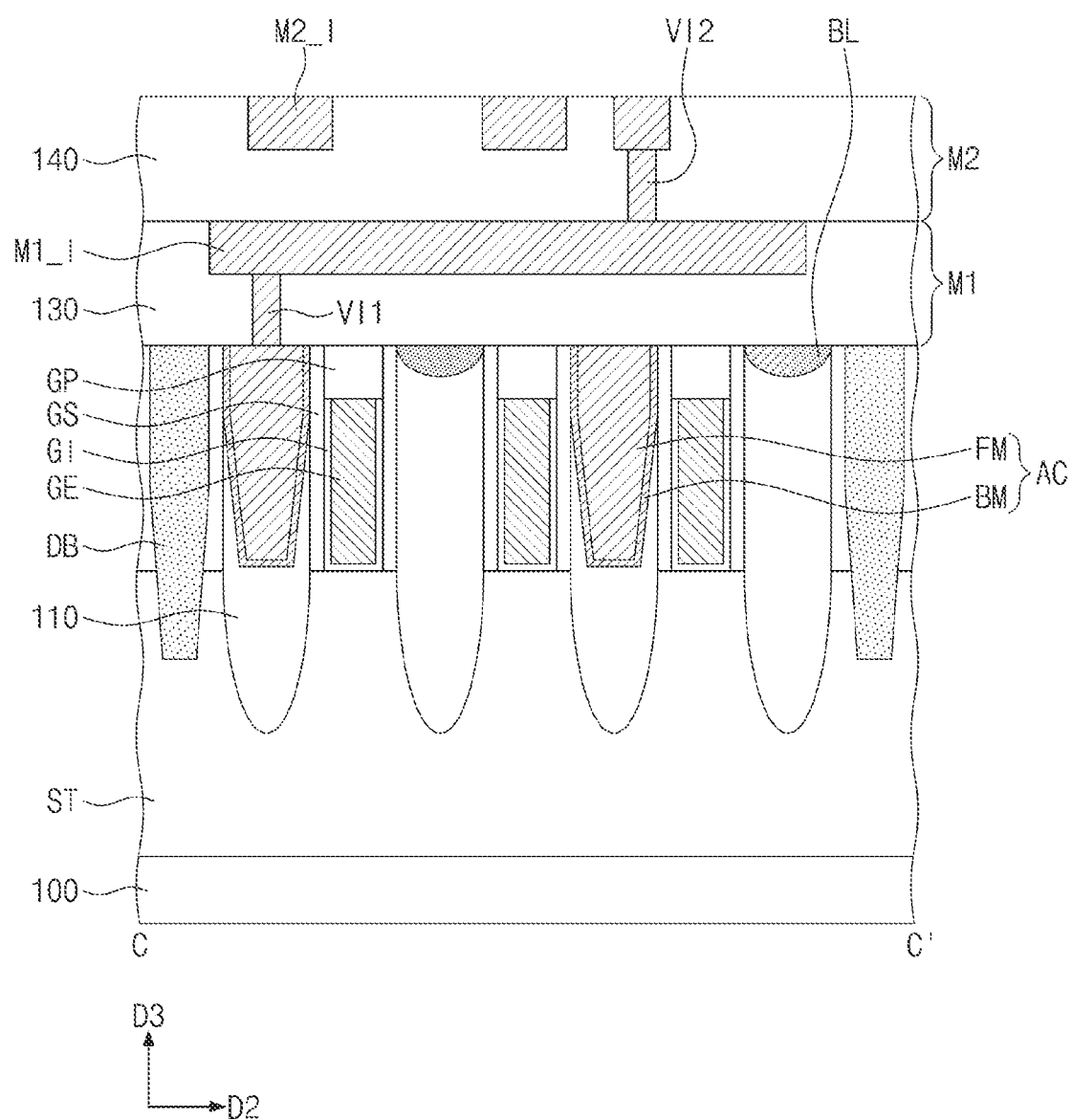
Figure 19D:
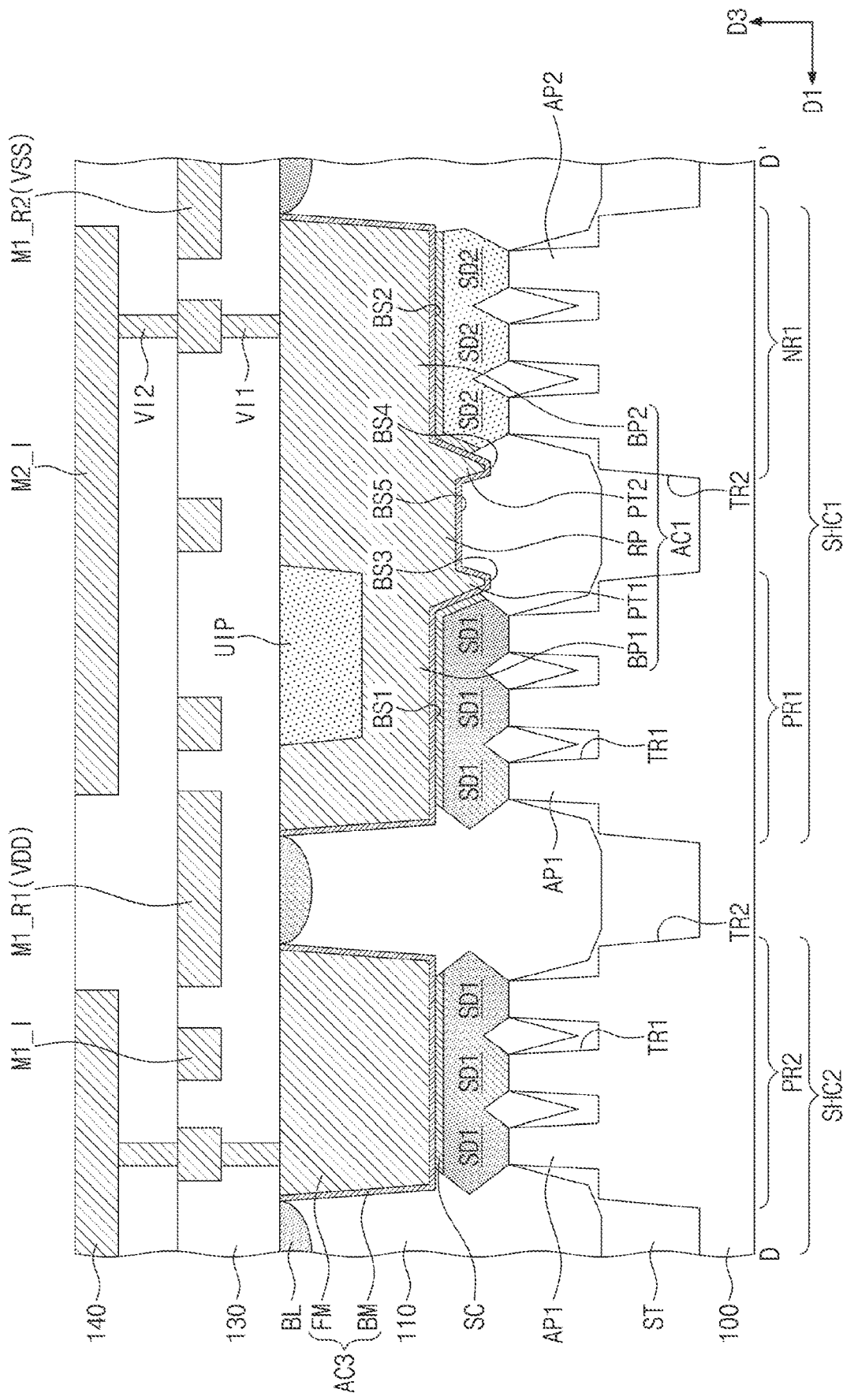
Figure 19E:
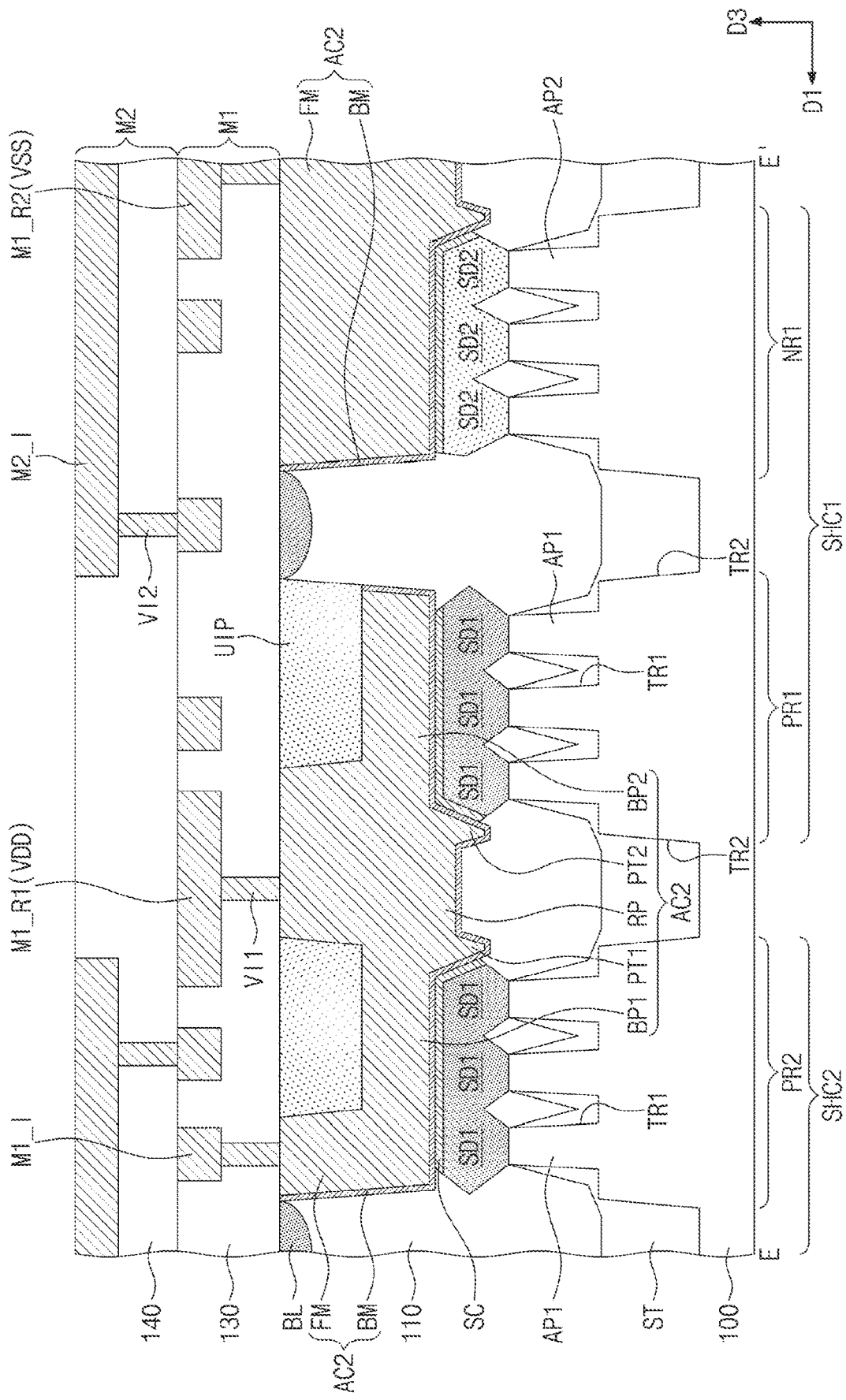
Figure 19F:
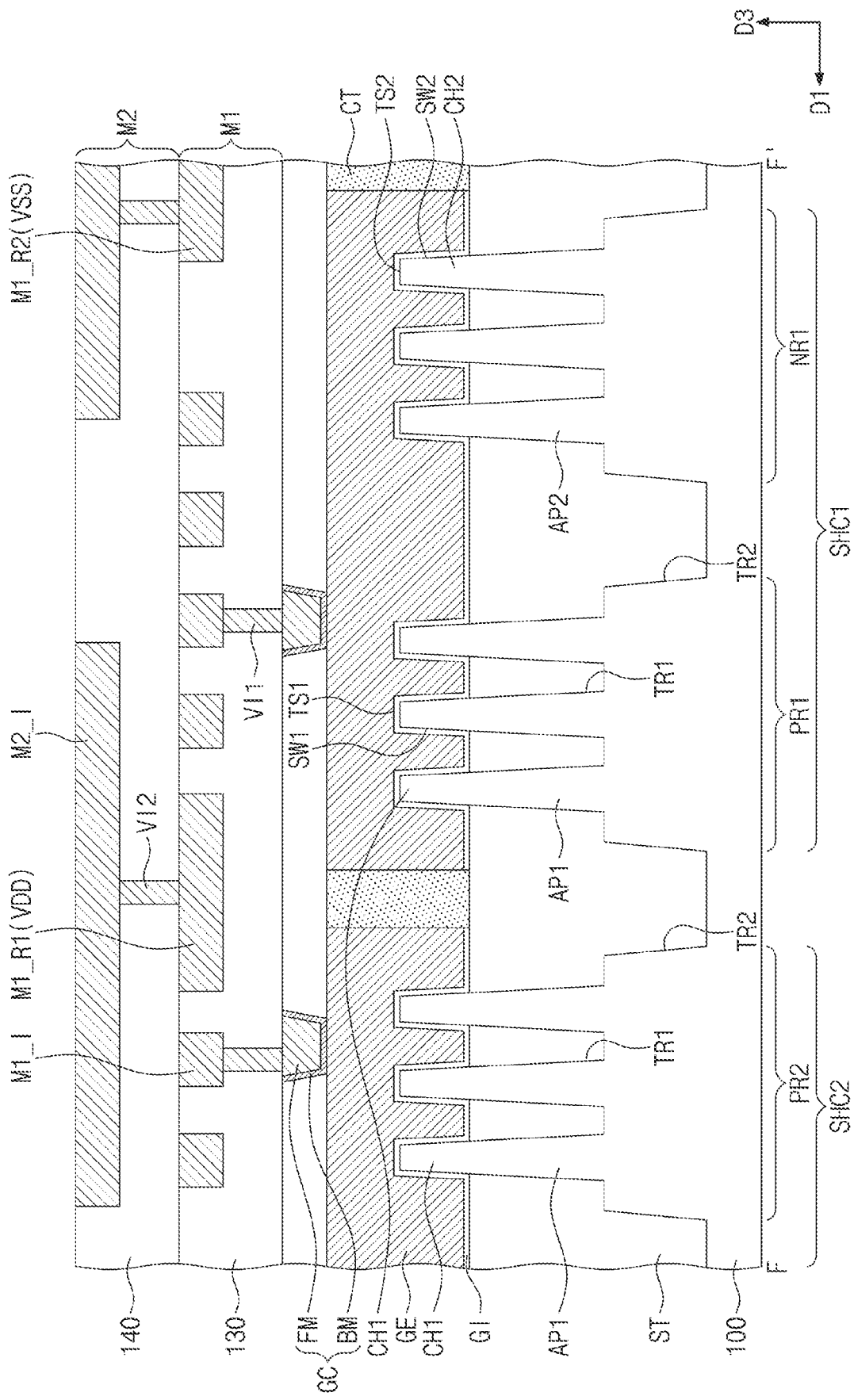
Figure 20:
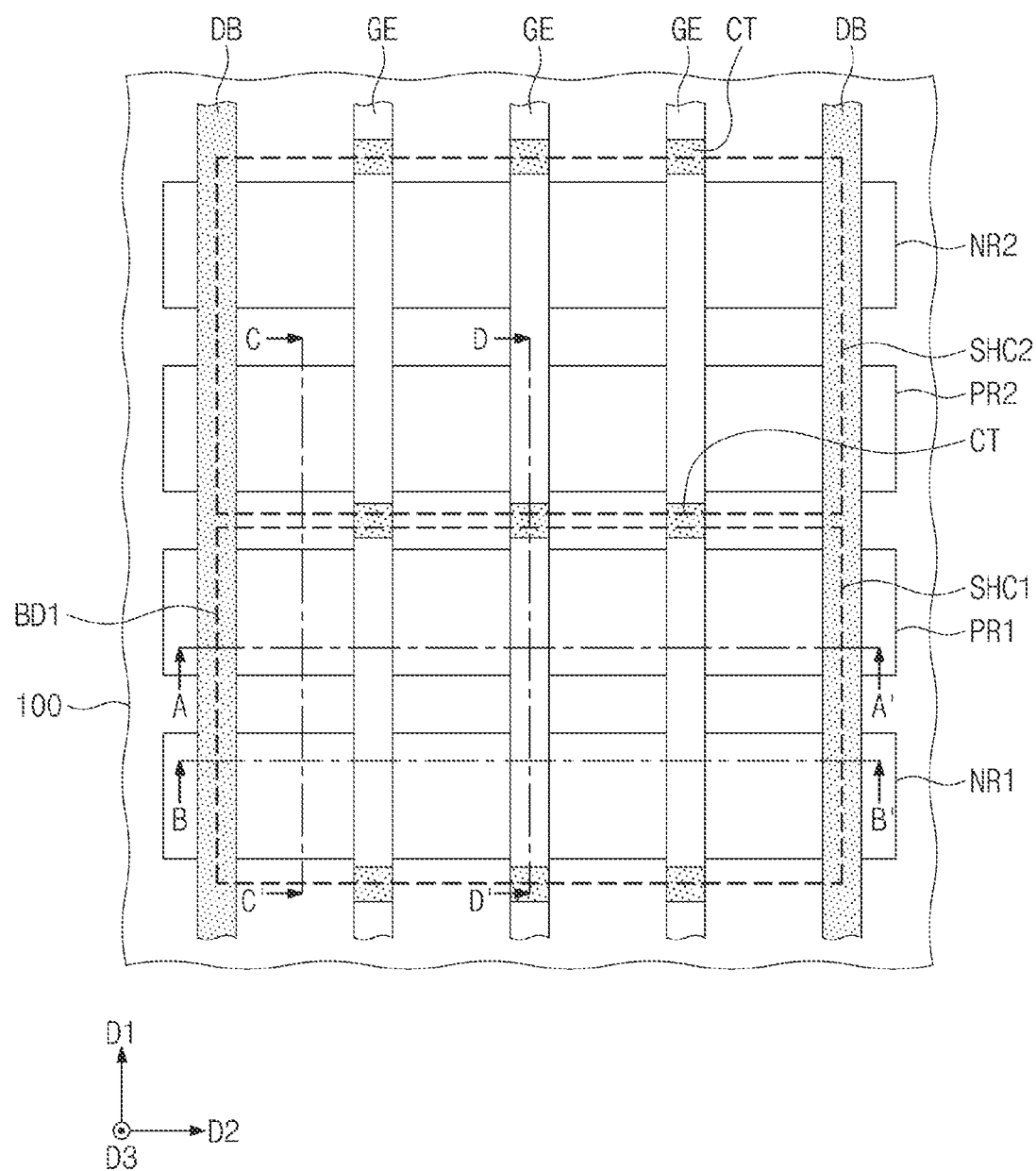
FIGS. 20, 22, 24, and 26 are plan views illustrating in one example a method of fabricating a semiconductor device, according to embodiments of the inventive concept.

FIG. 18 is a plan view illustrating a semiconductor device according to embodiments of the inventive concept. FIGS. 19A, 19B, 19C, 19D, 19E and 19F (collectively, "FIGS. 19A to 19F") are respective cross-sectional views taken along lines A-A', B-B', C-C', D-D', E-E', and F-F' of FIG. 18.

The first interlayer insulating layer 110 may be provided on the substrate 100. The first interlayer insulating layer 110 may cover the gate spacers GS and the first and second source/drain patterns SD1 and SD2. A top surface of the first interlayer insulating layer 110 may be substantially coplanar with the top surfaces of the gate capping patterns GP and the top surfaces of the gate spacers GS. The third interlayer insulating layer 130 may be provided on the first interlayer insulating layer 110 to cover the gate capping patterns GP. The fourth interlayer insulating layer 140 may be provided on the third interlayer insulating layer 130. In an embodiment, the first, third and fourth interlayer insulating layers 110, 130, and 140 may be formed of (or include) silicon oxide. The second interlayer insulating layer 120 described with reference to FIGS. 4 and 5A to 5F may be omitted here.

The division structure DB may be provided to penetrate the first interlayer insulating layer 110 and may extend into the first and second active patterns AP1 and AP2.

The active contacts AC may be provided to penetrate the first interlayer insulating layer 110 and may be electrically connected to the first and second source/drain patterns SD1 and SD2, respectively. The active contacts AC may include the first active contact AC1, the second active contact AC2, and the third active contact AC3. The first active contact AC1 on the first single height cell SHC1 may electrically connect the first source/drain pattern SD1 of the first PMOSFET region PR1 to the second source/drain pattern SD2 of the first NMOSFET region NR1. The first active contact AC1 may extend from the second source/drain pattern SD2 of the first NMOSFET region NR1 to the first source/drain pattern SD1 of the first PMOSFET region PR1 in the first direction D1.

The second active contact AC2 may cross a boundary between adjacent cells. For example, the second active contact AC2 may electrically connect the first source/drain pattern SD1 of the first PMOSFET region PR1 to the first source/drain pattern SD1 of the second PMOSFET region PR2. The second active contact AC2 may extend from the first source/drain pattern SD1 of the first PMOSFET region PR1 to the first source/drain pattern SD1 of the second PMOSFET region PR2 in the first direction D1.

The third active contact AC3 on the second single height cell SHC2 may be locally provided on only the first source/drain pattern SD1 of the second PMOSFET region PR2 or the second source/drain pattern SD2 of the second NMOSFET region NR2.

Referring to FIGS. 18 and 19A to 19F, the buffer layers BL may be provided in an upper region of the first interlayer insulating layer 110. The buffer layers BL may be provided on the device isolation layer ST and between adjacent ones of the active regions. The buffer layers BL may not extend in the second direction D2, but may be locally provided between the active contacts AC adjacent to each other in the first direction D1. The buffer layer BL may be interposed between the first active contact AC1 and the third active contact AC3. The buffer layer BL may be interposed between adjacent ones of the second active contacts AC2. The buffer layers BL may be adjacent to the active contacts AC in the first direction D1.

The buffer layer BL may be provided in the upper region of the first interlayer insulating layer 110 to be adjacent to the gate spacer GS. The buffer layer BL may be interposed between adjacent ones of the gate spacers GS.

The buffer layer BL may be formed of (or include) material(s) such as SiN, SiON, SiCN and/or SiOC having an etch selectivity with respect to the first interlayer insulating layer 110. That is, during a process of etching the first interlayer insulating layer 110, an etch rate of the buffer layer BL may be lower than an etch rate of the first interlayer insulating layer 110. Each of the first and second active contacts AC1 and AC2 may be provided to penetrate the buffer layer BL. The first active contact AC1 may be provided to penetrate the buffer layer BL between the first PMOSFET region PR1 and the first NMOSFET region NR1. The second active contact AC2 may be provided to penetrate the buffer layer BL between the first PMOSFET region PR1 and the second PMOSFET region PR2. By adjusting the thickness and composition of the buffer layer BL, the first and second active contacts AC1 and AC2 may be formed to have a desired depth.

A width of the buffer layer BL in the first direction D1 may gradually decrease with decreasing distance from the substrate 100. For example, the buffer layer BL may be formed to have a rounded bottom surface. The bottom surfaces of the buffer layers BL may be located at a higher level than the bottom surfaces of the active contacts AC1, AC2, AC3.

Figure 21A:
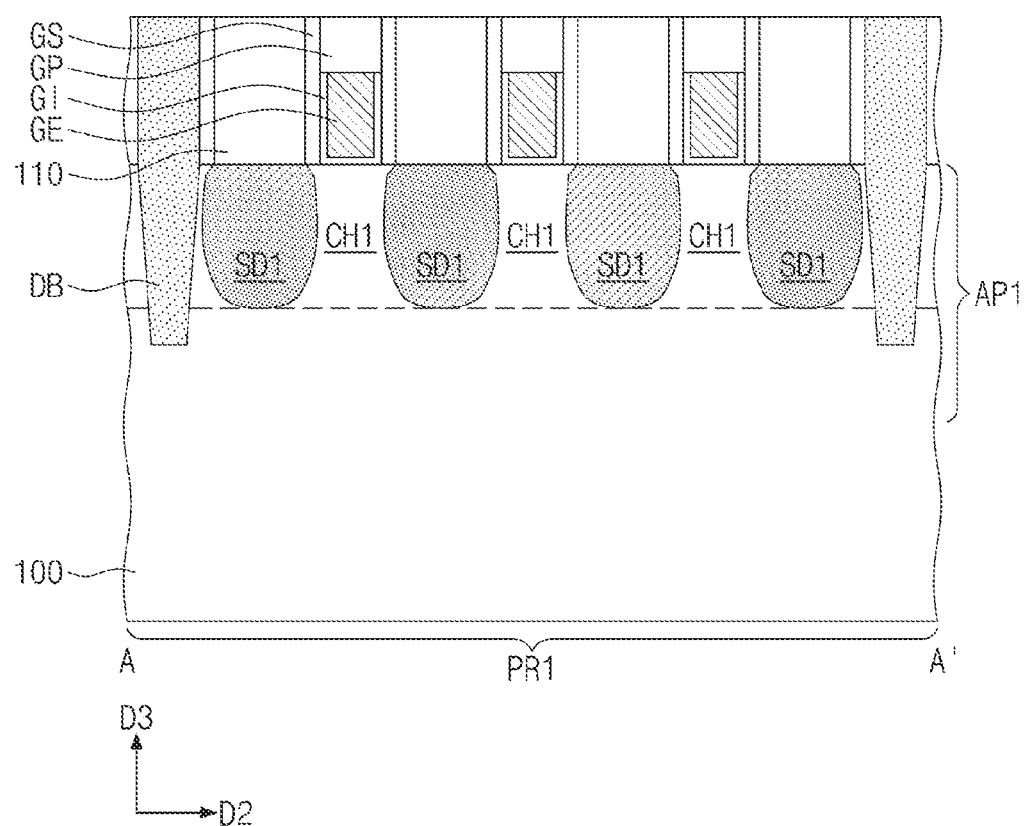
FIGS. 21A, 23A, 25A, and 27A are respective cross-sectional views taken along lines A-A' of FIGS. 20, 22, 24, and 26.
Figure 21B:
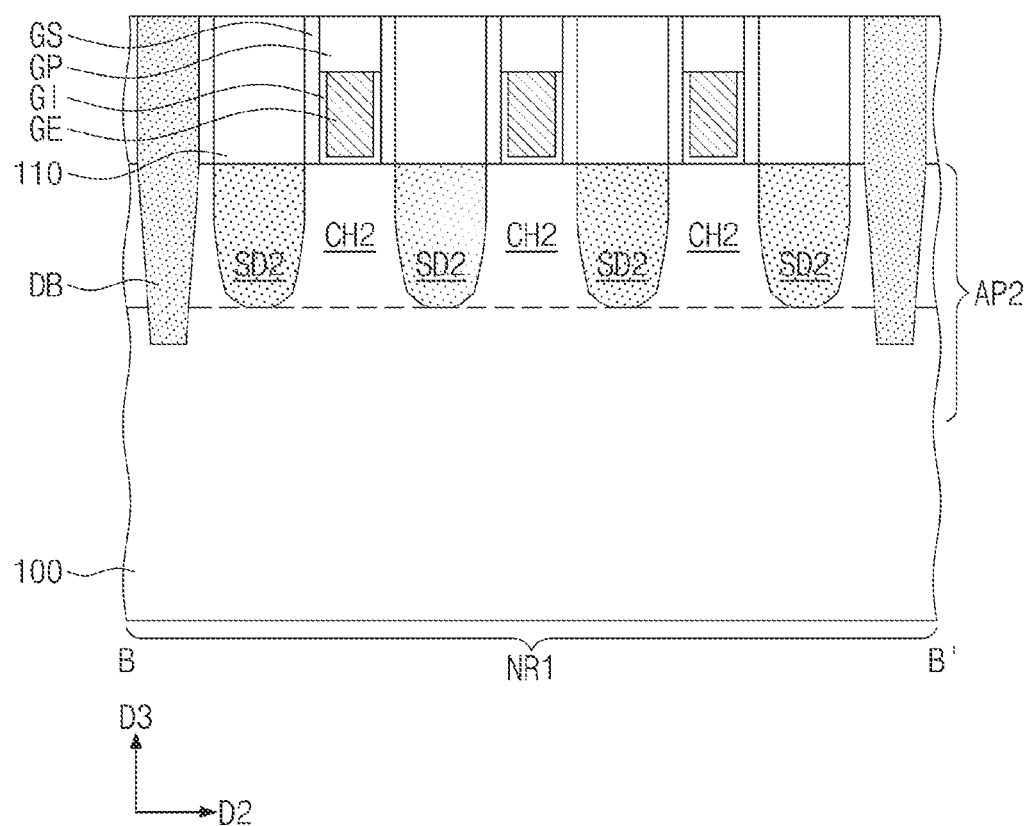
FIGS. 21B, 23B, 25B, and 27B are respective cross-sectional views taken along lines B-B' of FIGS. 20, 22, 24, and 26.
Figure 21C:
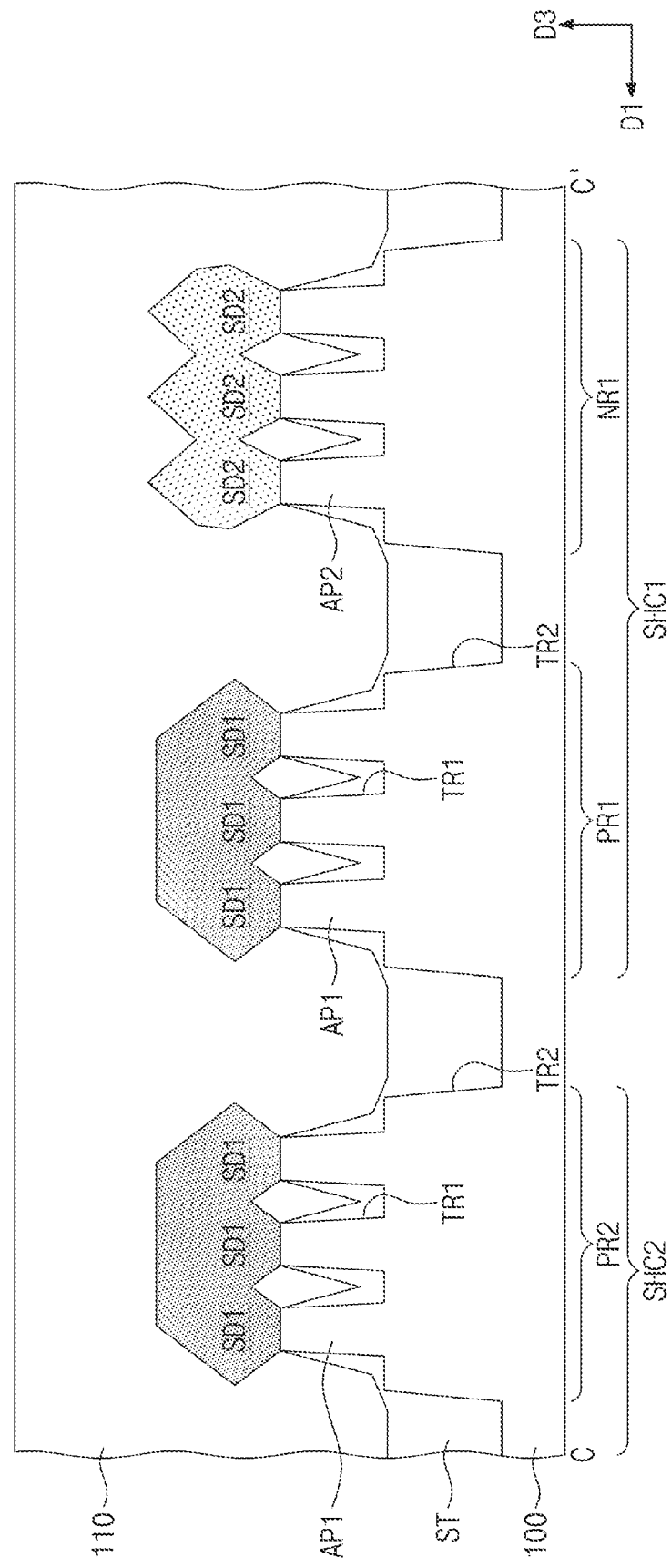
FIGS. 21C, 23C, 25C, 27C are respective cross-sectional views taken along lines C-C' of FIGS. 20, 22, 24, and 26.
Figure 21D:
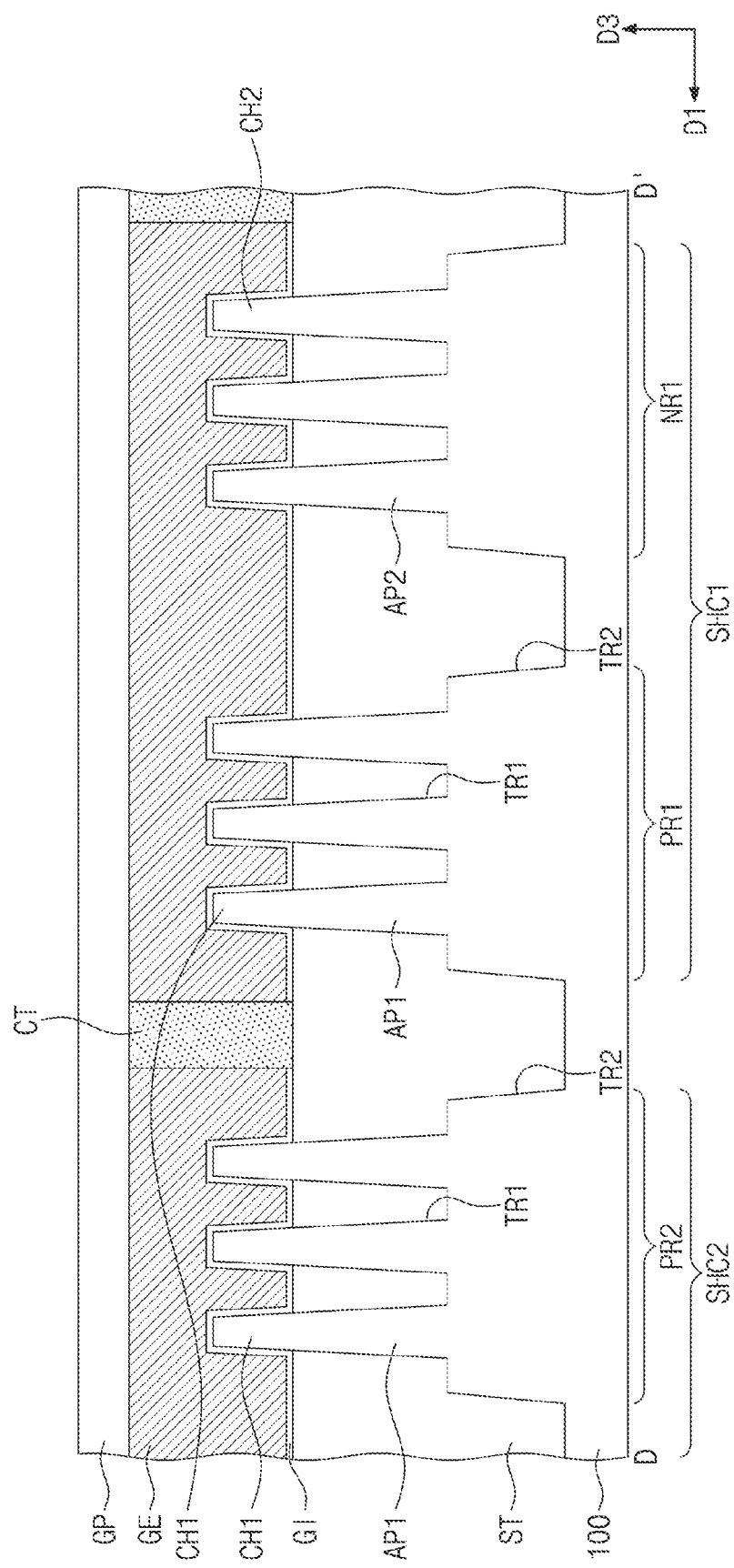
FIG. 21D is a cross-sectional view taken along a line D-D' of FIG. 20.
Figure 22:
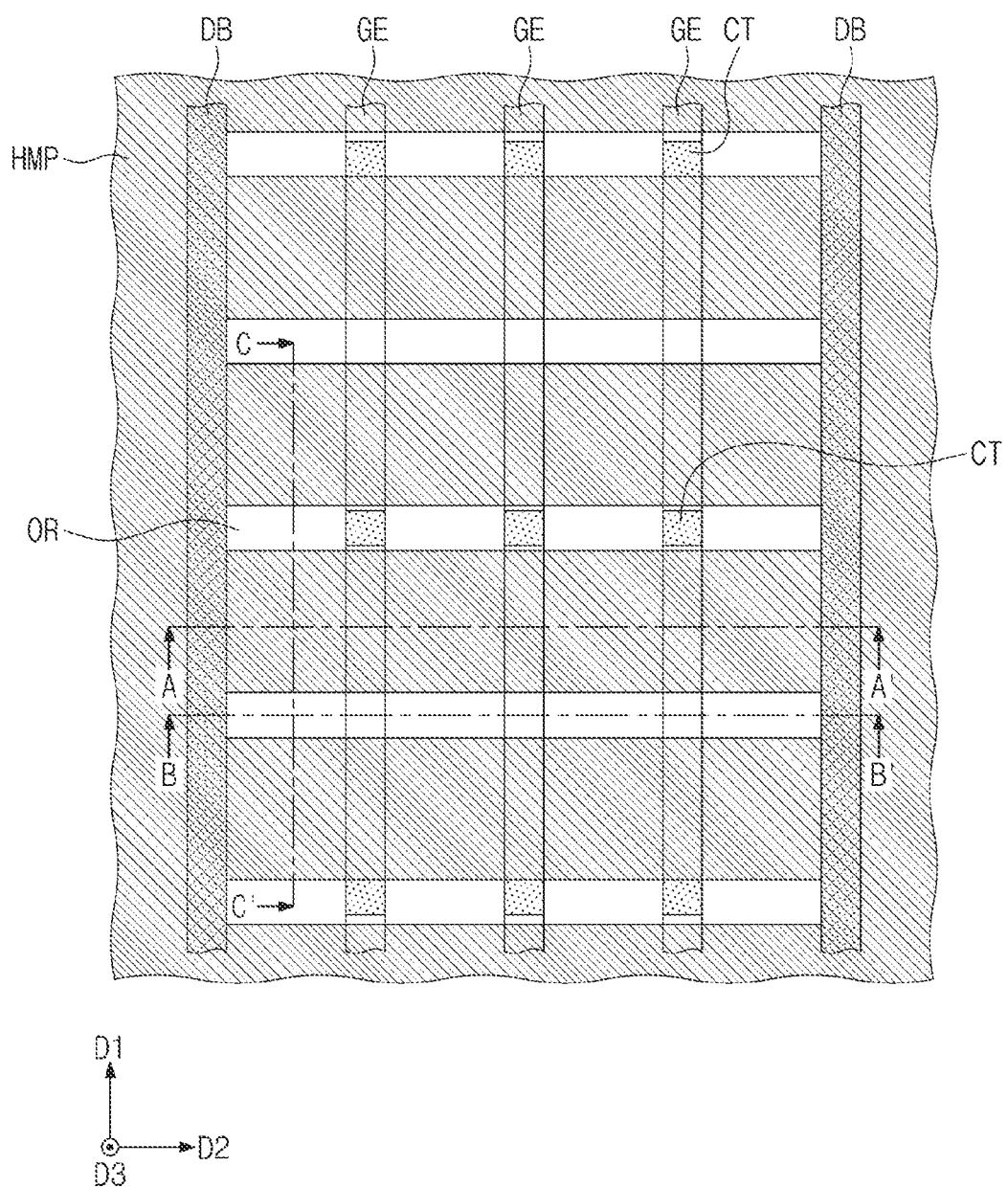
Figure 23A:
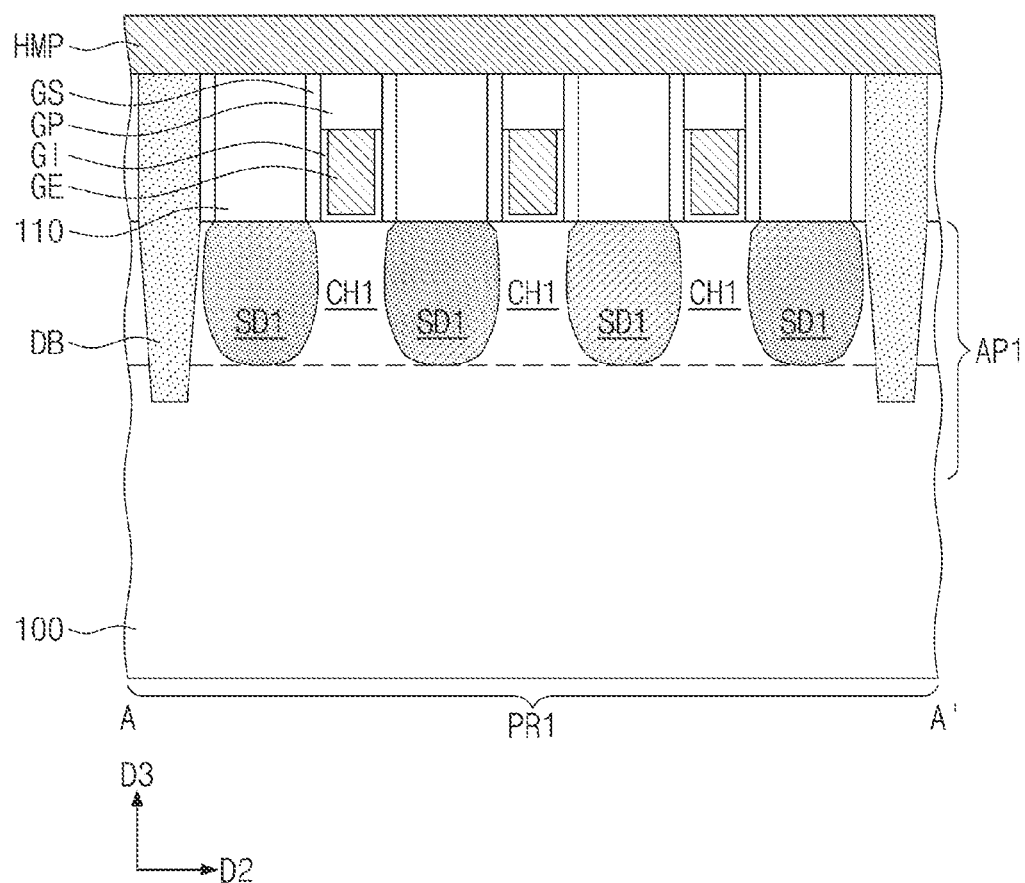
Figure 23B:
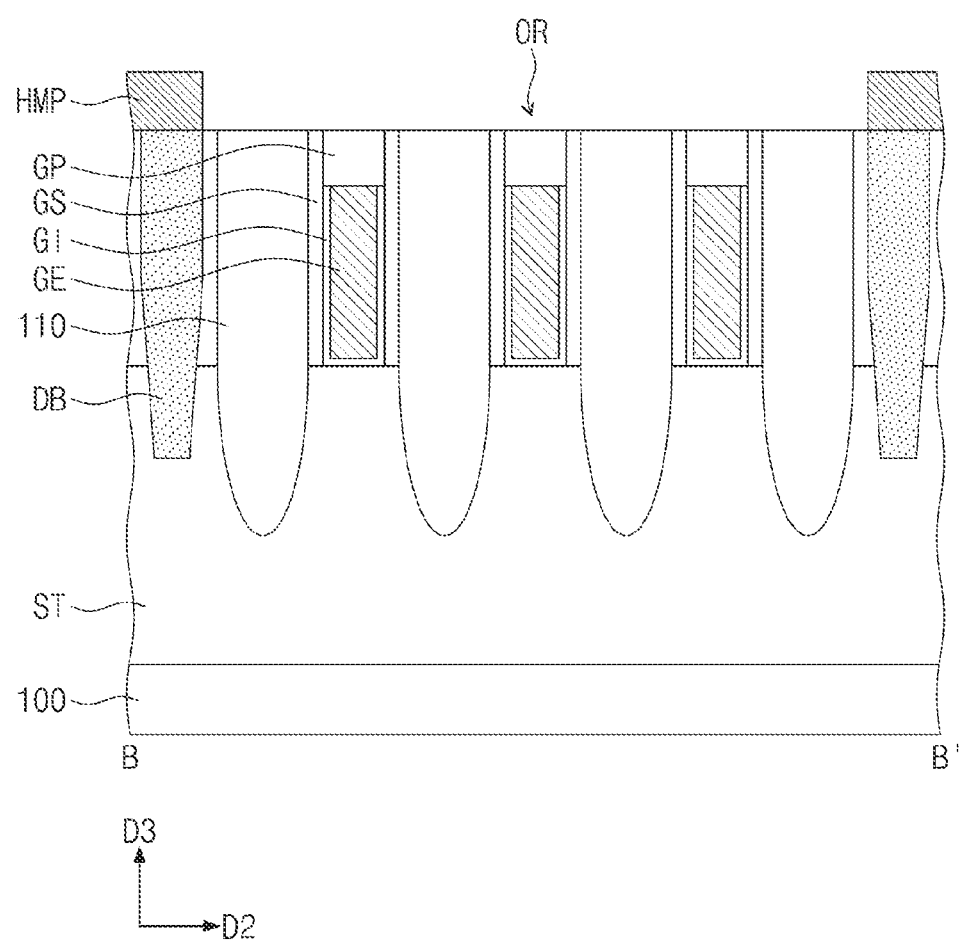
Figure 23C:
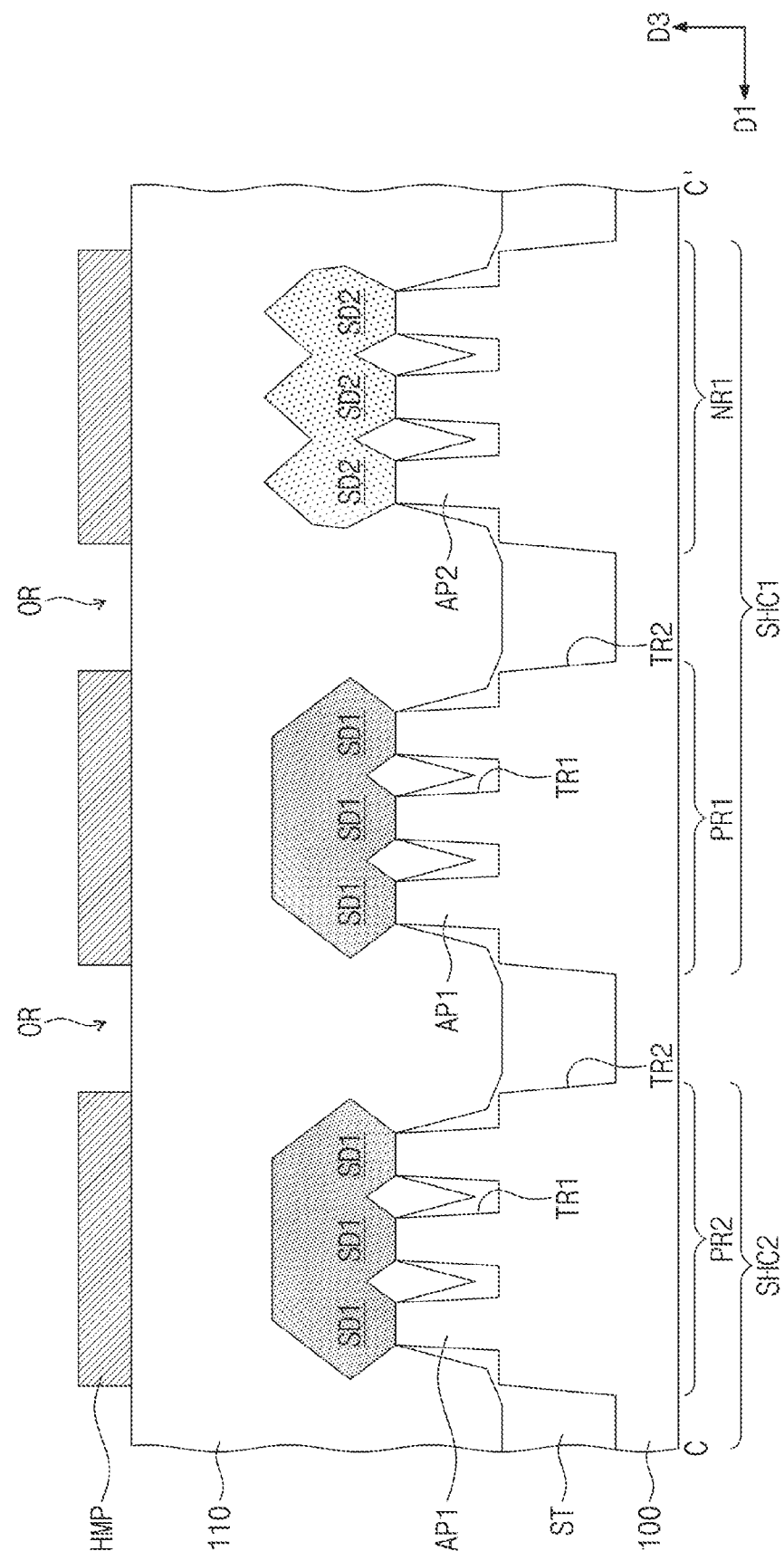
Figure 24:
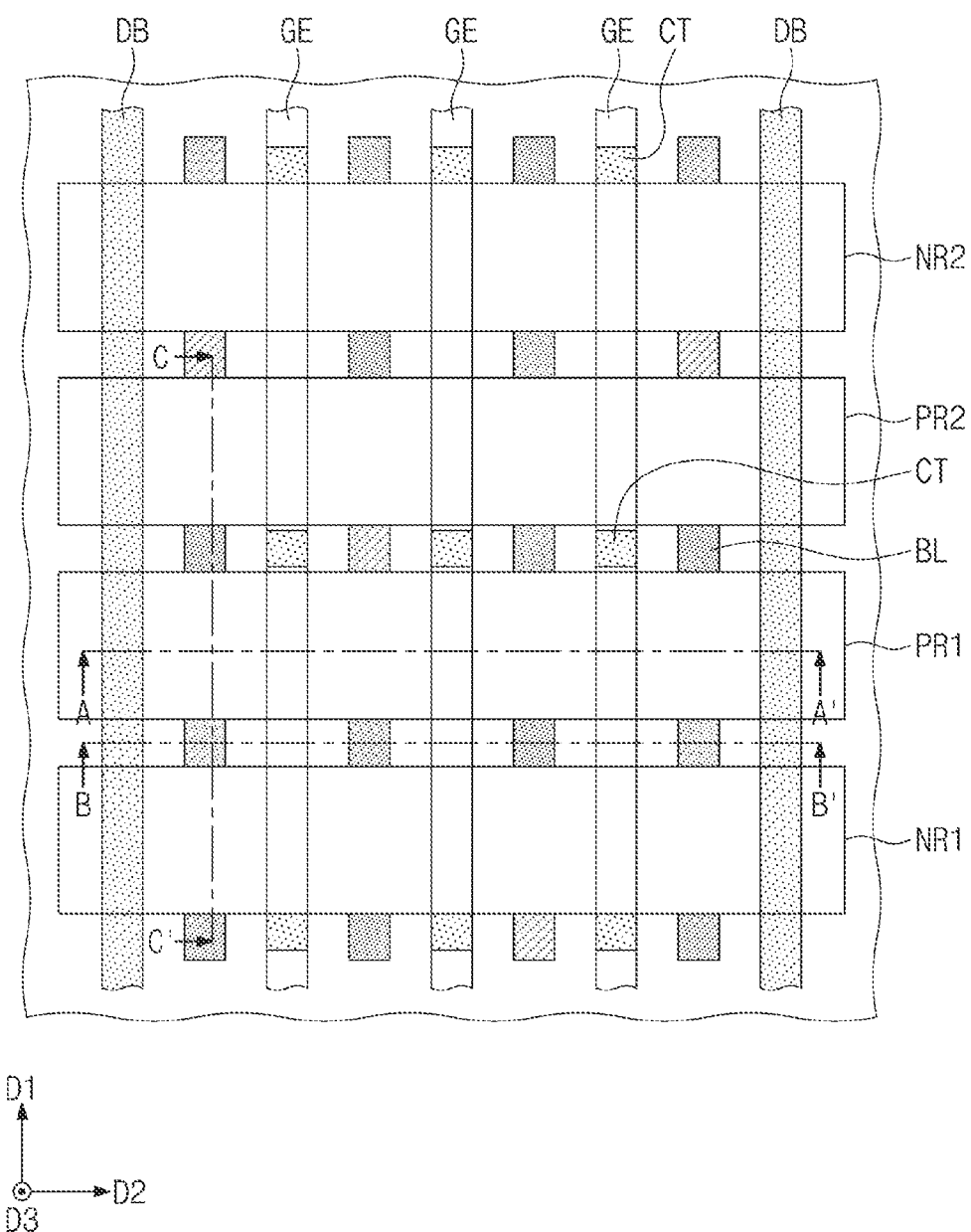

FIGS. 20, 22, 24, and 26 are plan views illustrating a method of fabricating a semiconductor device according to embodiments of the inventive concept; FIGS. 21A, 23A, 25A, and 27A are respective cross-sectional views taken along lines A-A' of FIGS. 20, 22, 24, and 26; FIGS. 21B, 23B, 25B, and 27B are respective cross-sectional views taken along lines B-B' of FIGS. 20, 22, 24, and 26; FIGS. 21C, 23C, 25C, and 27C are respective cross-sectional views taken along lines C-C' of FIGS. 20, 22, 24, and 26; and FIG. 21D is a cross-sectional view taken along line D-D' of FIG. 20.

Referring to FIGS. 20, 21A, 21B, 21C and 21D, following the process(es) described with reference to FIGS. 7 and 8A, 8B, 8C and 8D, the first interlayer insulating layer 110 may be formed to cover the first and second source/drain patterns SD1 and SD2, the mask patterns MA, and the gate spacers GS.

The first interlayer insulating layer 110 may be planarized to expose top surfaces of the sacrificial patterns PP. The planarization of the first interlayer insulating layer 110 may be performed using an etch-back or chemical-mechanical polishing (CMP) process. All of the mask patterns MA may be removed during the planarization process. As a result, the first interlayer insulating layer 110 may be formed to have a top surface that is coplanar with the top surfaces of the sacrificial patterns PP and the top surfaces of the gate spacers GS.

The sacrificial patterns PP may be replaced with the gate electrodes GE, respectively. Here, the sacrificial patterns PP exposed may be selectively removed. Empty spaces may be formed as a result of the removal of the sacrificial patterns PP. The gate dielectric pattern GI, the gate electrode GE, and the gate capping pattern GP may be formed in each of the empty spaces.

During replacement of the sacrificial pattern PP with the gate electrode GE, the gate cutting patterns CT may be formed on the gate electrode GE. The gate cutting patterns CT may be formed to divide each gate electrode GE into a plurality of gate electrodes GE.

A pair of the division structures DB may be respectively formed at both sides of the first single height cell SHC1. For example, the formation of the division structures DB may include forming a hole, which is extended into the first and second active patterns AP1 and AP2 through the first interlayer insulating layer 110 and the gate electrode GE, and then filling the hole with an insulating layer.

Referring to FIGS. 22, 23A, 23B and 23C, the hard mask pattern HMP may be formed on the first interlayer insulating layer 110. A photolithography process may be performed to form a plurality of opening regions OR in the hard mask pattern HMP. The hard mask pattern HMP may include a carbon-containing layer (e.g., a SOH layer). The opening regions OR may be formed on the device isolation layer ST between adjacent ones of the active regions.

Referring to FIGS. 24, 25A, 25B and 25C, a first etching process may be performed on the first interlayer insulating layer 110. An upper portion of the first interlayer insulating layer 110 exposed by the opening region OR may be partially etched using the hard mask pattern HMP, the gate capping patterns GP, and the gate spacers GS as an etch mask.

The buffer layers BL may be formed by filling regions, from which the first interlayer insulating layer 110 is etched, with a material having an etch selectivity with respect to the first interlayer insulating layer 110. Here, the formation of the buffer layers BL may include forming the buffer layers BL by filling regions, from which the first interlayer insulating layer 110 is etched, with a material having an etch selectivity with respect to the first interlayer insulating layer 110 and then planarizing the buffer layers BL using a CMP process. As a result, the buffer layers BL may have top surfaces that are substantially coplanar with the top surface of the first interlayer insulating layer 110.

The buffer layer BL may be provided in an upper region of the first interlayer insulating layer 110, thereby being adjacent to the gate spacer GS. The buffer layer BL may be interposed between adjacent ones of the gate spacers GS. A width of the buffer layer BL in the first direction D1 may gradually decrease with decreasing distance from the substrate 100. For example, the buffer layer BL may be formed to have a rounded bottom surface. The buffer layers BL may not be extended in the second direction D2 and may be locally provided between the active regions that are adjacent to each other in the first direction D1. The buffer layers BL may be formed between a pair of the gate electrodes GE.

Referring to FIGS. 26, 27A, 17B and 27C, an oxide layer OL may be formed on the first interlayer insulating layer 110 provided with the buffer layer BL, and then, a new hard mask pattern HMP may be formed. Here, the oxide layer OL and the hard mask pattern HMP may be sequentially formed on the first interlayer insulating layer 110. As an example, the oxide layer OL may be formed of (or include) silicon oxide. A plurality of openings OP may be formed in the hard mask pattern HMP through a photolithography process.

The openings OP of the hard mask pattern HMP may include a first opening OP1, a second opening OP2, and a third opening OP3. The first to third openings OP1, OP2, and OP3 may define the first to third active contacts AC1, AC2, and AC3, respectively, as previously described with reference to FIG. 18.

A second etching process may be performed on the substrate 100. The second etching process may be an anisotropic etching process. The second etching process may be performed to etch the oxide layer OL and the first interlayer insulating layer 110 exposed through the openings OP. The second etching process may be performed until the first and second source/drain patterns SD1 and SD2 are exposed through the openings OP. An upper portion of each of the first and second source/drain patterns SD1 and SD2 may be removed during the second etching process.

Figure 27A:
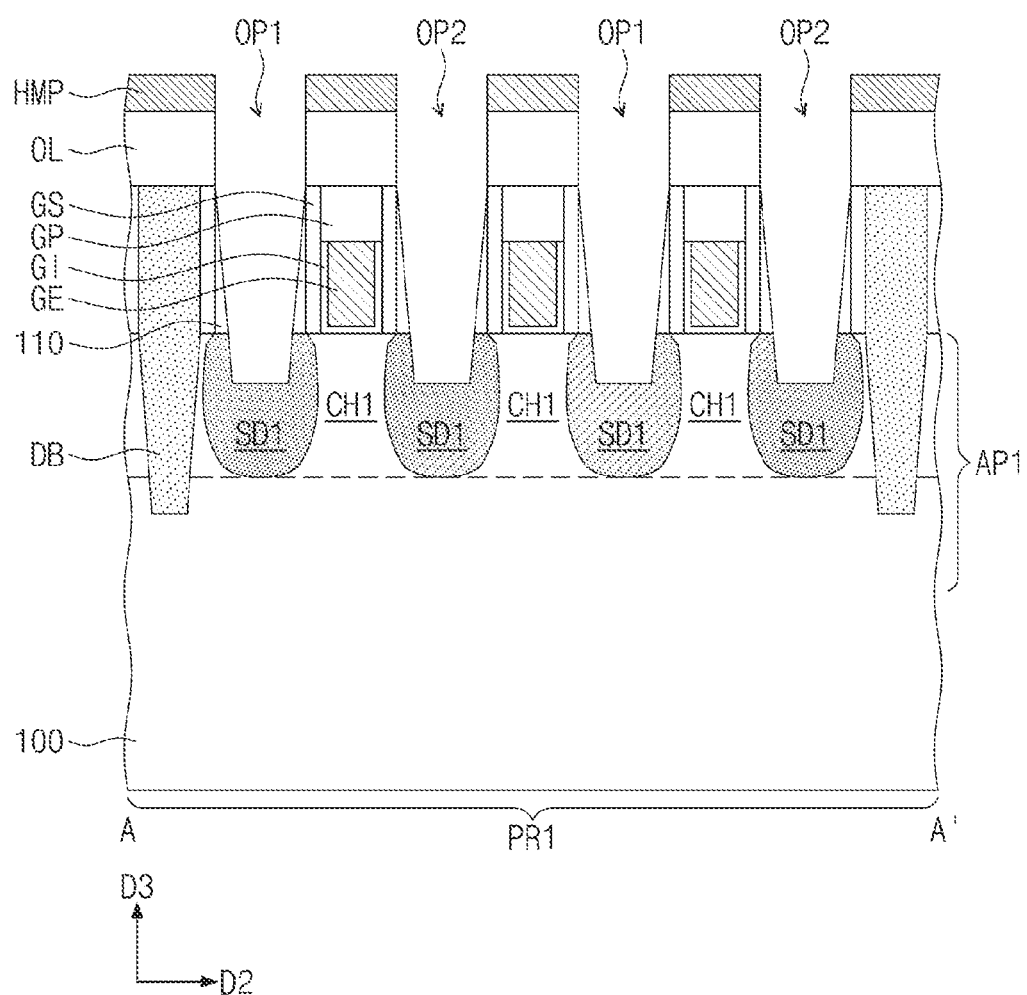
Figure 27B:
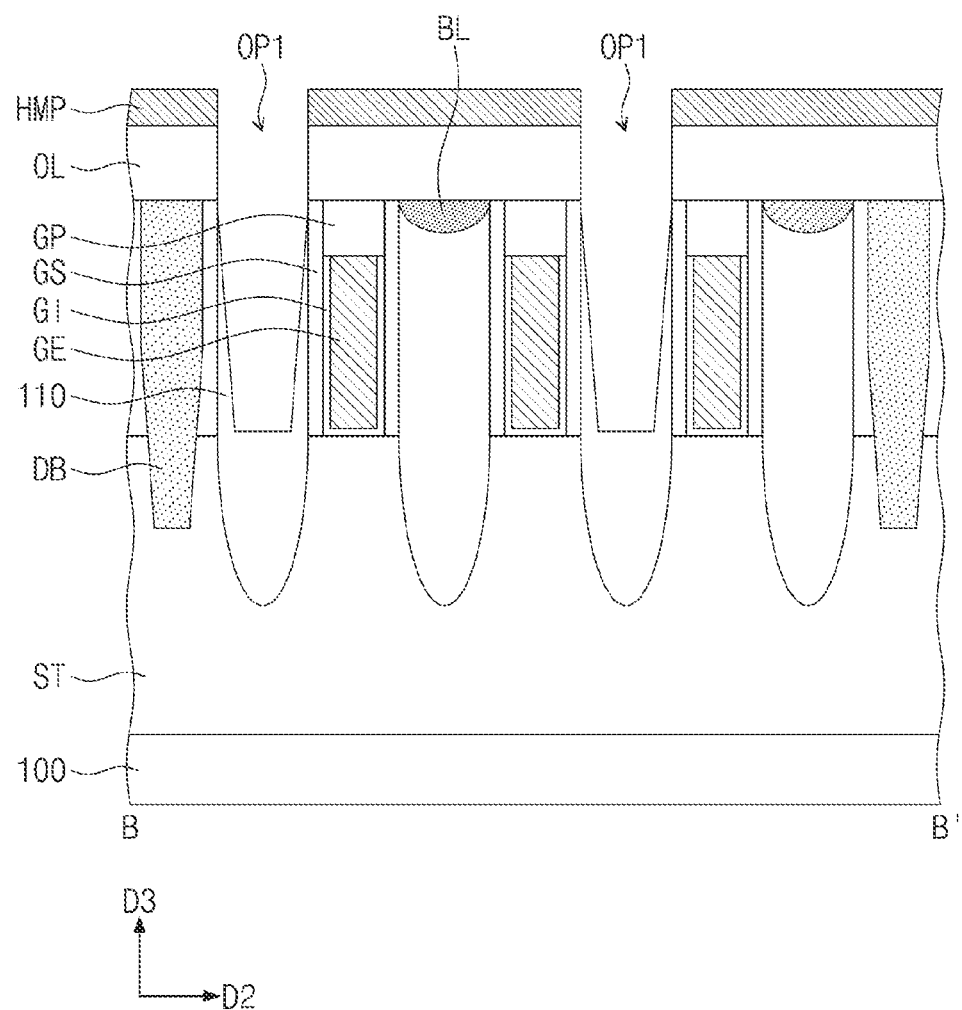
Figure 27C:
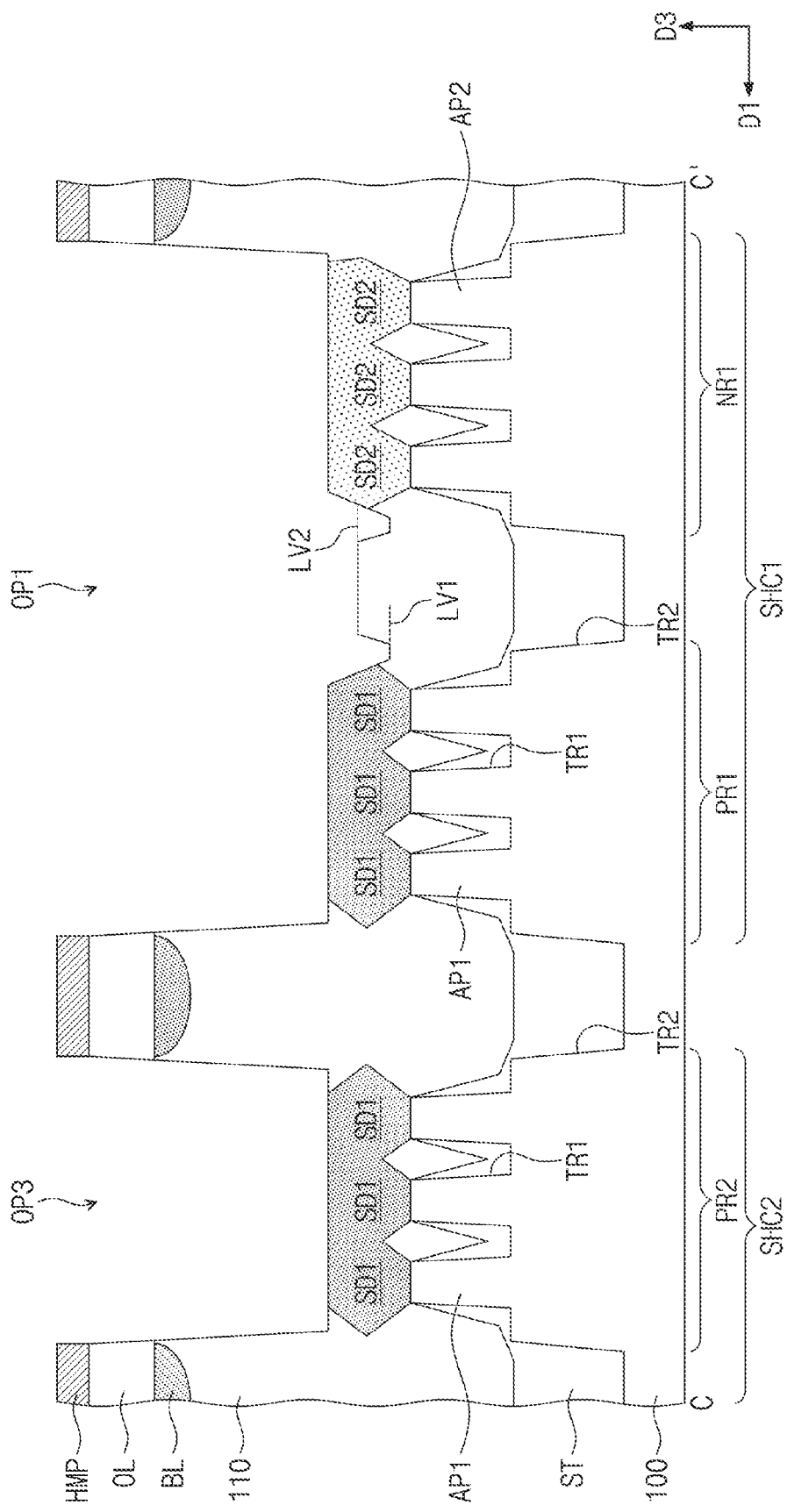

Referring to FIG. 27C, the first opening OP1 exposing the first and second source/drain patterns SD1 and SD2 may be formed by the second etching process. The first opening OP1 may expose the first interlayer insulating layer 110 between the first and second source/drain patterns SD1 and SD2.

In some embodiments, the second etching process may be performed in an over-etching manner to remove the upper portion of each of the first and second source/drain patterns SD1 and SD2, and in this case, the first interlayer insulating layer 110 between the first and second source/drain patterns SD1 and SD2 may be recessed to a deeper level, compared with the first and second source/drain patterns SD1 and SD2. For example, the lowermost level of the first opening OP1 may be a first level LV1, which is lower than the top surface of each of the first and second source/drain patterns SD1 and SD2.

Thus, the highest level of the first interlayer insulating layer 110 on the device isolation layer ST filling the second trench TR2 may be a second level LV2. The second level LV2 may be higher than the first level LV1. The second level LV2 may be lower than the top surface of each of the first and second source/drain patterns SD1 and SD2.

Figure 25A:
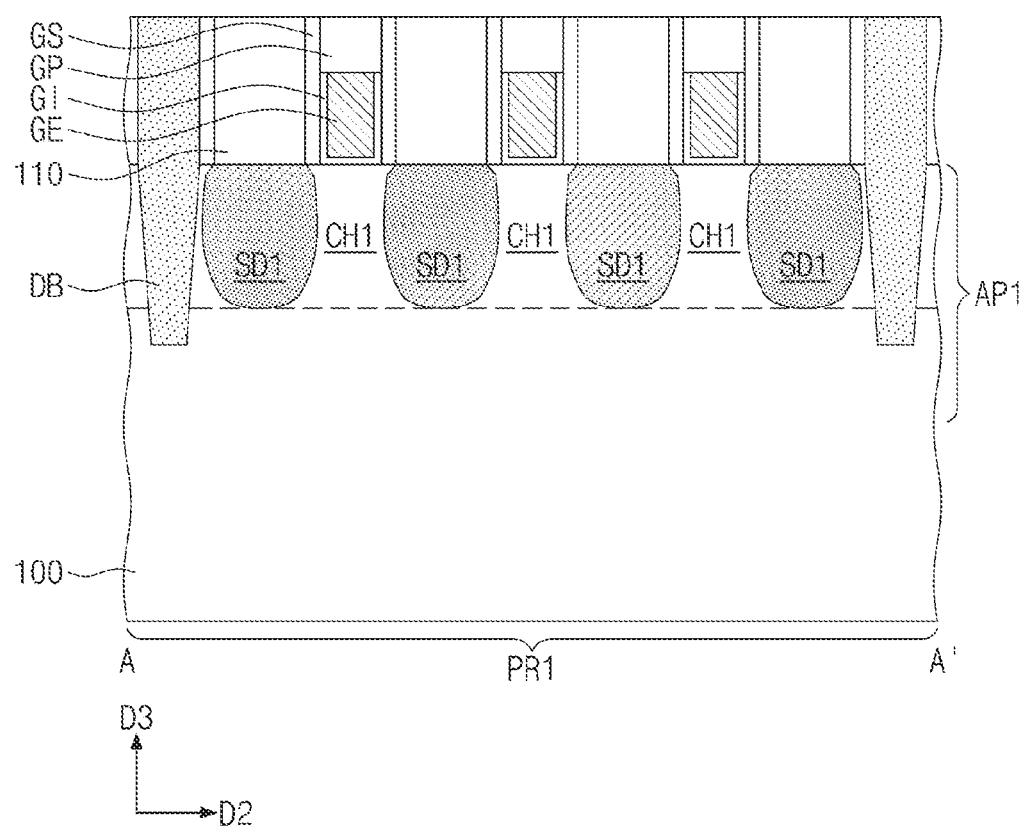
Figure 25B:
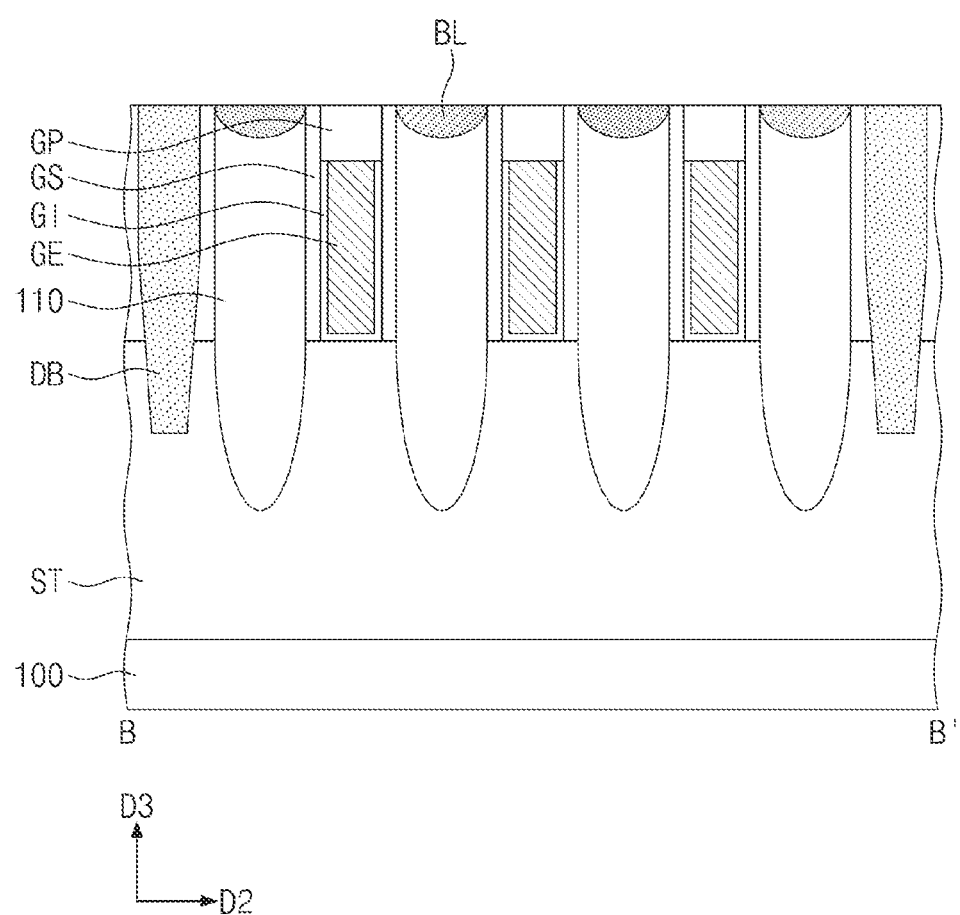
Figure 25C:
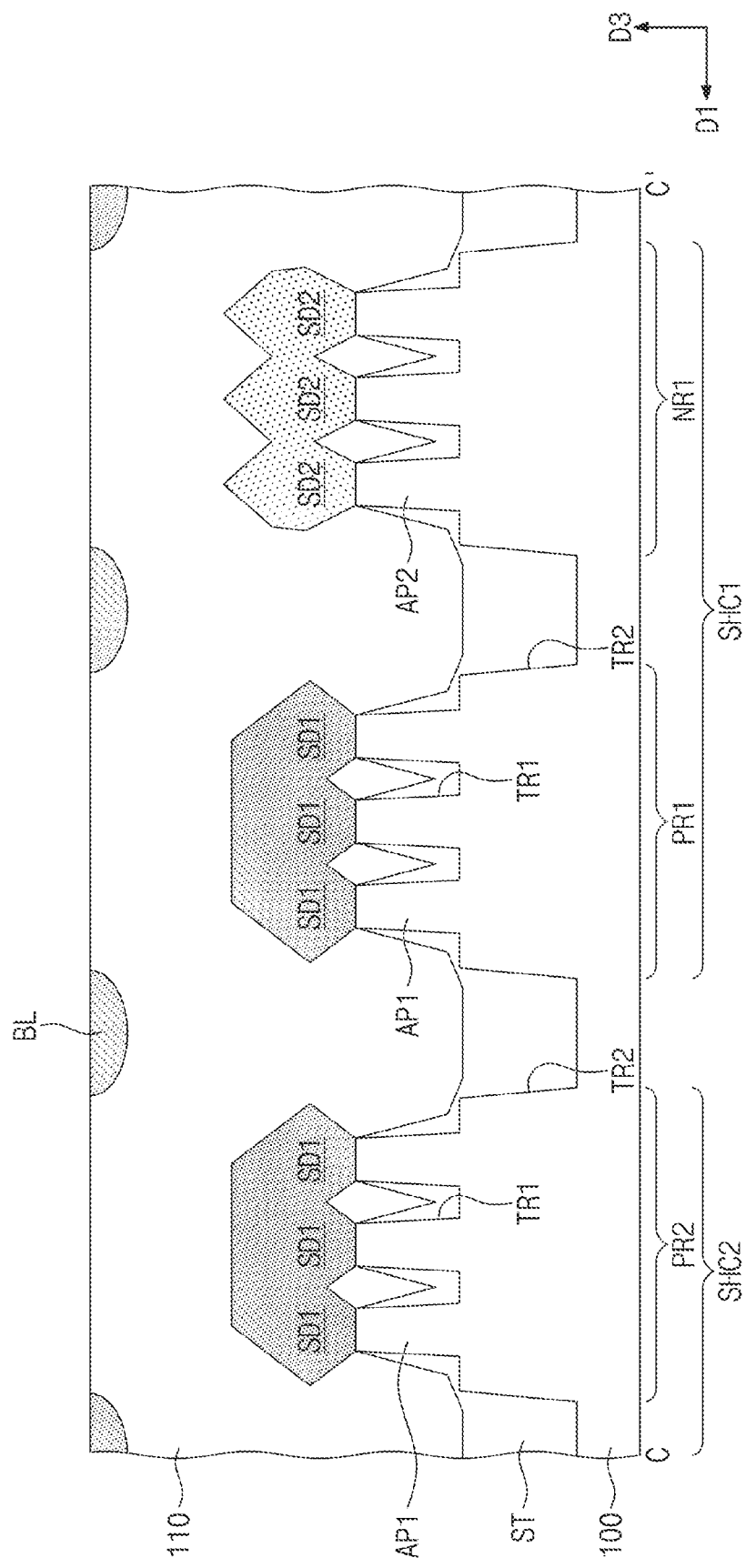
Figure 26:
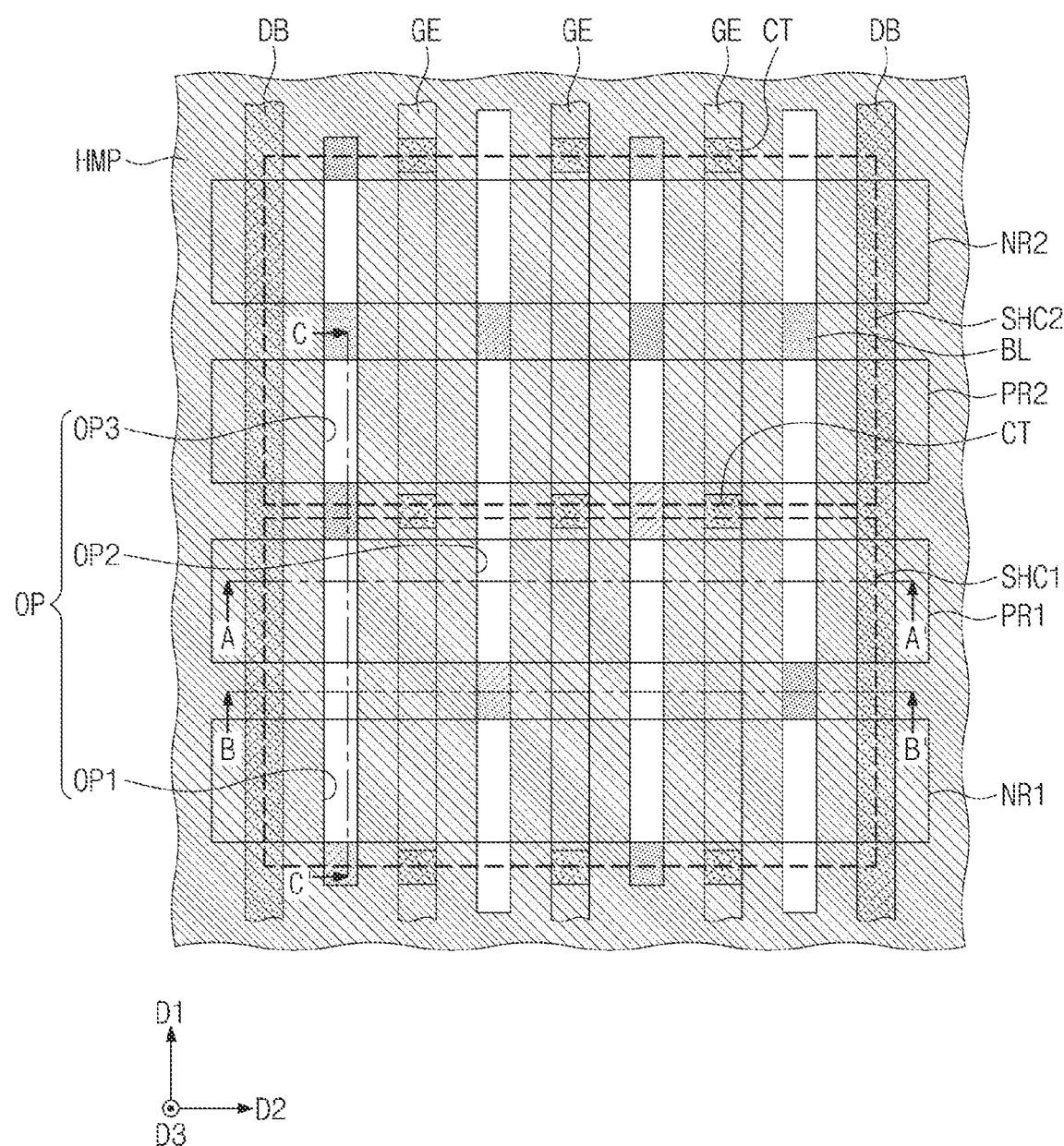

Since, as previously described with reference to FIG. 25C, the buffer layer BL is formed on the device isolation layer ST filling the second trench TR2, the top surface of the first interlayer insulating layer 110 between the first and second source/drain patterns SD1 and SD2 may be located at the second level LV2 higher than the first level LV1.

Here, during the second etching process, an etch rate of the first interlayer insulating layer 110 may be higher than an etch rate of the buffer layer BL. This difference in the etch rate may allow the top surface of the first interlayer insulating layer 110 between the first and second source/drain patterns SD1 and SD2 to be located at the second level LV2 higher than the first level LV1. As a result, the first active contact AC1 may have a structure that prevents or inhibits the parasitic capacitance previously described with reference to FIG. 6.

Referring to FIGS. 18 and 19A to 19F, the active contacts AC may be formed by filling the openings OP with a conductive material. After the formation of the active contacts AC, a planarization process may be performed to expose the buffer layers BL. The planarization process may be performed using, for example, a chemical mechanical polishing (CMP) process. The oxide layer OL may be completely removed during the planarization process.

The upper insulating pattern UIP may be formed by replacement of an upper portion of each of the active contacts AC with an insulating material. The gate contacts GC may be formed to penetrate the gate capping pattern GP and to be respectively connected to the gate electrodes GE.

Thereafter, the first metal layer M1 and the second metal layer M2 may be formed on the first interlayer insulating layer 110, as previously described with reference to FIGS. 4 and 5A to 5F.

Figure 28:
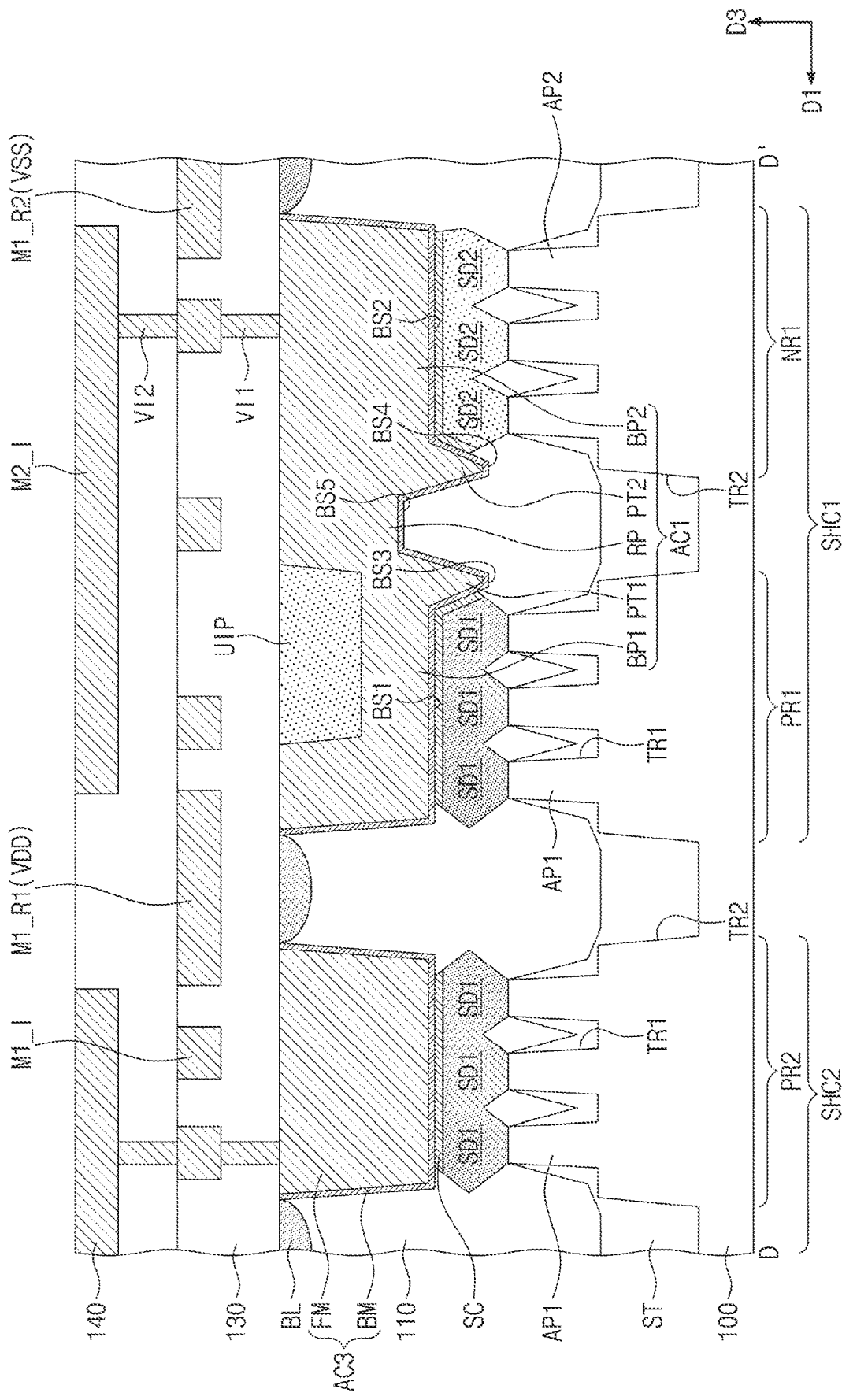
FIG. 28 is a cross-sectional view taken along a line D-D' of FIG. 18 and illustrates a semiconductor device according to embodiments of the inventive concept.
Figure 29A:
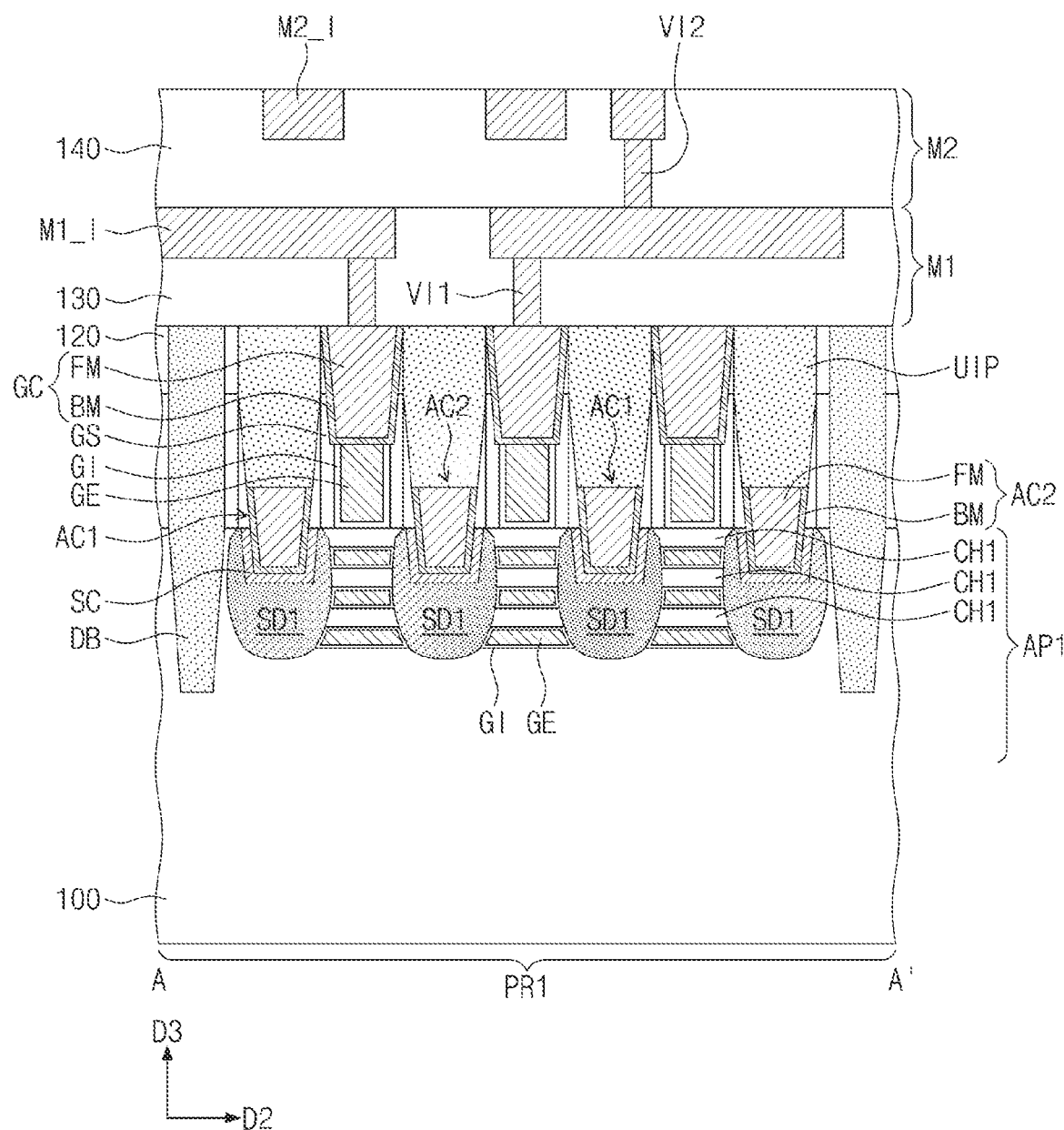
FIGS. 29A, 29B, 29C and 29D are respective cross-sectional views taken along lines A-A', B-B', D-D', and F-F' of FIG. 4 and illustrate a semiconductor device according to an embodiments of the inventive concept.
Figure 29B:
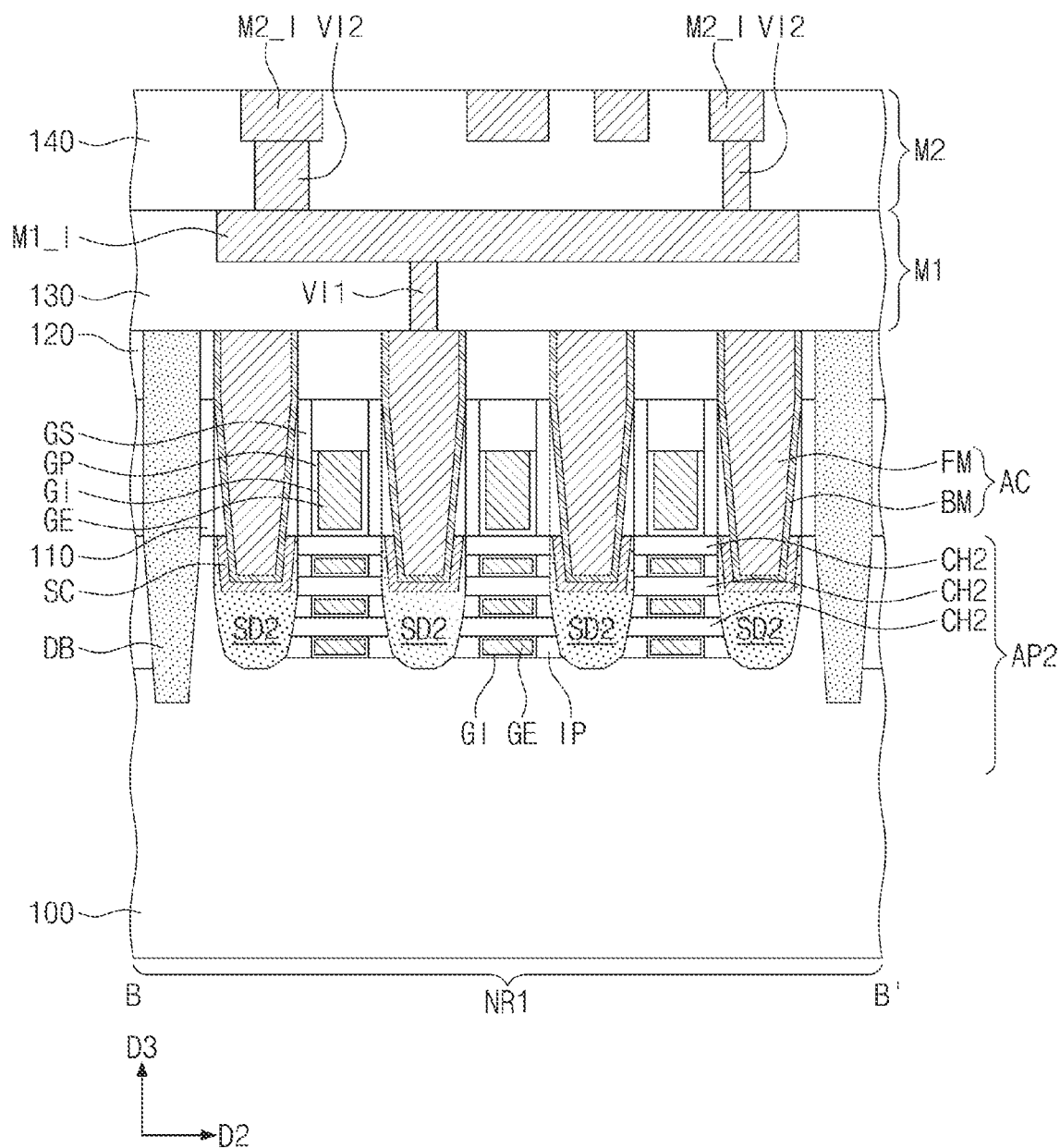
Figure 29C:
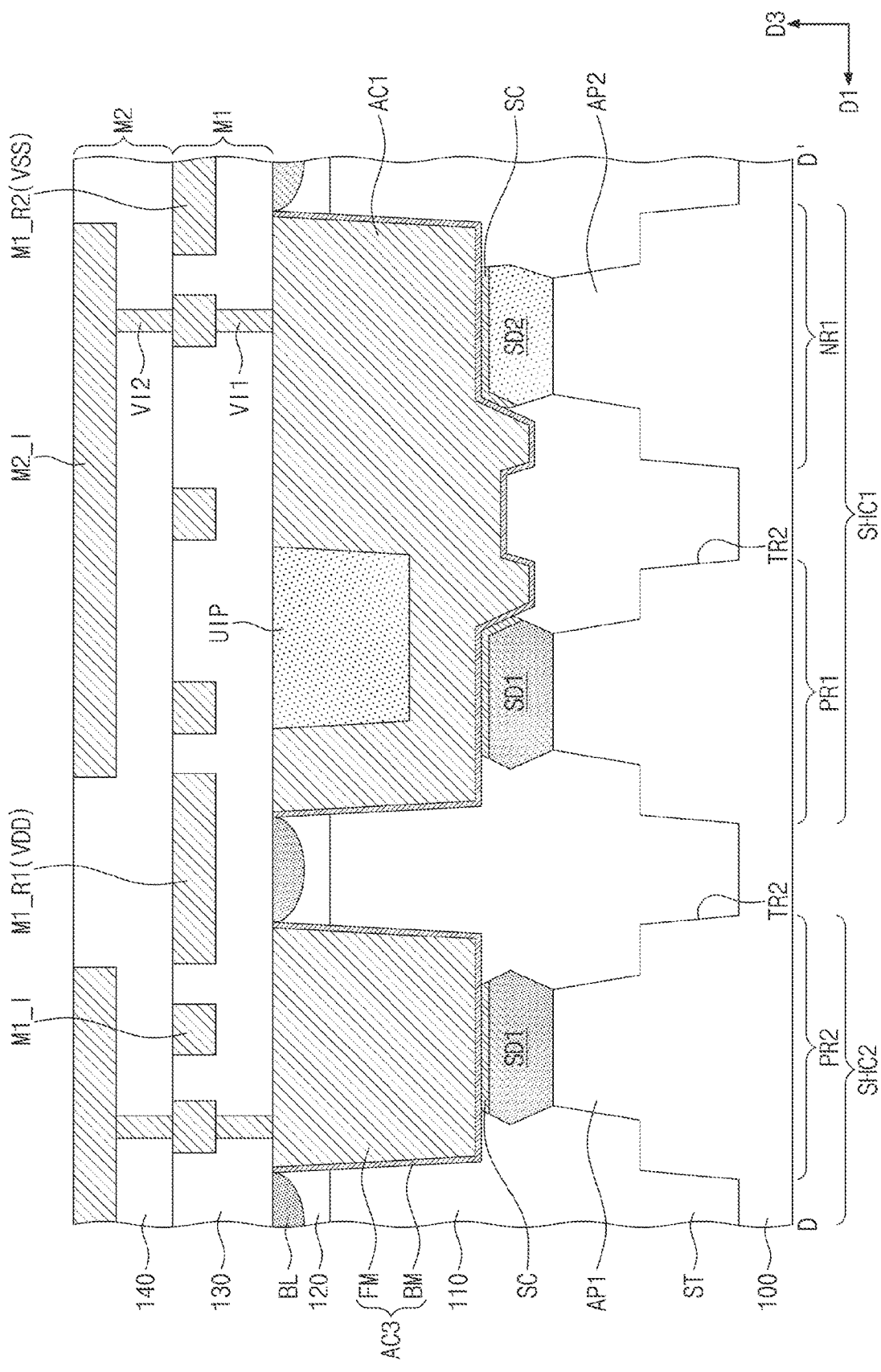
Figure 29D:
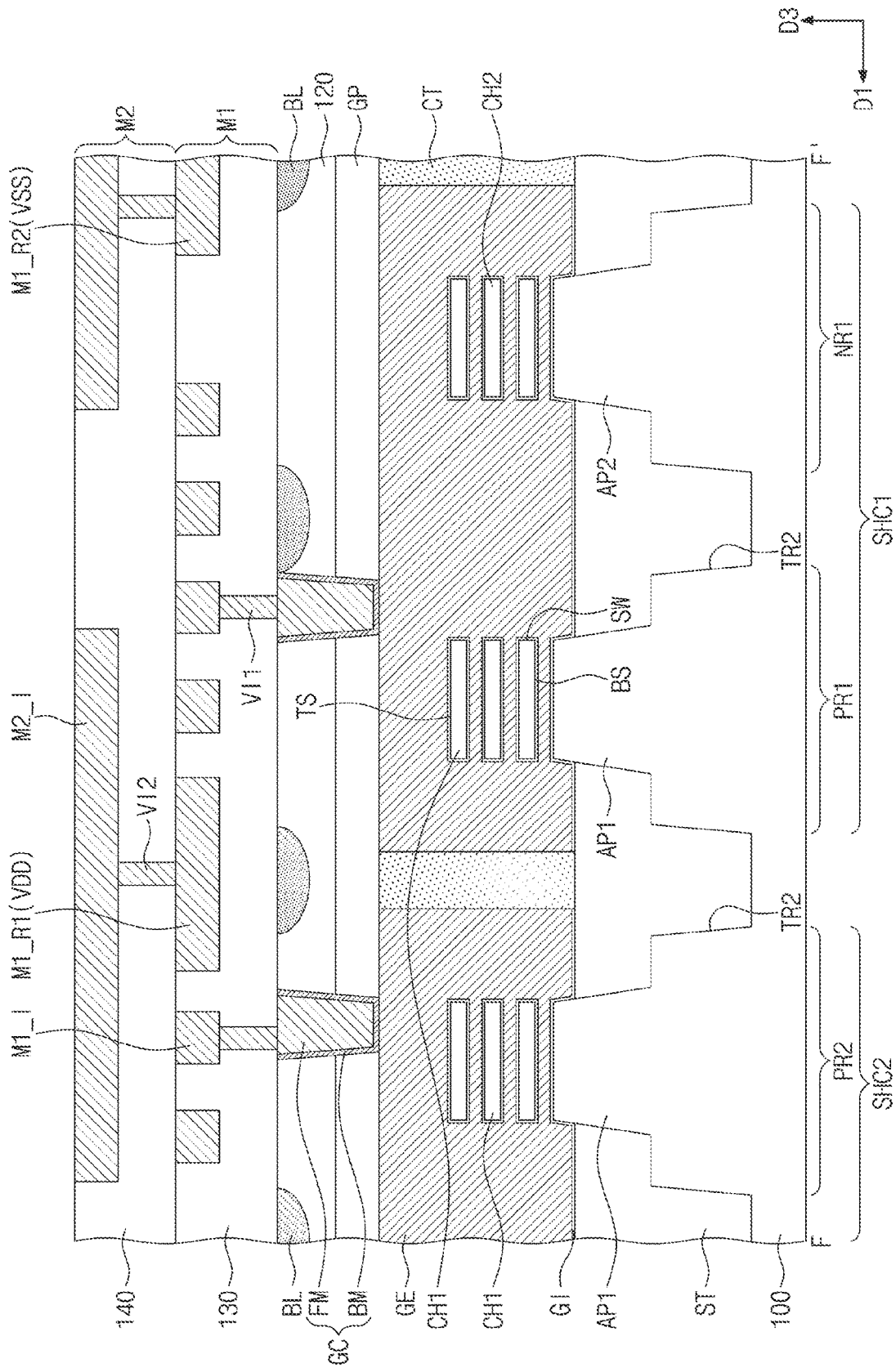

FIG. 28 is a cross-sectional view taken along a line D-D' of FIG. 18 and illustrates a semiconductor device according to embodiments of the inventive concept. Here, the bottom surface BS5 of the recessed portion RP of the first active contact AC1 may be higher than the bottom surface BS1 of the first body portion BP1 and may be higher than the bottom surface BS2 of the second body portion BP2. The height of the bottom surface BS5 of the recessed portion RP may be changed by adjusting a thickness and/or composition of the buffer layer BL.

FIGS. 29A, 29B, 29C and 29D are respective cross-sectional views taken along lines A-A', B-B', D-D', and F-F' of FIG. 4 and illustrate a semiconductor device according to embodiments of the inventive concept.

Referring to FIGS. 4, 29A, 29B, 29C and 29D, the substrate 100 including the first PMOSFET region PR1, the second PMOSFET region PR2, the first NMOSFET region NR1, and the second NMOSFET region NR2 may be provided. The device isolation layer ST may be provided on the substrate 100. The device isolation layer ST may define the first active pattern AP1 and the second active pattern AP2 in an upper portion of the substrate 100. The first active pattern AP1 may be defined on each of the first and second PMOSFET regions PR1 and PR2, and the second active pattern AP2 may be defined on each of the first and second NMOSFET regions NR1 and NR2.

The first active pattern AP1 may include the first channel patterns CH1, which are vertically stacked. The stacked first channel patterns CH1 may be spaced apart from each other in a third direction D3. The stacked first channel patterns CH1 may be overlapped with each other, when viewed in a plan view. The second active pattern AP2 may include the second channel patterns CH2, which are vertically stacked. The stacked second channel patterns CH2 may be spaced apart from each other in the third direction D3. The stacked second channel patterns CH2 may be overlapped with each other, when viewed in a plan view. The first and second channel patterns CH1 and CH2 may be formed of (or include) at least one of silicon (Si), germanium (Ge) and silicon-germanium (SiGe).

The first active pattern AP1 may further include the first source/drain patterns SD1. The stacked first channel patterns CH1 may be interposed between each adjacent pair of the first source/drain patterns SD1. The stacked first channel patterns CH1 may connect each adjacent pair of the first source/drain patterns SD1 to each other.

The second active pattern AP2 may further include the second source/drain patterns SD2. The stacked second channel patterns CH2 may be interposed between each adjacent pair of the second source/drain patterns SD2. The stacked second channel patterns CH2 may connect each adjacent pair of the second source/drain patterns SD2 to each other.

The gate electrodes GE may be provided to cross the first and second channel patterns CH1 and CH2 and to extend in the first direction D1. The gate electrode GE may be overlapped with the first and second channel patterns CH1 and CH2, when viewed in a plan view. A pair of the gate spacers GS may be disposed on opposite side surfaces of the gate electrode GE. The gate capping pattern GP may be provided on the gate electrode GE.

The gate electrode GE may be provided to surround each of the first and second channel patterns CH1 and CH2. (See, e.g., FIG. 29D). The gate electrode GE may be provided on a top surface TS, at least one side surface SW, and a bottom surface BS of each of the first and second channel patterns CH1 and CH2. In other words, the gate electrode GE may be provided to face the top surface TS, the bottom surface BS, and the opposite side surfaces SW of each of the first and second channel patterns CH1 and CH2. A transistor according to certain embodiments of the inventive concept may be a 3D FET (e.g., a multi-bridge channel field-effect transistor (MBCFET)), wherein the gate electrode GE is provided to three-dimensionally surround, at least in part, the channel patterns CH1 and CH2.

The gate dielectric pattern GI may be provided between each of the first and second channel patterns CH1 and CH2 and the gate electrode GE. The gate dielectric pattern GI may be provided to surround each of the first and second channel patterns CH1 and CH2.

On the NMOSFET region NR, an insulating pattern IP may be interposed between the gate dielectric pattern GI and the second source/drain pattern SD2. The gate electrode GE may be spaced apart from the second source/drain pattern SD2 by the gate dielectric pattern GI and the insulating pattern IP. Alternately, on the PMOSFET region PR, the insulating pattern IP may be omitted.

The first interlayer insulating layer 110 and the second interlayer insulating layer 120 may be provided on the substrate 100. The active contacts AC may be provided to penetrate the first and second interlayer insulating layers 110 and 120 and to be connected to the first and second source/drain patterns SD1 and SD2, respectively. The buffer layers BL may be provided in an upper region of the second interlayer insulating layer 120. Gate contacts GC may be provided to penetrate the second interlayer insulating layer 120 and the gate capping pattern GP and to be respectively connected to the gate electrodes GE. The buffer layers BL, the active contacts AC and gate contacts GC may be substantially the same as those in those previously described with reference to FIGS. 4 and 5A to 5F.

The third interlayer insulating layer 130 may be provided on the second interlayer insulating layer 120. The fourth interlayer insulating layer 140 may be provided on the third interlayer insulating layer 130. The first metal layer M1 may be provided in the third interlayer insulating layer 130. The second metal layer M2 may be provided in the fourth interlayer insulating layer 140.

In semiconductor devices according to embodiments of the inventive concept, it is possible to reduce both of an electric resistance and a parasitic capacitance between an active contact and a source/drain pattern, thereby increasing operating speed of an incorporating device. That is, semiconductor devices according to embodiments of the inventive concept provide improved electrical characteristics.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:
   a substrate including a first active region and a second active region adjacent to the first active region in a first direction, the first active region being one of PMOSFET and NMOSFET regions, the second active region being the other one of the PMOSFET and NMOSFET regions;
   a device isolation layer on the substrate and defining a first active pattern on the first active region and a second active pattern on the second active region;
   a gate electrode extended in the first direction to cross the first and second active patterns;
   a first source/drain pattern on the first active pattern and a second source/drain pattern on the second active pattern, wherein each of the first source/drain pattern and the second source/drain pattern is adjacent to a side of the gate electrode;
   an interlayer insulating layer on the gate electrode;
   a first active contact penetrating the interlayer insulating layer to connect the first source/drain pattern and a second active contact penetrating the interlayer insulating layer to connect the second source/drain pattern; and
   a buffer layer provided in an upper region of the interlayer insulating layer and interposed between the first active contact and the second active contact,
   wherein upper surfaces of the buffer layer, the first and second active contacts, and the interlayer insulating layer all lie in a same plane, and wherein the buffer layer includes a material having etch selectivity with respect to the interlayer insulating layer.

2. The semiconductor device of claim 1, wherein the buffer layer extends in a second direction which crosses the first direction, between the first active region and the second active region.

3. The semiconductor device of claim 1, wherein a width of the buffer layer in the first direction gradually decreases with decreasing distance from the substrate.

4. The semiconductor device of claim 1, further comprising:
a third active contact spaced apart from the first active contact and the second active contact in a second direction to connect the first source/drain pattern and the second source/drain pattern.

5. The semiconductor device of claim 4, wherein the third active contact comprises:
a first body portion on the first source/drain pattern, a second body portion on the second source/drain pattern, a first protruding portion, a second protruding portion, and a recessed portion between the first body portion and the second body portion,
wherein the first protruding portion, the second protruding portion, and the recessed portion are provided on the device isolation layer between the first active region and the second active region, and
the recessed portion includes a portion of the third active contact having a bottom recessed in a direction away from the device isolation layer.

6. The semiconductor device of claim 5, wherein the first protruding portion is provided between the first body portion and the recessed portion,
the second protruding portion is provided between the second body portion and the recessed portion,
a bottom surface of the recessed portion is higher than bottom surfaces of the first protruding portion and the second protruding portion, and
the bottom surface of the recessed portion is lower than a bottom surface of the first body portion.

7. The semiconductor device of claim 5, wherein a level of a bottom surface of the first protruding portion is different from a level of a bottom surface of the second protruding portion,
a largest width of the first protruding portion in the first direction is different from a largest width of the second protruding portion in the first direction, and
a level of a bottom surface of the first body portion is lower than a level of a bottom surface of the second body portion.

8. The semiconductor device of claim 5, wherein the first protruding portion extends from the first body portion towards the device isolation layer along an inclined side surface of the first source/drain pattern, and
the second protruding portion extends from the second body portion towards the device isolation layer along an inclined side surface of the second source/drain pattern.

9. The semiconductor device of claim 5, wherein the first body portion is electrically connected to a top surface of the first source/drain pattern, and
the first protruding portion is electrically connected to an inclined side surface of the first source/drain pattern.

10. The semiconductor device of claim 5, further comprising:
a gate contact on the first active region and connecting the gate electrode,
wherein the third active contact further comprises an upper insulating pattern formed in an upper portion of the first body portion and adjacent to the gate contact.

11. A semiconductor device, comprising:
a first active region, a second active region and a third active region respectively arranged across a substrate in a first direction, the first active region and the second active region having different conductivity types, and the second active region and the third active regions having a same conductivity type;
a device isolation layer on the substrate and defining a first active pattern on the first active region, a second active pattern on the second active region, and a third active pattern on the third active region;
a gate electrode extending in the first direction to cross the first, second, and third active patterns;
a first source/drain pattern, a second source/drain pattern, and a third source/drain pattern respectively provided on the first active pattern, the second active pattern and the third active pattern, wherein each of the first source/drain pattern, the second source/drain pattern, and the third source/drain pattern is adjacent to a side of the gate electrode;
an interlayer insulating layer on the gate electrode;
a first active contact electrically connected to the first source/drain pattern and the second source/drain pattern;
a second active contact electrically connected to the third source/drain pattern; and
a buffer layer provided in an upper region of the interlayer insulating layer and interposed between the first active contact and the second active contact,
wherein upper surfaces of the buffer layer, the first and second active contacts, and the interlayer insulating layer all lie in a same plane, and
wherein the buffer layer comprises a material having an etch selectivity with respect to the interlayer insulating layer.

12. The semiconductor device of claim 11, wherein the buffer layer comprises a first buffer layer extending in a second direction within the interlayer insulating layer and aligned above a region extending between the first active region and the second active region, and a second buffer layer extending in the second direction within the interlayer insulating layer and aligned above a region extending between the second active region and the third active region.

13. The semiconductor device of claim 11, wherein a length of the second active contact in the first direction is less than about half of a length of the first active contact in the first direction.

14. The semiconductor device of claim 11, wherein the first active contact comprises:
a first body portion on the first active region;
a second body portion on the second active region; and
a first protruding portion, a second protruding portion, and a recessed portion between the first and second body portions,
wherein the first protruding portion, the second protruding portion, and the recessed portion are provided on the device isolation layer between the first active region and the second active region,
the first protruding portion is provided between the first body portion and the recessed portion,
the second protruding portion is provided between the second body portion and the recessed portion, and a bottom surface of the recessed portion is higher than a bottom surface of the first protruding portion and is lower than a bottom surface of the first body portion.

15. The semiconductor device of claim 14, wherein the first protruding portion is electrically connected to an inclined side surface of the first source/drain pattern, and the second protruding portion is electrically connected to an inclined side surface of the second source/drain pattern.

16. A semiconductor device, comprising:

a first logic cell on a substrate including a PMOSFET region and an NMOSFET region spaced apart in a first direction, a first border, a second border, a third border and a fourth border, the first border and the second border opposing each other in a second direction crossing the first direction, and the third border and the fourth border opposing each other in the first direction;

a device isolation layer defining a first active pattern on the PMOSFET region and a second active pattern on the NMOSFET region, the first active pattern and the second active pattern extending in the second direction, a first upper portion of the first active pattern protruding above the device isolation layer, and a second upper portion of the second active pattern protruding above the device isolation layer;

a gate electrode extending in the first direction to cross the first and second active patterns;

a first source/drain pattern provided in the first upper portion of the first active pattern and a second source/drain pattern provided in the second upper portion of the second active pattern, wherein each of the first source/drain pattern and the second source/drain pattern is adjacent to a side of the gate electrode;

a division structure provided on at least one of the first border and the second border;

a gate spacer provided on the side of the gate electrode;

a gate capping pattern provided on a top surface of the gate electrode;

an interlayer insulating layer provided on the gate capping pattern;

a first active contact penetrating the interlayer insulating layer to connect the first source/drain pattern, and a second active contact penetrating the interlayer insulating layer to connect the second source/drain pattern;

a buffer layer extending in the second direction between the PMOSFET region and the NMOSFET region, provided in an upper region of the interlayer insulating layer, and interposed between the first active contact and the second active contact;

silicide patterns respectively interposed between the first active contact and the first source/drain pattern, and between the second active contact and the second source/drain pattern;

a gate contact penetrating the interlayer insulating layer and the gate capping pattern and connect the gate electrode;

a first metal layer on the interlayer insulating layer, the first metal layer including a first power line extending in the second direction and provided on the third border, a second power line extending in the second direction and provided on the fourth border, and first interconnection lines provided between the first power line and the second power line, wherein the first interconnection lines are electrically and respectively connected to the first active contact, the second active contact and the gate contact; and a second metal layer on the first metal layer, the second metal layer including second interconnection lines extending in the first direction and electrically connected to the first metal layer.

17. The semiconductor device of claim 16, wherein the buffer layer includes a material having an etch selectivity with respect to the interlayer insulating layer, and a width of the buffer layer in the first direction gradually decreases with decreasing distance from the substrate.

18. The semiconductor device of claim 16, further comprising:

a third active contact spaced apart from the first active contact and the second active contact in the second direction, and penetrating the interlayer insulating layer to connect the first source/drain pattern and the second source/drain pattern.

19. The semiconductor device of claim 18, wherein the third active contact comprises:

a first body portion on the PMOSFET region;

a second body portion on the NMOSFET region; and a first protruding portion, a second protruding portion, and a recessed portion between the first and second body portions, wherein the first protruding portion, the second protruding portion, and the recessed portion are provided on the device isolation layer between the PMOSFET and NMOSFET regions, and the recessed portion includes a region defined by a bottom of the third active contact recessed in a direction away from the device isolation layer.

20. The semiconductor device of claim 19, wherein a bottom surface of the recessed portion is higher than a bottom surface of the first protruding portion and a bottom surface of the second protruding portion, and the bottom surface of the recessed portion is different from the bottom surface of the first body portion.

* * * * *